(12) United States Patent
Katsukura et al.

(10) Patent No.: US 8,930,146 B2
(45) Date of Patent: Jan. 6, 2015

(54) APPARATUS STATE DETECTOR, METHOD FOR DETECTING APPARATUS STATE, APPARATUS STATE DETECTION SERVER AND APPARATUS STATE DETECTION SYSTEM; LIVING PERSONS' ANOMALY DETECTOR, LIVING PERSONS' ANOMALY DETECTION SYSTEM AND METHOD FOR DETECTING LIVING PERSONS' ANOMALY, AND APPARATUS-STATE DATABASE MAINTENANCE SERVER

(75) Inventors: Makoto Katsukura, Tokyo (JP); Masanori Nakata, Tokyo (JP); Noriyuki Kushiro, Tokyo (JP); Takeru Kuroiwa, Tokyo (JP); Toshiyasu Higuma, Tokyo (JP); Naoyuki Hibara, Tokyo (JP); Yoshiaki Ito, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 989 days.

(21) Appl. No.: 12/919,296

(22) PCT Filed: Mar. 18, 2009

(86) PCT No.: PCT/JP2009/055240
§ 371 (c)(1),
(2), (4) Date: Aug. 25, 2010

(87) PCT Pub. No.: WO2009/125659
PCT Pub. Date: Oct. 15, 2009

(65) Prior Publication Data
US 2011/0010106 A1     Jan. 13, 2011

(30) Foreign Application Priority Data

Apr. 11, 2008  (JP) .................. 2008-103298
May 14, 2008  (JP) .................. 2008-126973
Oct. 29, 2008  (JP) .................. 2008-278049
Feb. 25, 2009  (JP) ............ PCT/JP2009/053316

(51) Int. Cl.
*G01N 33/48* (2006.01)
*G01R 31/28* (2006.01)
*G01D 4/00* (2006.01)
*G08B 21/04* (2006.01)

(52) U.S. Cl.
CPC ............ *G01R 31/2825* (2013.01); *G01D 4/002* (2013.01); *G08B 21/0423* (2013.01); *G08B 21/0484* (2013.01); *Y02B 90/241* (2013.01); *Y04S 20/32* (2013.01); *Y02B 70/3266* (2013.01); *Y04S 20/242* (2013.01)
USPC .......................................... 702/19; 340/573.1

(58) Field of Classification Search
USPC ..................... 702/19; 340/573.1, 870.11, 3.43
See application file for complete search history.

(56) References Cited

U.S. PATENT DOCUMENTS 4,990,893 A   2/1991  Kiluk
5,428,342 A * 6/1995  Enoki et al. .................... 340/511

(Continued)

FOREIGN PATENT DOCUMENTS

CN    1363076 A    8/2002
EP    0 510 677 A1  10/1992

(Continued)

OTHER PUBLICATIONS

Japanese Office Action (Decision of Rejection) dated Aug. 7, 2012, issued in corresponding Japanese Patent Application No. 2010-192894, and English language translation of Office Action. (4 pages).

(Continued)

*Primary Examiner* — John Breene
*Assistant Examiner* — Stephanie Bloss
(74) *Attorney, Agent, or Firm* — Buchanan Ingersoll & Rooney PC

(57) ABSTRACT

An apparatus state detector and its associates are provided to save time and effort for learning combinations of operation states of all apparatuses at home and commit fewer estimation errors even when an unknown apparatus starts operating. The apparatus state detector includes measuring means that measures a physical quantity of an environment in which an apparatus is placed, feature-quantity calculation means that calculates a feature quantity of the measured value measured by the measuring means, storage means that stores in advance the feature quantity of each apparatus and an apparatus state associated with the feature quantity in a reference-apparatus entry dictionary, and apparatus-state detection means that searches the reference-apparatus entry dictionary for a feature quantity by using a feature quantity calculated by the feature-quantity calculation means as a search key and detects an apparatus state based on the apparatus state associated with the retrieved feature quantity.

20 Claims, 37 Drawing Sheets

(56) References Cited

U.S. PATENT DOCUMENTS

| | | | |
|---|---|---|---|
| 6,617,972 B2* | 9/2003 | Takarada et al. | 340/635 |
| 7,031,778 B2* | 4/2006 | Hsiung et al. | 700/29 |
| 2001/0048375 A1* | 12/2001 | Maruyama et al. | 340/870.11 |
| 2002/0053971 A1 | 5/2002 | Kitano | |
| 2002/0158763 A1 | 10/2002 | Takarada et al. | |
| 2003/0025605 A1* | 2/2003 | Prins | 340/573.1 |
| 2006/0261962 A1* | 11/2006 | Berenguer et al. | 340/573.1 |
| 2006/0273896 A1 | 12/2006 | Kates | |
| 2007/0035362 A1* | 2/2007 | Uejima et al. | 333/133 |
| 2007/0239003 A1* | 10/2007 | Shertukde et al. | 600/437 |
| 2008/0084296 A1 | 4/2008 | Kutzik et al. | |

FOREIGN PATENT DOCUMENTS

| | | | |
|---|---|---|---|
| EP | 1 870 037 A1 | 12/2007 | |
| JP | 03129948 A | 6/1991 | |
| JP | 04-324372 A | 11/1992 | |
| JP | 08-146054 A | 6/1996 | |
| JP | 2000-090366 A | 3/2000 | |
| JP | 2000-292465 A | 10/2000 | |
| JP | 2000-331273 A | 11/2000 | |
| JP | 2001-052277 A | 2/2001 | |
| JP | 2001-236582 A | 8/2001 | |
| JP | 2002-015000 A | 1/2002 | |
| JP | 2002-024965 A | 1/2002 | |
| JP | 2002024966 A | 1/2002 | |
| JP | 2002-049418 A | 2/2002 | |
| JP | 2002-071740 A | 3/2002 | |
| JP | 2002-090413 A | 3/2002 | |
| JP | 2002-137611 A | 5/2002 | |
| JP | 2002-152971 A | 5/2002 | |
| JP | 2002-251686 A | 9/2002 | |
| JP | 2003-022488 A | 1/2003 | |
| JP | 2003-196773 A | 7/2003 | |
| JP | 2003-256951 A | 9/2003 | |
| JP | 2004-038765 A | 2/2004 | |
| JP | 2004-245709 A | 9/2004 | |
| JP | 2004-348551 A | 12/2004 | |
| JP | 2005-025625 A | 1/2005 | |
| JP | 2005080403 A | 3/2005 | |
| JP | 2005-174058 A | 6/2005 | |
| JP | 2005-284535 A | 10/2005 | |
| JP | 2005-284796 A | 10/2005 | |
| JP | 2006186587 A | 7/2006 | |
| JP | 2006-221213 A | 8/2006 | |
| JP | 2006-343057 A | 12/2006 | |
| JP | 2007-132884 A | 5/2007 | |
| JP | 2007-183890 A | 7/2007 | |
| JP | 2008039492 A | 2/2008 | |
| WO | WO 03/044755 A1 | 5/2003 | |
| WO | WO 2007/107984 A2 | 9/2007 | |

OTHER PUBLICATIONS

Extended European Search Report dated Apr. 5, 2012, issued by the European Patent Office in the corresponding European Application No. 09729412.8. (8 pages).

Extended European Search Report dated Apr. 17, 2012, issued by the European Patent Office in the corresponding European Application No. 10013514.4. (8 pages).

Extended European Search Report dated Apr. 11, 2012, issued by the European Patent Office in the corresponding European Application No. 10013515.1. (7 pages).

Office Action (Notification of the Second Office Action) dated Dec. 6, 2012, issued by the Chinese Patent Office in the corresponding Chinese Patent Application No. 200980111626.7 and an English translation thereof. (5 pages).

Office Action (Official Letter of Inquiry) dated Jan. 22, 2013, issued by the Japanese Patent Office in the corresponding Japanese Patent Application No. 2010-192894 and an English translation thereof. (7 pages).

Office Action from Japanese Patent Office dated May 28, 2013, issued in corresponding Japanese Patent Appln. No. 2010-192819, with English translation thereof (4 pages).

International Search Report (PCT/ISA/210) issued on May 25, 2009, for International Application No. PCT/JP2009/055240.

Office Action dated May 3, 2012 issued in corresponding Chinese Patent Application No. 200980111626.7, and an English Translation thereof. (17 pages).

Japanese Office Action, issued from corresponding Japanese Appln. No. 2010-192894, dated Mar. 21, 2012, with English-language translation.

Japanese Office Action, issued from corresponding Japanese Appln. No. 2010-507203, dated Mar. 27, 2012, with English-language translation.

Office Action (Notification of the Third Office Action) issued on Jul. 1, 2013, by the Chinese Patent Office in corresponding Chinese Patent Application No. 200980111626.7, and an English Translation of the Office Action. (6 pages).

European Office Action (Communication pursuant to Article 94(3) EPC) dated Jul. 23, 2013, issued by European Patent Office in corresponding European Application No. 09 729 412.8-1803. (7 pgs.).

Office Action (Notification of the Fourth Office Action) issued on Jan. 8, 2014, by the Chinese Patent Office in corresponding Chinese Patent Application No. 200980111626.7, and an English Translation of the Office Action. (19 pages).

Office Action (Notification of the First Office Action) issued on Feb. 8, 2014, by the Chinese Patent Office in corresponding Chinese Patent Application No. 201210312525.X, and an English Translation of the Office Action. (12 pages).

Office Action (Notification of the First Office Action) issued Feb. 28, 2014 by the Chinese Patent Office in corresponding Chinese Patent Application No. 201210312522.6, and an English Translation of the Office Action. (20 pages).

* cited by examiner

FIG. 3
(A) 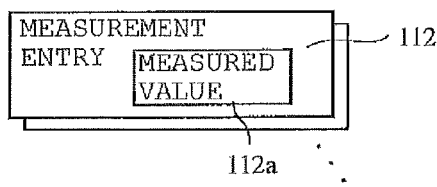
(B) 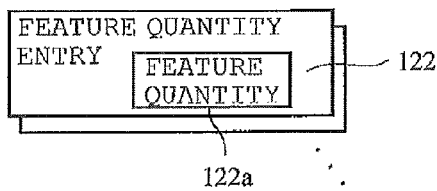
(C) REFERENCE-APPARATUS
ENTRY DICTIONARY
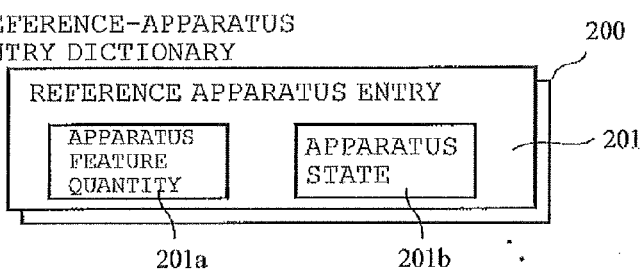
(D) 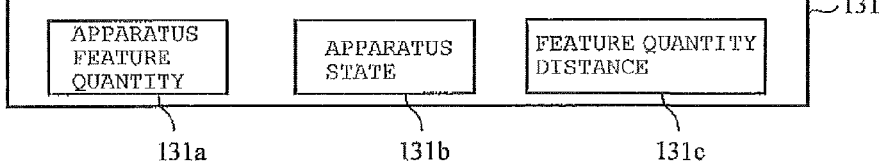
(E) 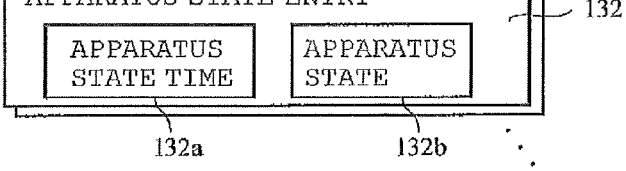

FIG. 4
(A) REFERENCE-ACTIVITY ENTRY DICTIONARY
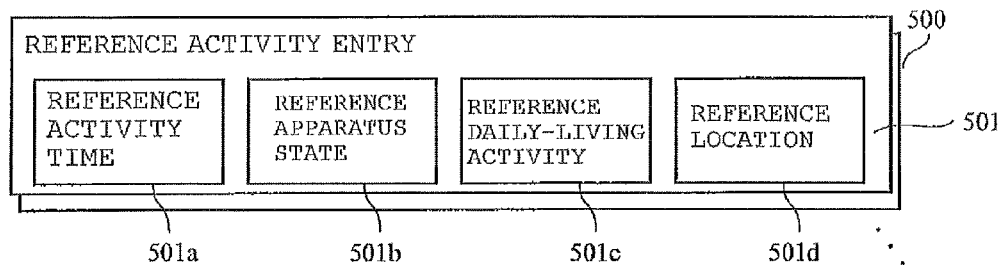
(B)
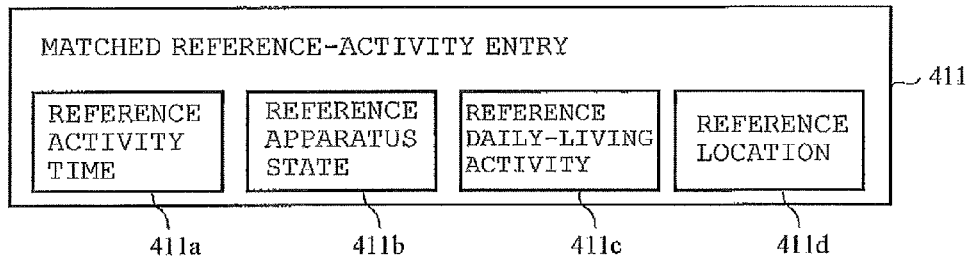

FIG. 6
(A)
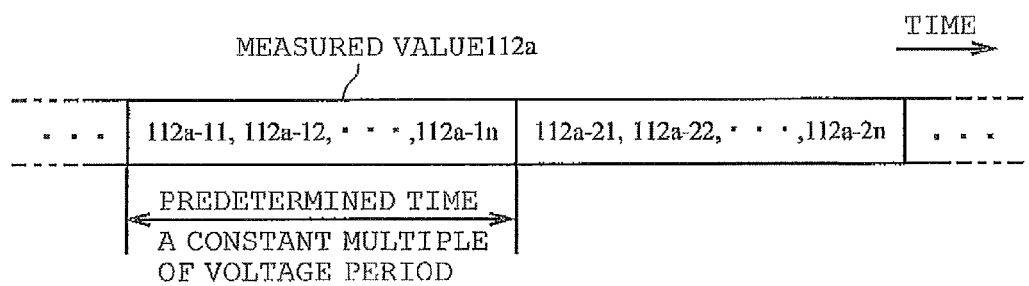
(B)
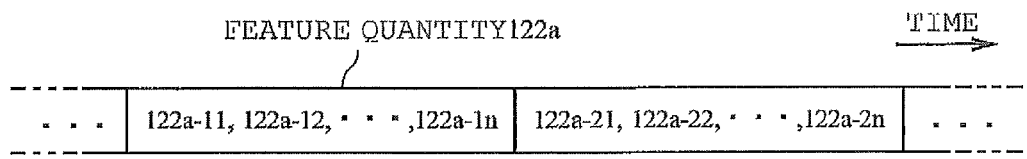

FIG. 7
(A)
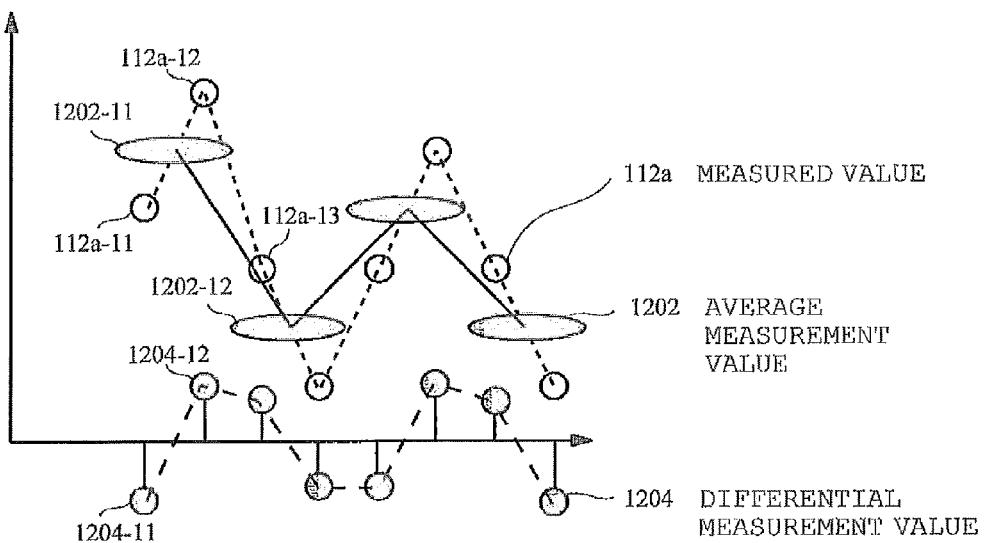
(B)
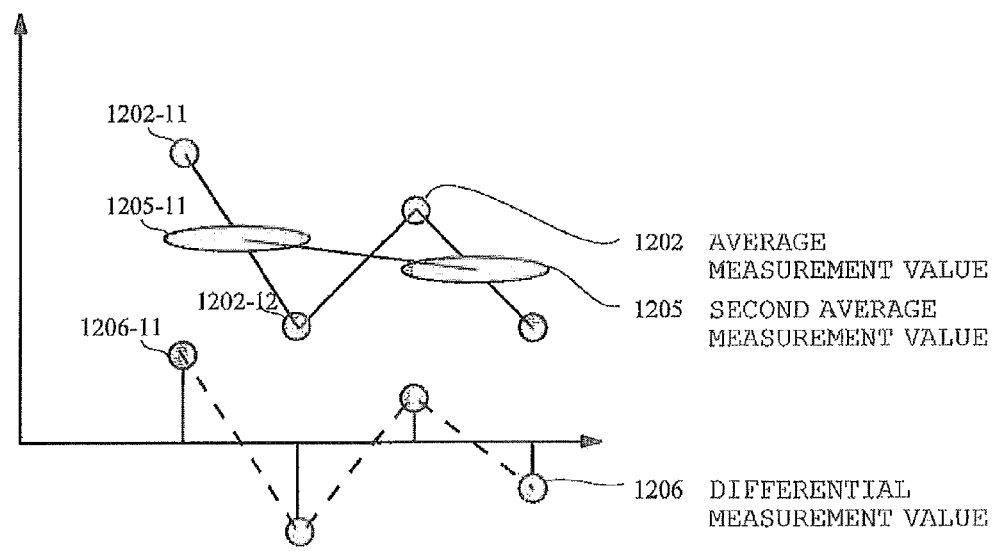

FIG. 9
(A)
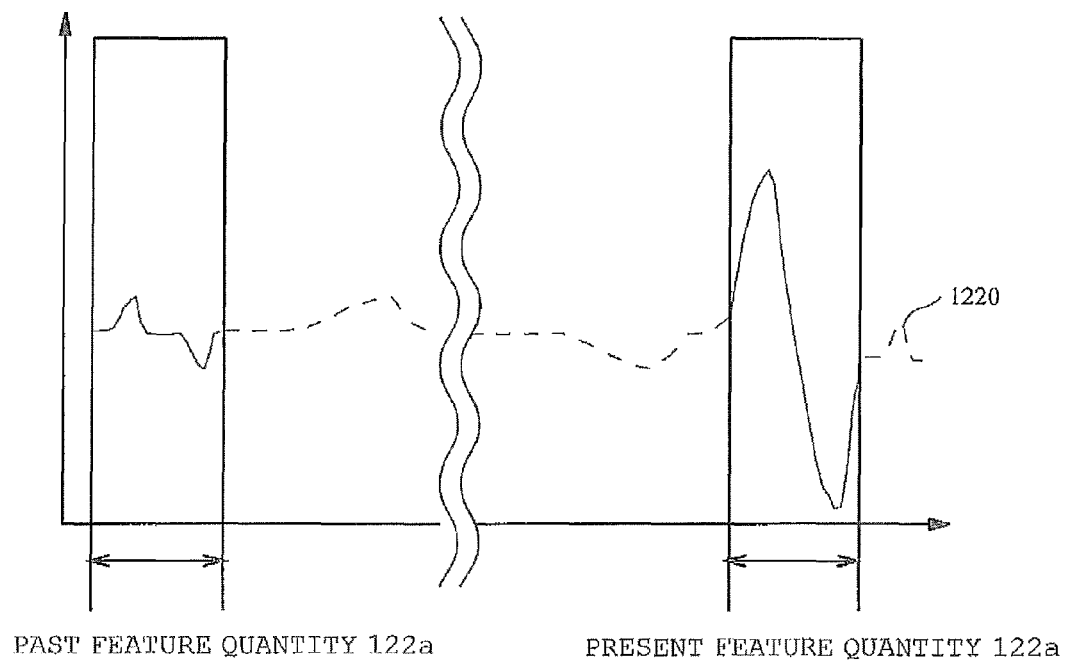
PAST FEATURE QUANTITY 122a      PRESENT FEATURE QUANTITY 122a
(B)
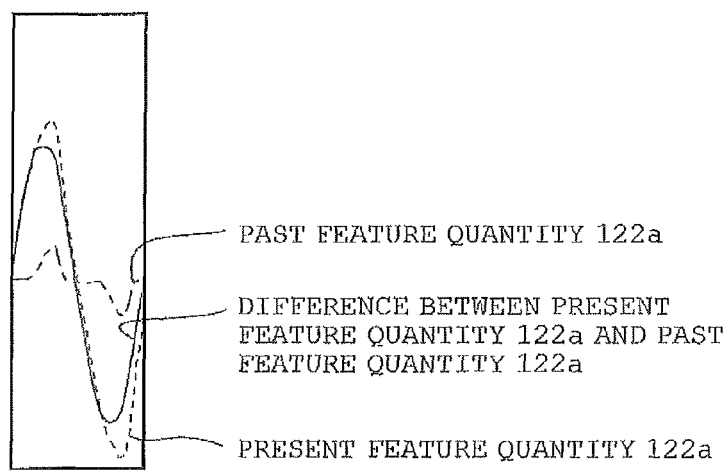
PAST FEATURE QUANTITY 122a
DIFFERENCE BETWEEN PRESENT
FEATURE QUANTITY 122a AND PAST
FEATURE QUANTITY 122a
PRESENT FEATURE QUANTITY 122a F I G. 4 1
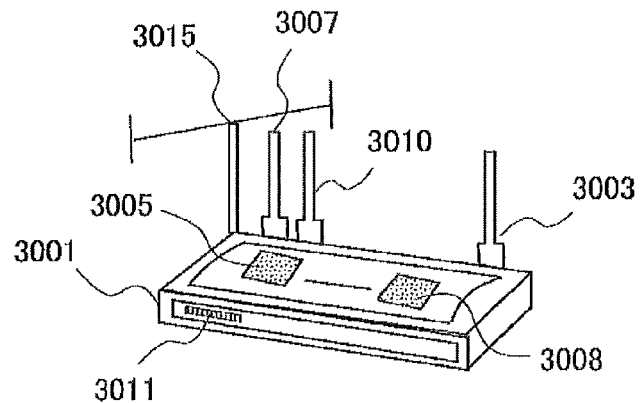
F I G. 4 2
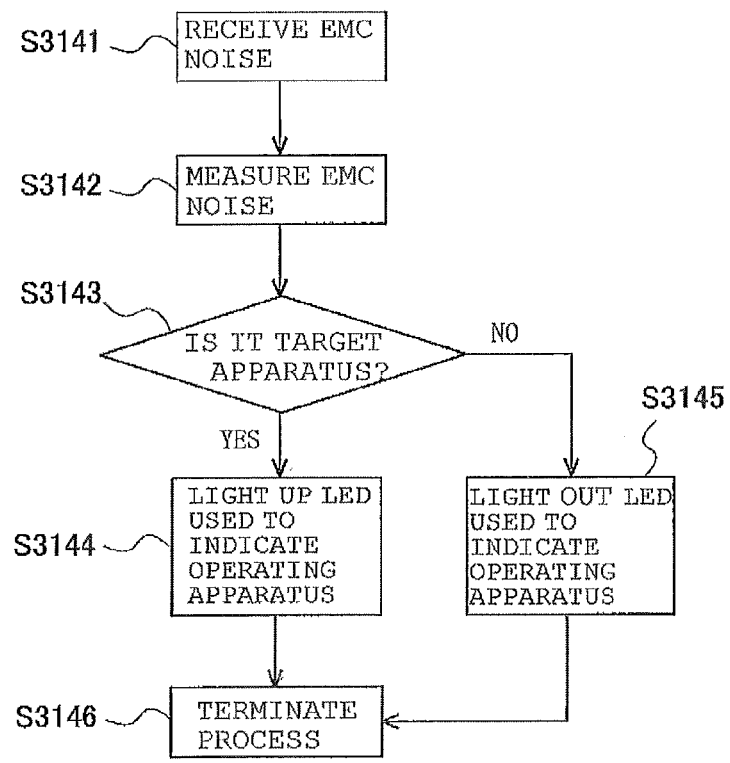

F I G. 5 0
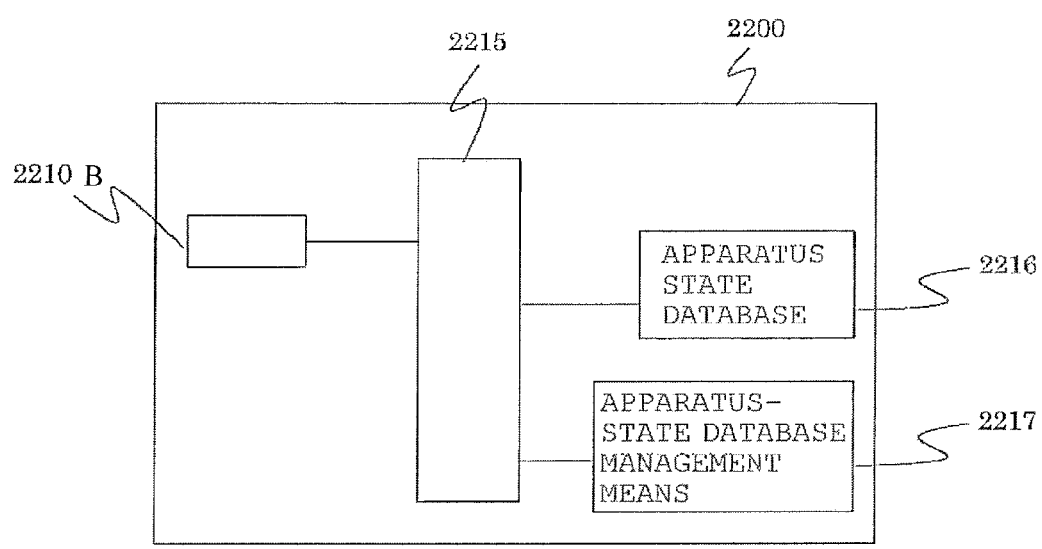

APPARATUS STATE DETECTOR, METHOD FOR DETECTING APPARATUS STATE, APPARATUS STATE DETECTION SERVER AND APPARATUS STATE DETECTION SYSTEM; LIVING PERSONS' ANOMALY DETECTOR, LIVING PERSONS' ANOMALY DETECTION SYSTEM AND METHOD FOR DETECTING LIVING PERSONS' ANOMALY, AND APPARATUS-STATE DATABASE MAINTENANCE SERVER

TECHNICAL FIELD

The present invention relates to an apparatus state detector, a method for detecting apparatus states, an apparatus state detection server and an apparatus state detection system, each of which is used to detect the operating state of an apparatus; a living persons' anomaly detector, a living persons' anomaly detection system and a method for detecting household anomalies, each of which is used to detect the anomalous activity of persons living in a residence; and an apparatus-state database maintenance server.

BACKGROUND ART

In recent years, with the widespread use of home network technology, some techniques for estimating the operating state of an electrical apparatus connected in a home have been proposed. For example, for the purpose of "enabling estimation of operating states of electrical apparatuses including an inverter through a nonintrusive method", a technique has been proposed, including "a measurement sensor installed in the vicinity of a feeder line port of a power consumer, data extraction means for retrieving data regarding current fundamentals and current harmonics and phases thereof with respect to a voltage from the measurement data measured by the measurement sensor, and pattern recognition means for estimating the operating state of an electrical apparatus used by the power consumer based on the data regarding the current fundamentals and current harmonics and the phases thereof with respect to the voltage from the data extraction means" (e.g., see Patent Document 1).

For the purpose of "achieving a load demand estimation device with a high degree of load demand estimation accuracy, particularly capable of estimating the type of an apparatus under load conditions by reliably determining the changes between ON and OFF of the apparatus", another proposed technique is "a load demand estimation device that, in a plurality of apparatuses each connected to the downstream side from a measure point of a feeder line through switching means, estimates the type of an apparatus whose switching means is closed to enter a state under load conditions by referring to an output from electric charge detection means placed at the measure point, and that includes load information storage means that stores information regarding loads of respective apparatuses in a predetermined period in advance, electric charge variation detection means that detects time variations of the outputs from the electric charge detection means for each predetermined period, switched-apparatus estimation means that compares, when the electric charge variation is detected, a detected amount variation created based on the electric charge variation and every item of load information stored in the load information storage means, extracts an item of load information closest to the detected amount variation, and defines the type of the apparatus corresponding to the extracted load information item as a switched device, and first loaded-device estimation means that changes the type of an apparatus estimated before the electric charge variation is found to the type of the apparatus estimated to be under load conditions based on the switched device information and outputs the type of the apparatus under load conditions estimated after the electric charge variation is found" (e.g., see Patent Document 2).

By the way, in recent years, the number of households in which an elderly person lives alone is increasing. Such elderly people living alone have a risk of discovery of emergency, such as cerebral infarction and myocardial infarction, being delayed. To solve the problem, it is expected to develop a sensor that detects anomalous behavior of a person and directly informs hospitals or emergency medical centers.

A method in which some type of sensor is attached to a person makes the person feel like they are being watched and puts the person under pressure, and resultantly the person may reject the use of the sensor due to this burden or the like. To eliminate the burden, providing a system not requiring the person to wear any sensors is more realistic. In the case of no sensor attached to a human body, the presence or absence of an anomaly is estimated based on non-biological information, for example, person's movements and daily living patterns.

Proposed methods for detecting an anomaly from the movements of a person in a room include a person's presence detection system capable of widely scanning a space in a residence with a simple structure not requiring a transmitter and detecting the presence of a person with high accuracy. This system detects an anomaly based on the absence of the person's movements irrespective of whether the person is in the residence (e.g., see Patent Document 3).

A daily-living monitoring system has been proposed as a method for detecting an anomaly from the daily living patterns, which supports a monitored person, such as an elderly person living alone, so that they can autonomously live a certain pattern. This system creates a reference pattern of daily life and determines that there is an anomaly when a situation is out of the reference pattern (e.g., see Patent Document 4).

Patent Document 1: Japanese Unexamined Patent Application Publication No. 2000-292465 (pp. 2)

Patent Document 2: Japanese Unexamined Patent Application Publication No. 2002-152971 (pp. 4)

Patent Document 3: Japanese Unexamined Patent Application Publication No. 2006-221213 (pp. 5 to 6, FIGS. 1 to 9)

Patent Document 4: Japanese Unexamined Patent Application Publication No. 2005-284535 (pp. 8 to 9, FIGS. 8 to 10)

DISCLOSURE OF INVENTION

Problems to be Solved by the Invention

However, the related art disclosed in Patent Document 1 requires learning all combinations of the operating states of apparatuses placed in a residence and, therefore, addition of an apparatus causes the learning workload to be enormous, which is highly difficult to realize.

In addition, the related art disclosed in Patent Document 2 has the possibility of making estimation errors when an unknown apparatus introduced to a residence starts operating.

Although the methods for detecting an anomaly of a person have been proposed as described above, these methods have a drawback in the context of determining an anomaly and have the possibility of making detection errors depending on circumstances. More specifically, if the anomaly detection is configured to refer to only a situation in which "a person does not move", a detection error may be made while the person is sleeping. Alternatively, if the anomaly detection is configured to refer to only a situation in which "a person is performing unusual activities", a detection error will be made during weekends that have different life patterns from weekdays.

The present invention has been made to solve the above-described problems and provides an apparatus state detector that can reduce time and effort for learning the combinations of operating states of all apparatuses placed in a residence and commits fewer estimation errors even when an unknown apparatus starts operating.

In addition, the present invention has been made to solve the above-described problems and provides a living persons' anomaly detector, a living persons' anomaly detection system and a method for detecting household anomalies, each of which detecting the presence or absence of a person's anomalous activity by referring apparatus information indicative of the operating states of apparatuses and activity information indicative of the activity states of a person.

Means for Solving the Problems

An apparatus state detector according to the present invention includes measuring means that measures a physical quantity of an environment in which an apparatus is placed, feature-quantity calculation means that calculates a feature quantity of the measured value measured by the measuring means, storage means that stores, in advance, the feature quantities of each apparatus and apparatus states associated with the feature quantities, respectively, as dictionary data, and apparatus-state detection means that searches for a feature quantity in the dictionary data by using a feature quantity calculated by the feature-quantity calculation means as a search key and detects an apparatus state based on the apparatus state associated with the retrieved feature quantity as a result of the search.

In addition, an apparatus state detector according to the present invention is a detector that detects states of an apparatus connected to a feeder line. The apparatus state detector includes current detection means that measures current flowing through the feeder line, current/voltage conversion means that converts the current measured by the current detection means into a voltage value, wave filter means that allows a specific frequency component of the current to pass therethrough, the current being converted by said current/voltage conversion means into the voltage value, wave amplifying means that amplifies the current including the specific frequency components that have passed through the wave filter means, AD conversion means that converts the current waveform amplified by the wave amplifying means from an analog value into a digital value, feature-quantity calculation means that calculates a feature quantity from the converted digital value of the current value, an apparatus state database that stores a plurality of reference apparatus entries, each of which contains an apparatus state of an apparatus and an apparatus feature quantity associated with the apparatus state, apparatus-state detection means that checks a feature quantity calculated by the feature-quantity calculation means against the apparatus feature quantities of the reference apparatus entries in the apparatus state database and identifies a reference apparatus entry containing an apparatus feature quantity matching the feature quantity calculated by the feature-quantity calculation means, and an output device that outputs the reference apparatus entry identified by the apparatus-state detection means as apparatus state information.

Furthermore, a living persons' anomaly detector according to the present invention includes wireless communication means that measures the intensity of a radio wave from a wireless communication device, activity determination means that determines the activity state of a person from a time variation of the radio wave intensity measured by the wireless communication means and defines the determination result as activity information, operating-apparatus detection means that detects the operating state of an apparatus placed around the person and defines the state as apparatus information, and anomaly detection means that detects the presence or absence of an anomalous activity of the person from the activity information and the apparatus information.

Advantages

The apparatus state detector of the present invention makes it possible to detect the apparatus state of an apparatus based on the physical quantity of an environment where the apparatus is placed.

In the present invention, "physical quantity of an environment" denotes at lease either one of a load physical quantity generated through the use of a single or a plurality of apparatuses and a physical quantity of the environment where the apparatus/apparatuses are placed. The former quantity includes, for example, a current used by the apparatus, gas flow rate, water flow rate, an amount of transfer of data over the network. Examples of the latter include, for example, illuminance and temperature.

According to the apparatus state detector of the present invention, the state of an apparatus is kept track of by storing, in advance, a plurality of reference apparatus entries, each of which contains an apparatus state of an apparatus and an apparatus feature quantity associated with the apparatus state, processing current flowing through the feeder line to calculate a feature quantity of the apparatus connected to the feeder line, checking the feature quantity against the reference apparatus entries in the apparatus state database, and identifying a reference apparatus entry having a feature quantity matching the calculated apparatus feature quantity. Therefore, even when various apparatuses are in operation at the same time or when an unknown apparatus is in operation, operating states of the apparatuses can be detected with high accuracy and without time and effort for learning combinations of all the apparatuses and estimation errors.

Furthermore, according to the living persons' anomaly detector of the present invention, the presence or absence of an anomalous activity of a person is determined from the activity information of the activity determination means and the apparatus information of the operating-apparatus detection means. This realizes accurate detection of the state where the person is in. In addition, the living persons' anomaly detector makes it possible to detect an event, for example, where the person goes out of the home with a lighting device and air-conditioner still on, thereby reducing unnecessary energy use. Furthermore, the living persons' anomaly detector is more reliable in anomaly detection and quicker at detection than the related art is, thereby ensuring the safety of the person. Especially, the context representing the event is easy to understand for people who receive an anomaly report. For example, information like "an cooker is working, but nobody is at home" allows a person who received the information to easily understand that an anomalous event is happening.

BRIEF DESCRIPTION OF DRAWINGS

FIG. 3 illustrates a data structure of the apparatus state detector 100 according to Embodiment 1 of the present invention.

FIG. 4 illustrates a data structure of a daily-living-activity estimation device 400 according to Embodiment 1 of the present invention.

FIG. 6 illustrates a data structure of a measured value 112a and a feature quantity 122a.

FIG. 7 illustrates a method for calculating a feature quantity by a feature-quantity calculation means 120 according to Embodiment 2 of the present invention.

FIG. 9 illustrates a method for calculating feature quantities by a feature-quantity calculation means 120 according to Embodiment 4 of the present invention.

FIG. 19 depicts current 2502 that flows through a feeder line 2140 and voltage 2501 in the feeder line 2140 when a television 2130 is turned ON.

FIG. 41 is a perspective view depicting the appearance of a living persons' anomaly detector according to Embodiment 15 of the present invention.

FIG. 42 is a flow chart showing operations of operating-apparatus detection means of the living persons' anomaly detector according to Embodiment 15.

FIG. 50 illustrates a structure of an apparatus state detection system according to Embodiment 21 of the present invention.

Figure 1:
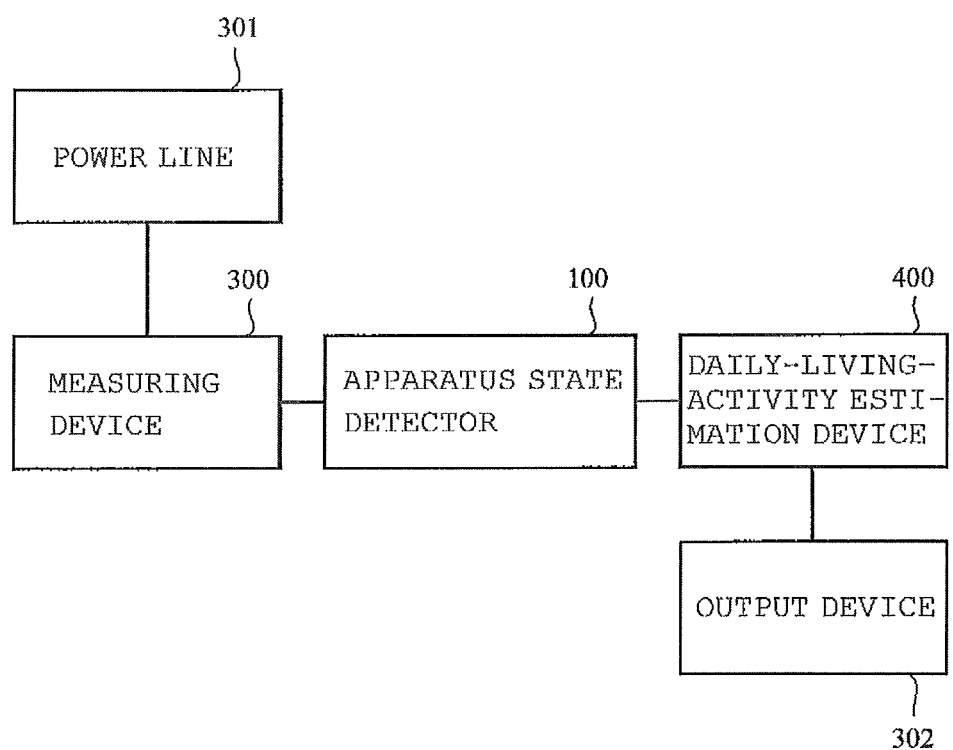
FIG. 1 is a block diagram showing a system configuration of an apparatus state detector 100 according to Embodiment 1 of the present invention.

REFERENCE NUMERALS 100 apparatus state detector, 300 measuring device, 301 power line, 302 output device, 400 daily-living-activity estimation device, 110 measuring means, 120 feature-quantity calculation means, 130 apparatus-state detecting means, 140 storage device, 150 output means, 112 measurement entry, 112a measured value, 122 feature quantity entry, 122a feature quantity, 131 matched reference-apparatus entry, 131a apparatus feature quantity, 131b apparatus state, 131c feature quantity distance, 132 apparatus state entry, 132a apparatus state time, 132b apparatus state, 200 reference-apparatus entry dictionary, 201 reference apparatus entry, 201a apparatus feature quantity, 201b apparatus state, 410 matching means, 420 output means, 430 storage device, 411 matched reference-activity entry, 411a reference activity time, 411b reference apparatus state, 411c reference daily-living activity, 411d reference location, 500 reference-activity entry dictionary, 501 reference activity entry, 501a reference activity time, 501b reference apparatus state, 501c reference daily-living activity, 501d reference location, 2000 apparatus state detector, 2100 apparatus state detection server, 2101 feeder line, 2102 voltage sensor, 2103 voltage sensor, 2104 feeder line, 2105 voltage sensor, 2106 current sensor, 2107, 2108 apparatus state detector, 2140 feeder line, 2200 apparatus state detection system, 2201 voltage sensor, 2201A, 2202A apparatus state detector, 2202 current sensor, 2203 current/voltage converting means, 2204 impedance boosting means, 2204A network, 2205 wave filter means, 2206 wave amplifying means, 2207 AD converting means, 2208 wave separating means, 2209 waveform smoothing means, 2210 feature-quantity calculation means, 2210B communication means, 2210a feature quantity, 2211 mail box, 2212 storage means, 2212A apparatus-state information management means, 2213 apparatus-state information database, 2214 display means, 2215 control means, 2216 apparatus state database, 2217 apparatus-state database management means, 2220 apparatus-state detection means, 2221 matched reference-apparatus entry, 2230 apparatus state database, 2231 reference apparatus entry, 2231a apparatus feature quantity, 2231b apparatus state, 2240 apparatus-state information creating means, 2250 output means, 2260 apparatus-state database update means, 2270 communication means, 2300 processor, 2310 integration means, 2320 control means, 3001 living persons' anomaly detector, 3002 wireless communication means, 3003 antenna, 3004 activity determination means, 3005 LED indicator, 3006 operating-apparatus detection means, 3007 antenna, 3008 LED indicator, 3009 anomaly detection means, 3010 antenna, 3011 warning buzzer, 3013 current transformer, 3014 connecting terminal, 3015 antenna for EMC, 3020 wireless access point, 3030 apparatus, 3060 outlet, 3070 router, 3080 Internet network, 3090 anomaly detection center.

BEST MODES FOR CARRYING OUT THE INVENTION

Embodiment 1

FIG. 1 is a block diagram showing a schematic system configuration of a domestic environment with an apparatus state detector 100 according to Embodiment 1 of the present invention. As shown in FIG. 1, the apparatus state detector 100 is connected to a measuring device 300 and a daily-living-activity estimation device 400.

The measuring device 300 measures current at a power supply port of a power line 301 and is, for example, a current sensor. The measuring device 300 is attached to the power supply port of the power line 301 or at an upstream area of an extension cord, such as a trailing socket and a power strip.

The apparatus state detector 100 detects the state of domestic apparatuses based on the measurement result of the measuring device 300 and outputs the detected apparatus state to the daily-living-activity estimation device 400.

The daily-living-activity estimation device 400 estimates daily living activities at home based on the apparatus state detected by the apparatus state detector 100. The daily-living-activity estimation device 400 is connected to an output device 302. The output device 302 that outputs the daily living activities detected by the daily-living-activity estimation device 400 is, for example, a display, a data output device or the like.

Figure 2:
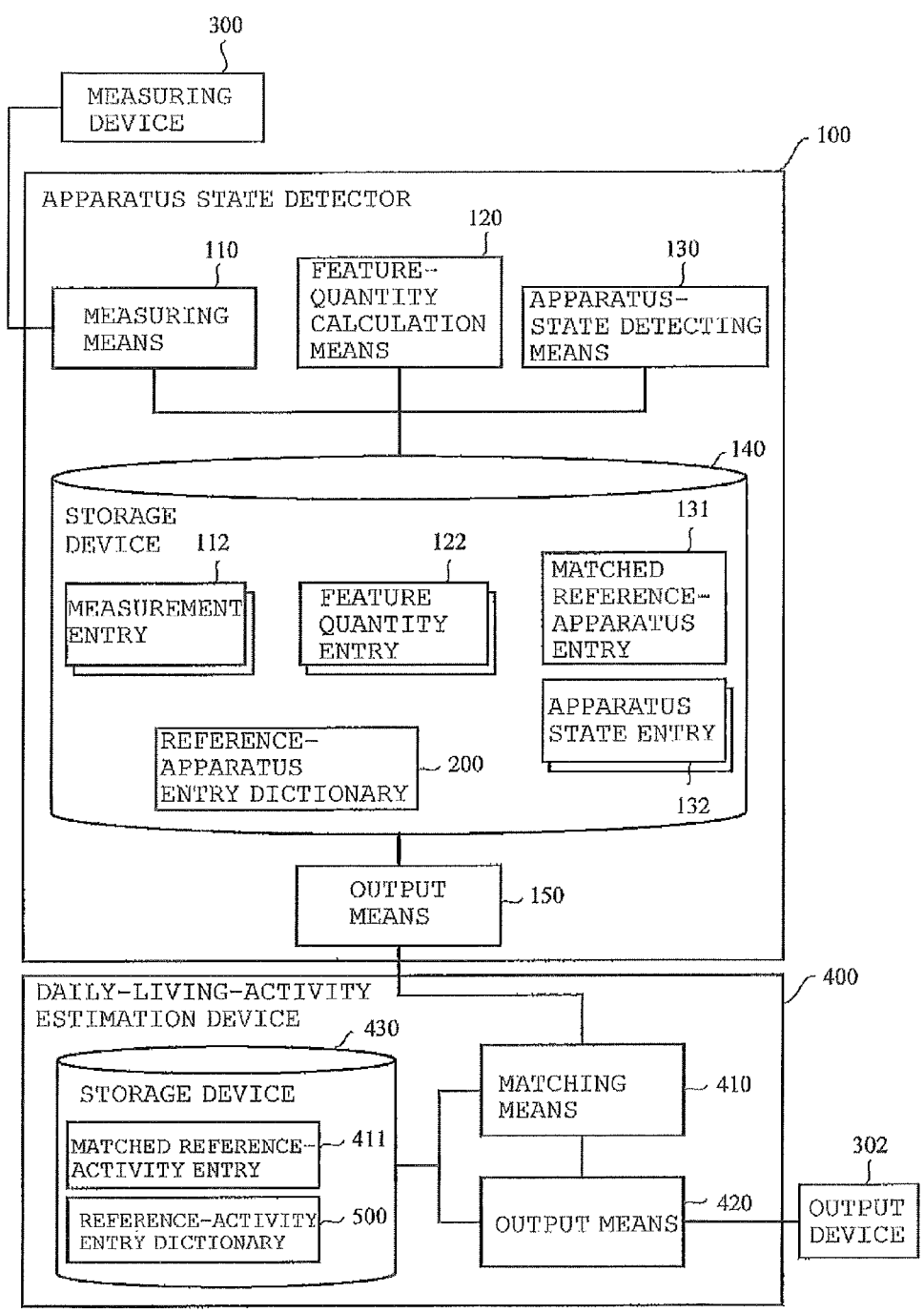
FIG. 2 is a functional block diagram of the apparatus state detector 100 according to Embodiment 1 of the present invention.

FIG. 2 is a functional block diagram of the apparatus state detector 100 and daily-living-activity estimation device 400. With reference to FIG. 2, general outlines of the entire operations will be described.

The apparatus state detector 100 includes measuring means 110, feature-quantity calculation means 120, apparatus-state detecting means 130 and a storage device 140. The measuring means 110, feature-quantity calculation means 120 and apparatus-state detecting means 130 are connected to the storage device 140, respectively. The storage device 140 stores measurement entries 112, feature quantity entries 122, matched reference apparatus entries 131, apparatus state entries 132 and a reference-apparatus entry dictionary 200. An output means 150 is connected to the storage device 140 to perform output operations to the daily-living-activity estimation device 400. The output means 150 is equivalent to "output means" and "warning state output means" of the present invention.

In FIG. 2, the measuring means 110 has an A/D conversion function and obtains instantaneous values of the current, which is measured by the measuring device 300, by sampling it at a constant interval. The obtained results are stored as a measurement entry 112 in the storage device 140. The feature-quantity calculation means 120 determines a feature quantity based on the measurement entry 112 through a predetermined method. The feature quantity is stored as a feature quantity entry 122 in the storage device 140. The apparatus-state detecting means 130 searches the reference-apparatus entry dictionary 200 for the feature quantity entry 122. As a result of the search, a matched entry is stored as a matched reference-apparatus entry 131. The matched reference-apparatus entry 131 is modified with the addition and deletion of data so as to obtain an appropriate form to be output to the daily-living-activity estimation device 400. The modified matched reference-apparatus entry 131 is stored as an apparatus state entry 132.

The daily-living-activity estimation device 400 includes matching means 410, output means 420 and a storage device 430. The matching means 410 and output means 420 are connected to the storage device 430, respectively. The storage device 430 stores a reference-activity entry dictionary 500 and a matched reference-activity entry 411.

In FIG. 2, the matching means 410 acquires the apparatus state entry 132 from the apparatus state detector 100 and searches the reference-activity entry dictionary 500 for the apparatus state entry 132. As a result of the search, a matched entry is stored as a matched reference-activity entry 411 in the storage device 430. The output means 420 outputs the matched reference-activity entry 411 to the output device 302 which then outputs the matched reference-activity entry 411.

The measuring means 110, feature-quantity calculation means 120, apparatus-state detecting means 130, matching means 410 and output means 420 can be implemented by hardware such as a circuit device or software running on a calculation apparatus such as a microcomputer and CPU, as long as the hardware and software can realize the functions thereof.

The storage device 140 and storage device 430 are a memory, HDD (Hard Disk Drive) or the like. Although one each of storage device 140 and storage device 430 is provided in Embodiment 1 as an example, a plurality of storage devices can also be provided. In addition, the storage device 140 and storage device 430 can be provided as external devices connected to the apparatus state detector 100 and daily-living-activity estimation device 400, respectively.

FIG. 3 illustrates data components stored in the storage device 140 of the apparatus state detector 100.

FIG. 3(A) shows a plurality of measurement entries 112 stored as historical data in a ring buffer form or another form. Each measurement entry 112 holds a measured value 112a measured by the measuring means 110 and supplementary information which is not shown. The supplementary information may be, for example, a reference number of the measured value 112a, an acquisition time of the value and so on.

FIG. 3(B) shows a plurality of feature quantity entries 122 also stored as historical data in a ring buffer form or another form. Each feature quantity entry 122 holds a feature quantity 122a calculated by the feature-quantity calculation means 120 and supplementary information which is not shown. The supplementary information may be, for example, a calculation method of the feature-quantity calculation means 120, parameters used in the calculation and so on. The measurement entries 112 and feature quantity entries 122 correspond one-to-one.

FIG. 3(C) shows the reference-apparatus entry dictionary 200 which is an aggregate of reference apparatus entries 201. The reference apparatus entry 201 is composed of a data set of an apparatus feature quantity 201a and an apparatus state 201b associated therewith. The apparatus feature quantity 201a corresponds to a feature quantity calculated by the feature-quantity calculation means 120, while the apparatus state 201b is associated with the apparatus feature quantity 201a. More specifically, it can be said that detection of the apparatus feature quantity 201a means that the apparatus is in a state represented by the apparatus state 201b. The reference-apparatus entry dictionary 200 is stored in a storage device in advance and can add itself with additional data and can be updated.

FIG. 3(D) shows the matched reference-apparatus entry 131 composed of a data set of an apparatus feature quantity 131a, an apparatus state 131b associated therewith, a feature quantity distance 131c and supplementary information which is not shown. This matched reference-apparatus entry 131 includes results obtained by which the apparatus-state detecting means 130 searches the reference-apparatus entry dictionary 200 with the addition of a feature quantity distance 131c. The apparatus feature quantity 131a and apparatus state 131b corresponds to the apparatus feature quantity 201a and apparatus state 201b of the reference apparatus entry 201, respectively. The feature quantity distance 131c represents a distance between the feature quantity 122a, which is used for searches, of the feature quantity entry 122 and the apparatus feature quantity 201a, which is the obtained search result, of the reference apparatus entry 201.

FIG. 3(E) shows an apparatus state entry 132 composed of a data set of an apparatus state time 132a and an apparatus state 132b. The apparatus state time 132a represents a current time, while the apparatus state 132b is identical to the apparatus state 131b of the matched reference-apparatus entry 131. A plurality of apparatus state entries 132 are stored as historical data in a ring buffer form.

FIG. 4 illustrates data components stored in the storage device 430 of the daily-living-activity estimation device 400.

FIG. 4(A) shows a reference-activity entry dictionary 500 which is an aggregate of reference activity entries 501. The reference activity entry 501 is composed of a data set of a reference activity time 501a, a reference apparatus state 501b, a reference daily-living activity 501c and a reference location 501d. The reference-activity entry dictionary 500 is stored in a storage device in advance and can add itself with additional data and can be updated.

FIG. 4(B) shows a matched reference-activity entry 411 including a data set of a reference activity time 411a, a reference apparatus state 411b, a reference daily-living activity 411c, and a reference location 411d. This matched reference-activity entry 411 is identical to a reference activity entry 501 obtained by which the matching means 410 searches the reference-activity entry dictionary 500.

Figure 5:
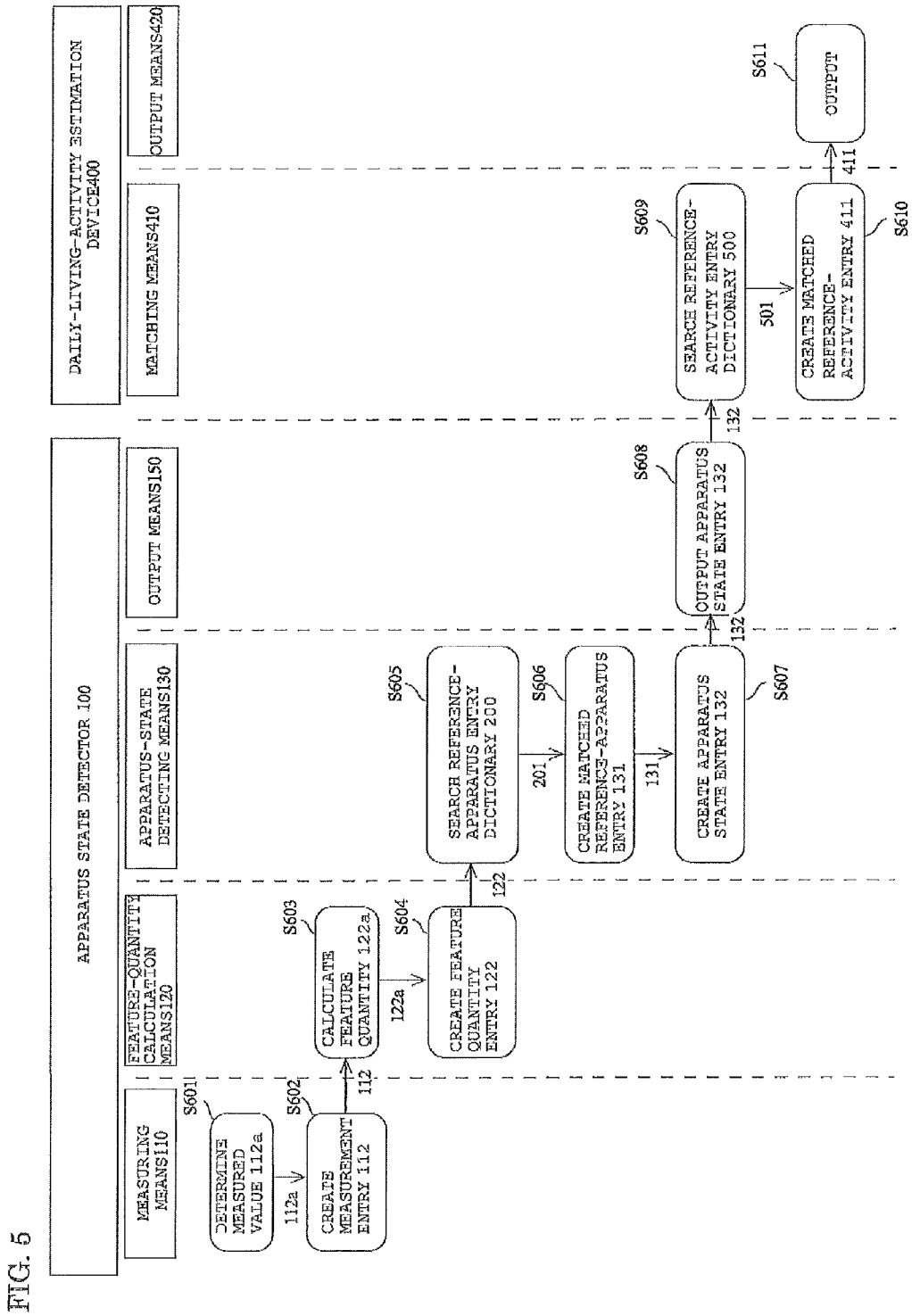
FIG. 5 illustrates an operation flow of the apparatus state detector 100 according to Embodiment 1 of the present invention.

FIG. 5 illustrates an operation flow of the apparatus state detector 100 according to Embodiment 1. In FIG. 5, the numbers attached in the vicinity of arrows connecting steps represent data exchanged between the steps (e.g., "112a" implies a measured value 112a). Specific operations will be described in accordance with the steps below.

(S601)

The measuring means 110 determines measured values 112a. This measured value 112a includes instantaneous values of current measured by the measuring device 300, the instantaneous values being obtained by sampling the current with a constant sampling period.

FIG. 6(A) shows an exemplary data structure of the measured values 112a. The measured value 112a is a vector and includes current values (112a-11, 112a-12 . . . 112a-1n) sampled for a predetermined period of time. These individual current values are collectively called a measured value 112a. The predetermined period of time corresponds to a constant multiple of a period of a wave at 50 Hz to 60 Hz, which is a period of a voltage. In addition, the sampling period corresponds to a constant submultiple of the period of a wave at 50 Hz to 60 Hz. The current values in a measured value 112a are arranged in time order.

The measuring means 110 continuously performs the measuring operation and stores measured values 112a in sequence.

(S602)

The measuring means 110 creates a measurement entry 112 with a measured value 112a. The measurement entry 112 includes the measured value 112a and supplementary information regarding, for example, a measured time and so on. Then, the created measurement entry 112 is successively output to the feature-quantity calculation means 120.

(S603)

The feature-quantity calculation means 120 acquires the measurement entry 112 and calculates a feature quantity 122a from the measured value 112a held by the measurement entry 112. Specifically, the feature-quantity calculation means 120 calculates a difference between a weighted average of measured values 112a and each of the measured values 112a and defines the difference as a feature quantity 121a.

FIG. 6(B) shows an exemplary data structure of the feature quantity 122a. The feature quantity 122a is a vector and includes values associated with the aforementioned measured values 112a. The measured values 112a and the feature quantities 122a correspond one-to-one. The individual measured values, 112a-1n and 122a-1n also correspond one-to-one.

(S604)

Subsequently, a feature quantity entry 122 is created with the calculated feature quantity 121a. The feature quantity entry 122 includes the feature quantity 122a and supplementary information such as a method of calculating the feature quantity, parameters used in the calculation and so on. Then, the created feature quantity entry 122 is successively output to the apparatus-state detecting means 130.

(S605)

The apparatus-state detecting means 130 acquires the feature quantity entry 122 and uses the feature quantity 122a in the feature quantity entry 122 as a search key to search the reference-apparatus entry dictionary 200. The reference-apparatus entry dictionary 200 is an aggregate of the reference apparatus entries 201 each including a data set of an apparatus feature quantity 201a and an apparatus state 201b. Detection of an apparatus feature quantity 201a of a reference apparatus entry 201 indicates that the apparatus is in a state shown by the apparatus state 201b in the reference apparatus entry 201. The apparatus state 201b stores states of apparatuses such as "TV ON", "electric kettle ON" and "microwave ON" and warning states such as "electricity draining" and "anomaly occurring".

The warning state in this description indicates a state in which there is a high possibility that an apparatus has been suffering from some anomalies or an apparatus may suffer from some anomalies. Apparatuses gradually change their conditions and deteriorate over a long time, on a monthly or yearly basis, due to age deterioration and some troubles. This changing state manifests itself in the measured value 112a that then reflects the feature quantity 122a. An apparatus feature quantity 201a and apparatus state 201b in the warning state are stored as a reference apparatus entry 201 in the reference-apparatus entry dictionary 200.

As a result of the search, if a reference apparatus entry 201 having an apparatus feature quantity 201a matching the feature quantity 122a is found, the process goes to the next step, and if not, the process is terminated.

The term "match" in this description does not always mean perfect matching. It is possible to calculate the distance between the calculated feature quantity 122a and the apparatus feature quantity 201a in the reference apparatus entry 201 (hereinafter, referred to as a feature quantity distance) through a given calculation method and determine that there is a "match" when the distance falls within a predetermined threshold range.

(S606)

The apparatus-state detecting means 130 creates a matched reference-apparatus entry 131 based on the search result in step S605. The matched reference-apparatus entry 131 includes, as shown in FIG. 3(D), an apparatus feature quantity 131a, an apparatus state 131b, a feature quantity distance 131c and supplementary information which is not shown. The apparatus feature quantity 131a and apparatus state 131b correspond to the apparatus feature quantity 201a and apparatus state 201b, respectively, in the reference apparatus entry 201 retrieved in step S605, while the feature quantity distance 131c is the feature quantity distance calculated in step S605.

In the steps from S601 to S606, the apparatus state 131b is derived from the measured value 112a measured by the measuring means 110. In short, the state of apparatuses, such as "microwave ON" and "electric kettle ON", is detected based on values of current.

Note that the matched reference-apparatus entry 131 can hold a reference number uniquely identifying a reference apparatus entry 201 retrieved from the reference-apparatus entry dictionary 200 instead of the apparatus feature quantity 131a and apparatus state 131b. The reference number can help achieve much the same purpose. In addition, the purpose can be achieved without holding the feature quantity distance 131c.

(S607)

The apparatus-state detecting means 130 creates an apparatus state entry 132. The apparatus state entry 132 includes, as shown in FIG. 3(E), an apparatus state time 132a and an apparatus state 132b. The apparatus state time 132a indicates a current time, while the apparatus state 132b is identical to the apparatus state 131b of the matched reference-apparatus entry 131 created in step S606. With this apparatus state entry 132, what state (apparatus state 132b) the apparatus is in at a given time (apparatus state time 132a) can be detected. Then, the created apparatus state entry 132 is output to the output means 150.

(S608)

The output means 150 outputs the apparatus state entry 132 to the matching means 410.

(S609)

The matching means 410 acquires the apparatus state entry 132 and searches the reference-activity entry dictionary 500 using the apparatus state 131b as a key. The reference-activity entry dictionary 500 is an aggregate of the reference activity entries 501 each including a data set of a reference activity time 501a, a reference apparatus state 501b, a reference daily-living activity 501c, and a reference location 501d. The reference activity entry 501 is data indicating what activity a user is performing (reference daily-living activity 501c) in which room (reference location 501d) when an apparatus is in a predetermined apparatus state (reference apparatus state 501b) at a given time (reference activity time 501a). The reference activity time 501a is data indicating, for example, "7:10 a.m." or the like. The reference apparatus state 501b is data indicating, for example, "TV ON" or the like. In a case where an apparatus is in a warning state, the data indicates "TV anomaly is occurring" or the like. In a case where a plurality of apparatuses are simultaneously operating, the stored data indicates a plurality of apparatus states such as "TV ON, electric kettle ON". The reference daily-living activity 501c presents concrete contents of a person's activities and stores data indicating, for example, "breakfast", "away from home" or the like. The reference location 501d presents where the person who is performing the reference daily-living activity 501c is. For example, if the reference daily-living activity 501c is "breakfast", the data stored in the reference location 501d indicates "dining room" or the like.

If a reference activity entry 501 having a reference apparatus state 501b matching an apparatus state 132b in an apparatus state entry 132 is found as a result of a search, the reference activity entry 501 is defined as a search result. If a plurality of reference activity entries 501 having reference apparatus states 501b matching the apparatus state 132b are found, a comparison is made between their current times or their apparatus state times 132a and reference activity times 501a, and the reference activity entry whose time difference is the smallest is defined as a search result. In addition, if there is no reference activity entry 501 having a reference apparatus state 501b matching the apparatus state 132b, this process is terminated.

(S610)

Subsequently, the matching means 410 stores the reference activity entry 501 retrieved from the reference-activity entry dictionary 500 as a matched reference-activity entry 411. The reference activity time 411a, reference apparatus state 411b, reference daily-living activity 411c and reference location 411d correspond to those, respectively, in the reference activity entry 501 retrieved in S609.

In the steps from S601 to S610, a measured value 112a measured by the measuring means 110 draws an apparatus state 131b and also a reference daily-living activity 411c and a reference location 411d of a person are derived from it. In other words, the apparatus state, such as "microwave ON" and "electric kettle ON", is detected based on values of current, and then a daily-living activity, such as "breakfast", is estimated based on the apparatus state.

(S611)

The output means 420 acquires and outputs the matched reference-activity entry 411. The output data is, for example, a whole matched reference-activity entry 411 or a reference daily-living activity 411c and reference location 411d. The data output by the output means 420 is output to an output device 302 such as a display readable by the person living in the residence. Alternatively, it is possible to output a reference apparatus state 411b only when the reference apparatus state 411b indicates a warning state such as "anomaly occurring", or it is also possible to inform of a warning state in a different output way from that when the apparatus is in a regular apparatus state. This can clearly alert the person to the emergence of the apparatus's anomalous operations.

Through the series of operations, an apparatus state 131b is acquired from a measured value 112a measured by the measuring means 110, and furthermore a reference daily-living activity 411c and reference location 411d can be obtained. In other words, the states of domestic apparatuses are estimated from domestic current values to estimate the daily living activity and location of the person living in the residence.

The reference activity entries 501 in a reference-activity entry dictionary 500 can be sorted in ascending or descending order of the reference activity time 501a. This enables the reference activity entries 501, which are positioned before and after the reference activity entry 501 found matched as a result of the search, to be used for reference. Therefore, estimating a daily living activity of a person at a given time results in estimating what kind of activity the person has performed immediately before the activity and what kind of activity the person will perform after the activity. In the same manner, the room in which the person presently is, the person was in the immediate past and the person will be in the immediate future can be also estimated. Based on the estimated results, the ON/OFF state, operation mode, and other various operations of the apparatus can be controlled. Note that this usage is just an example, and the applications are not limited thereto.

Although Embodiment 1 describes that the reference activity entry 501 holds the reference daily-living activity 501c and reference location 501d separately, it is possible to hold either of them or both of them in a combined form. If estimation of only activities performed by the person is needed, for example, it is possible to design the reference activity entry to hold only the reference daily-living activity 501c.

If estimation of activities and locations of the person, which are regarded as "movement of the person" from a comprehensive perspective, is needed, the reference daily-living activity 501c and reference location 501d are combined into one so as to indicate "eating in a living room", "turning on a light in a bedroom" and "present in a living room", etc.

Although Embodiment 1 describes an example when the apparatus state detector 100 is installed in a residence, it is apparently obvious that the apparatus can be installed in any environment other than a residential environment.

This installation flexibility is applied to other embodiments which will be described below.

Furthermore, the matching means 410 can use more than one consecutive apparatus state entry 132 as search keys for the purpose of improving search precision. In the case of using two search keys, for example, when apparatus states 132b held by two consecutive apparatus state entries 132 and reference apparatus states 501b held by two consecutive reference activity entries 501 match each other, respectively, the two matched reference apparatus entries are output as a search result.

As described above, the apparatus state detector 100 according to Embodiment 1 can detect states of domestic apparatuses based on domestic current values. In addition, the daily-living-activity estimation device 400 can estimate daily living activities of a person based on the apparatus state. Furthermore, the apparatus state detector 100 capable of detecting warning states can detect anomalies, such as defects of an apparatus, in an early stage, thereby improving safety of the environment in which the apparatus is placed. Moreover, early detection of anomalies such as electric leakage is also possible, thereby keeping unnecessary energy loss to a minimum.

As for the daily-living-activity estimation device 400, if the matching means 410 searches the reference-activity entry dictionary 500 and obtains a plurality of search results that match an apparatus feature quantity, the search results are narrowed by using time data. Consequently, activity estimation can be conducted by following an activity pattern of a person in accordance with time, thereby improving estimation precision.

Since the reference activity entries 501 that are sorted in ascending or descending order of the reference activity time 501a are stored in the reference-activity entry dictionary 500, not only a daily living activity at a given time but also daily living activities before and after the activity can be estimated. Thus, it is possible, for example, to automatically start an electrical apparatus in accordance with an activity expected to be next performed by the person or to stop an electrical apparatus unintentionally left on, thereby contributing to improvement of person's convenience and a reduction of energy consumption.

Embodiment 2

In Embodiment 2, a method for calculating a feature quantity 121a by a feature-quantity calculation means 120 will be described. Particularly, the description will be made about step S603 in FIG. 5 in detail. Embodiment 2 employs the system configuration in FIG. 1 and the structure of the apparatus state detector 100 and daily-living-activity estimation device 400 in FIG. 2, which are the same as those in the aforementioned Embodiment 1, and their descriptions will be omitted.

FIG. 7 is a schematic diagram illustrating a method for calculating feature quantities by the feature-quantity calculation means 120.

In FIG. 7(A), measured values 112a are values of current measured by a measuring means 110. When receiving a measured value 112a, the feature-quantity calculation means 120 determines weighted averages of individual measured values 112a-11, 112a-12 ... 112a-1n, which constitute the measured value 112a, with a window width of two and defines the average value as an average measurement value 1202. The "window width of two" means the average of "two" values each. More specifically, an average of a measured value 112a-11 and a measured value 112a-12 is obtained, and the average value is called an average measurement value 1202-11. The other measured values contained in the measured value 112a are averaged with the same calculation. Furthermore, a difference between the average measurement value 1202 and the measured value 112a is determined to obtain a differential measurement value 1204. More specifically, a differential measurement value 1204-11 is determined by obtaining the difference between a measured value 112a-11 and an average measurement value 1202-11. Similarly, a differential measurement value 1204-12 is determined by obtaining the difference between a measured value 112a-12 and the average measurement value 1202-11. By the calculations, the measured value 112a is broken down into an average measurement value 1202 and a differential measurement value 1204.

In FIG. 7(B), the same operations as above are subjected to the average measurement value 1202. The average measurement value 1202 in FIG. 7(B) is identical to the average measurement value 1202 in FIG. 7(A). The feature-quantity calculation means 120 determines weighted averages of individual average measurement values 1202-11, 1202-12 . . . , which constitute the average measurement value 1202, with a window width of two and defines the average value as a second average measurement value 1205. More specifically, an average measurement value 1205-11 is determined by averaging the average measurement values 1202-11 and 1202-12. The other values making up the average measurement value 1202 are averaged with the same calculation. Furthermore, a difference between the average measurement value 1202 and the second average measurement value 1205 is determined to obtain a second differential measurement value 1206. More specifically, a second differential measurement value 1206-11 is determined by obtaining the difference between an average measurement value 1202-11 and a second average measurement value 1205-11.

The aforementioned calculations are repeated until the number of averaged value samples becomes less than the window width, resulting in a plurality of differential measurement value vectors and average measurement value vectors. The plurality of differential measurement value vectors and average measurement value vectors make a feature quantity 122a. In this case, the number of data items making up a measured value 112a does not always agree with the number of data items making up a feature quantity 122a. Such computations can separate small fluctuation components from large fluctuation components, thereby efficiently expressing the feature of the measured value 112a.

Figure 8:
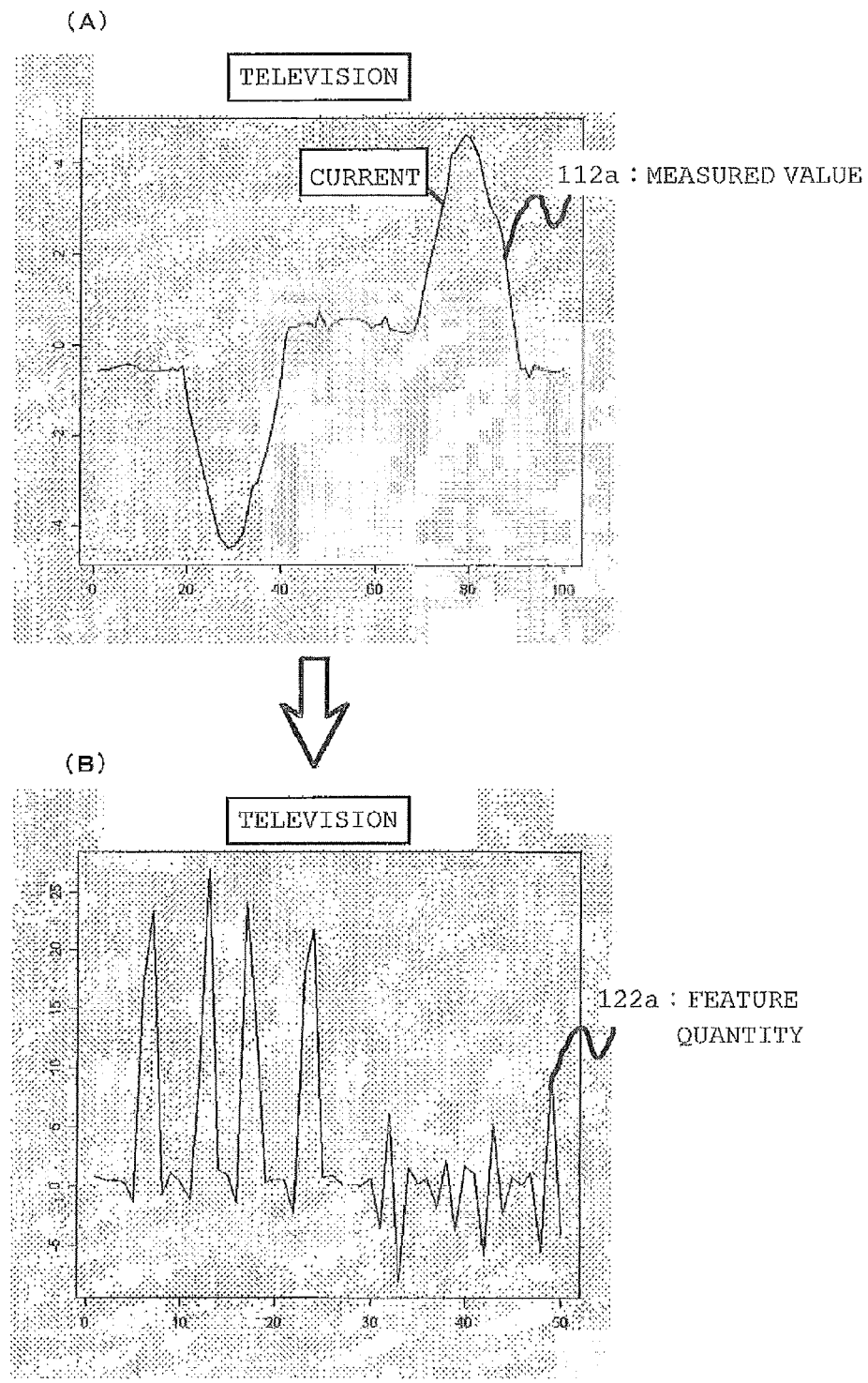
FIG. 8 illustrates a specific example of measured values 112a and feature quantities 122a according to Embodiment 2 of the present invention.

FIG. 8 illustrates an example of a measured value 112a obtained from actually measured current values of a television and a feature quantity 122a calculated by the feature-quantity calculation means 120. FIG. 8(A) shows a current waveform of the television, which was obtained by measuring current values for 20 ms. The measured value 112a takes a different waveform depending on the apparatus. FIG. 8(B) shows a result of a feature quantity 122a figured out by the aforementioned calculation method in FIG. 7. The feature quantity 122a emphasizes the feature quantity of the measured value 112a that varies by the apparatus.

Thus obtained feature quantity 122a is stored, in advance, in a reference apparatus entry 201 of the reference-apparatus entry dictionary 200 as an apparatus feature quantity 201a. When a feature quantity 122a matching the apparatus feature quantity 201a is obtained, it can be determined that the television has started operating.

According to Embodiment 2 as described above, the feature of the measured value 112a unique to the apparatus can be presented in an exaggerated way by subjecting the measured value 112a to predetermined calculations to obtain a feature quantity 122a. Therefore, application of thus obtained feature quantity 122a to above-described Embodiment 1 makes it possible to detect the states of apparatuses with higher accuracy.

In the method for calculating the feature quantity described with FIG. 7, the feature quantity is a sum of the plurality of differential measurement value vectors and average measurement value vectors; however, among the plurality of differential measurement value vectors and average measurement value vectors, components that are great in the sample numbers and exhibit small fluctuations can be discarded and the remaining components can make the feature quantity. This can reduce the dimensions of the feature quantity and therefore can compress the data volume.

Furthermore, in the method for calculating the feature quantity described with FIG. 7, the feature quantity is a sum of the plurality of differential measurement value vectors and average measurement value vectors; however, among the plurality of differential measurement value vectors and average measurement value vectors, only dimensional components representing great difference from other apparatuses can be taken out to define them as a feature quantity. This makes the difference in feature quantity between apparatuses larger, thereby improving matching accuracy for the searching operation.

Furthermore, in the method for calculating the feature quantity described with FIG. 7, the feature quantity is a sum of the plurality of differential measurement value vectors and average measurement value vectors; however, among the plurality of differential measurement value vectors and average measurement value vectors, only weighted averages and difference values in a section in which the current values greatly vary can be taken out to define them as a feature quantity.

As shown in the measured value 112a in FIG. 8(A), the actual current values of the apparatus are 0 in many sections. Producing a feature quantity with current values in other sections than those composed of current values of 0 can make the number of dimensions of the feature quantity fewer.

In Embodiment 2, the feature quantity is a sum of the plurality of differential measurement value vectors and average measurement value vectors; however, it is possible to define only the average measurement value vectors as a feature quantity. The use of the average measurement value vectors alone can reduce the data volume of the feature quantity vectors, while providing a feature quantity of the apparatus.

Furthermore, the feature quantity 122a may be determined by extracting periodicity of the measured value 112a rather than obtaining the weighted averages. The periodicity can be extracted by extracting a value of, for example, a distance between peaks, a peak factor of a wave, and a rise time or a fall time of periods.

The extraction of the periodicity can be made by performing Fourier transform or wavelet transform on the measured values.

In this case, the feature quantity 122a is produced with the strength and phase of each harmonic component, which is an efficient way to express the harmonic components. This approach also can provide a feature quantity 122a for every apparatus.

Furthermore, the feature quantity 122a can be calculated from a plurality of consecutive measured values 112a rather than from individual measured value 112a. This approach also can provide feature quantities of apparatuses having different periods.

Embodiment 3

In Embodiment 3, a description will be made about search operations performed by the apparatus-state detecting means 130 to search the reference-apparatus entry dictionary 200.

This description details the aforementioned step S605 in FIG. 5. Embodiment 3 employs the system configuration in FIG. 1 and the structure of the apparatus state detector 100 and daily-living-activity estimation device 400 in FIG. 2, which are the same as those in the aforementioned Embodiment 1, and their descriptions will be omitted.

In Embodiment 3, when searching the reference-apparatus entry dictionary 200, the apparatus-state detecting means 130 presents the degree of match between the feature quantity entry 122 and reference apparatus entry 201 with an index of a feature-quantity matching degree. The determination of whether the feature quantity entry 122 matches the reference apparatus entry 201 depends on the magnitude of the feature-quantity matching degree.

The feature-quantity matching degree is obtained by calculating the difference between values of each dimension of the feature quantity 122a of the feature quantity entry 122 and the apparatus feature quantity 201a held by the reference apparatus entry 201. As shown in FIG. 6(B), the feature quantity 122a is a vector. Similarly, the apparatus feature quantity 201a is a vector of the same dimension. When each element of the feature quantity 122a is denoted as $A_i$ and each element of the apparatus feature quantity 201a is denoted as $B_i$, the feature-quantity matching degree S can be determined by using Equation 1 below. In Equation 1, the feature-quantity matching degree S is a value of 0 to 1.

$$S = \frac{1}{\left(\sum_i |A_i - B_i|\right) + 1} \quad \text{[Equation 1]}$$

Alternatively, the feature-quantity matching degree S can be obtained by calculating an inner product of the vectors of the feature quantity 122a and apparatus feature quantity 201a and dividing the inner product by a norm of each vector.

Alternatively, the feature-quantity matching degree S can be obtained by comparing values of each dimension of the vectors of the feature quantity 122a and apparatus feature quantity 201a, counting the number of values almost matching each other and dividing the number by the total number of the dimensions.

As described above, the apparatus state detector 100 according to Embodiment 3 uses the feature-quantity matching degree as an index to retrieve a reference apparatus entry 201 with a high degree of feature-quantity matching. Therefore, even if there is no reference apparatus entry 201 perfectly matching a feature quantity, the apparatus state detector 100 can estimate the state of the apparatus. The calculation method described above can improve the accuracy of the feature-quantity matching degree.

Embodiment 4

In Embodiment 4, a description will be made about search operations performed by the apparatus-state detecting means 130 to search the reference-apparatus entry dictionary 300 while a plurality of apparatuses are simultaneously in operation. This description details the aforementioned step S605 shown in FIG. 5. Embodiment 4 employs the system configuration in FIG. 1 and the structure of the apparatus state detector 100 and daily-living-activity estimation device 400 in FIG. 2, which are the same as those in the aforementioned Embodiment 1, and their descriptions will be omitted.

The feature quantity 1220 shown in FIG. 9(A) is made of feature quantities 122a continuously plotted on a graph. As described above, the feature-quantity calculation means 120 sequentially outputs feature quantity entries 122 to the apparatus-state detecting means 130. Therefore, the feature quantities 122a of the feature quantity entries 122 received by the apparatus-state detecting means 130 are deemed to be continuous values. The continuous feature quantities 122a are schematically depicted in FIG. 9(A). In other words, the feature quantities 122a can be obtained by dividing a feature quantity 1220 by a predetermined time unit.

Searching the reference-apparatus entry dictionary 200 by the apparatus-state detecting means 130 in step S605 in FIG. 5 starts with obtaining the difference between the present feature quantity 122a and a past feature quantity 122a as shown in FIG. 9(A). The past feature quantity 122a used here is a feature quantity produced one or more periods earlier than the present time. FIG. 9(B) illustrates an example of the obtained difference. In FIG. 9(B), the difference between the past feature quantity 122a, which is indicated by a dashed dotted line, and the present feature quantity 122a, which is indicated by a dashed line, is indicated by a solid line. The difference is a feature quantity of an apparatus that has varied from the past to the present. For example, given that an apparatus has been operating since a point in the past and another apparatus started operation at a point between the past and present, the feature quantity of the apparatus started operation manifests itself as the difference. The apparatus-state detecting means 130 searches the reference-apparatus entry dictionary 200 using the difference as a search key. Then, the apparatus-state detecting means 130 retrieves a reference apparatus entry 201 holding an apparatus feature quantity 201a matching the difference and identifies the entry 201 as a search result.

According to Embodiment 4, the use of the difference between the present feature quantity 122a and past feature quantity 122a as a search key can help detect the state of an apparatus even if a plurality of apparatuses are simultaneously operating. For example, the state of an apparatus that has changed its state at a point between the past and present can be also detected. Since the sharp change expressed by the difference between the feature quantities 122a is specific to an apparatus, searching the reference-apparatus entry dictionary 200 using the difference as a search key makes it possible to detect the apparatus state of the apparatus that has started an operation.

In addition, the detection of the apparatus state using the difference between the present feature quantity 122a and past feature quantity 122a as a search key requires only apparatus feature quantities 201a associated with each apparatus state 201b to be stored in the reference-apparatus entry dictionary 200, but does not need to store apparatus states obtained when a plurality of apparatuses are simultaneously operating in the reference-apparatus entry dictionary 200. Therefore, there is no need to learn in advance about the apparatus states in the situation where a plurality of apparatuses are in operation at the same time. This reduces the amount of information to be stored, resulting in the storage device 140 needing smaller capacity.

Furthermore, even if, while an apparatus whose information is not stored in the reference-apparatus entry dictionary 200 is in operation, an existing apparatus whose information is stored in the reference-apparatus entry dictionary 200 has started, the apparatus state of the existing apparatus can be detected by using the difference.

In Embodiment 4, the present feature quantity 122a can be added into the reference-apparatus entry dictionary 200. In this case, a new reference apparatus entry 201 holding a present feature quantity 122a defined as an apparatus feature quantity 201a and a retrieved apparatus state defined as an apparatus state 201b is created and added into the reference-apparatus entry dictionary 200. Adding the reference apparatus entry 201 into the reference-apparatus entry dictionary 200 enables highly-accurate searches in search operations from that time forward.

Moreover, the difference between the present feature quantity 122a and past feature quantity 122a can be obtained by using a past feature quantity 122a that was calculated before the apparatus was operated. A determination as to whether the apparatus has been operated can be made by determining if the length of long period components of the feature quantity 122a has changed more than a given value. Therefore, with a focus placed on the long period components of the feature quantity 122a, the difference between the feature quantity 122a obtained before the intensity changed more than a given value and the present feature quantity 122a is calculated, thereby detecting the apparatus state of the apparatus that has started an operation.

Furthermore, the method for detecting apparatus state in Embodiment 4 can be used with Embodiment 1 or 2.

Embodiment 5

In the aforementioned Embodiment 1, detection of a warning state of an apparatus is made by retrieving a reference apparatus entry 201 that holds an apparatus state 201b indicating a warning state as a result of searching the reference-apparatus entry dictionary 200. In Embodiment 5, the other approach for detecting the warning state of the apparatus will be described. Descriptions about the same components as those in Embodiment 1 will be omitted.

Figure 10:
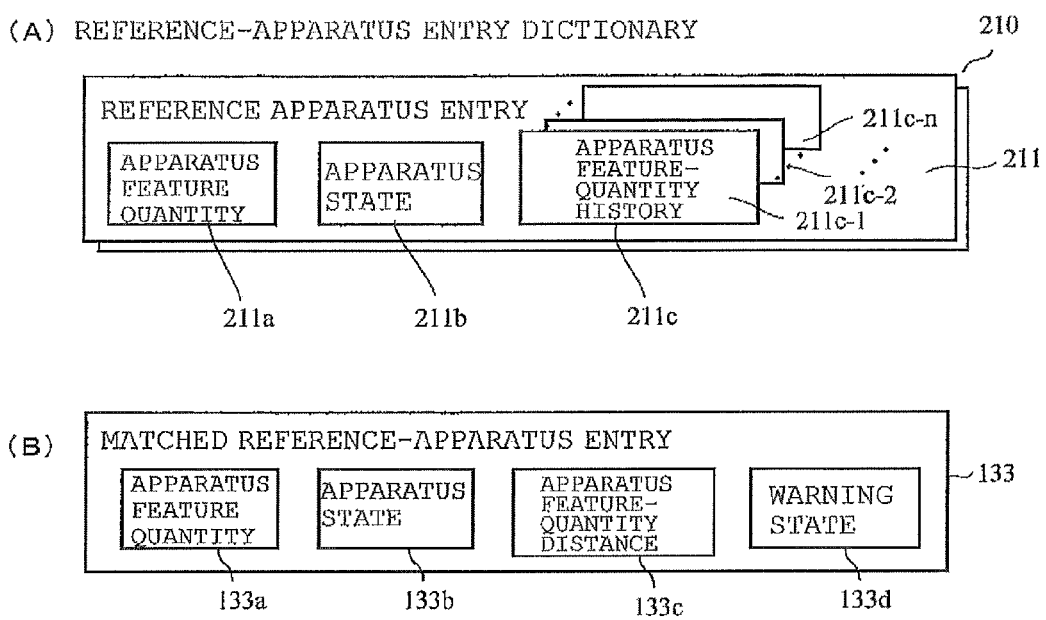
FIG. 10 illustrates a data structure of a reference-apparatus entry dictionary 210 and a matched reference-apparatus entry 133 according to Embodiment 5 of the present invention.

FIG. 10 illustrates a data structure of a reference-apparatus entry dictionary 210 and a matched reference-apparatus entry 133 according to Embodiment 5. Instead of the reference-apparatus entry dictionary 200 and matched reference-apparatus entry 131 shown in Embodiment 1, a reference-apparatus entry dictionary 210 and a matched reference-apparatus entry 133 are provided in Embodiment 5.

FIG. 10(A) shows the reference-apparatus entry dictionary 210 including an aggregate of reference apparatus entries 211. The reference apparatus entry 211 includes a data set of an apparatus feature quantity 211a, an apparatus state 211b and apparatus feature quantity historical data 211c. The apparatus feature quantity 211a and apparatus state 211b are identical to the apparatus feature quantity 201a and apparatus state 201b, respectively, described in Embodiment 1. The apparatus feature quantity historical data 211c is composed of historical data of feature quantities 122a calculated by the feature-quantity calculation means 120.

FIG. 10(B) shows the matched reference-apparatus entry 133 including a data set of an apparatus feature quantity 133a and apparatus state 133b, feature quantity distance 133c and warning state 133d which are associated with the apparatus feature quantity 133a. The matched reference-apparatus entry 133 is different from the matched reference-apparatus entry 131 only in that the warning state 133d is included.

Figure 11:
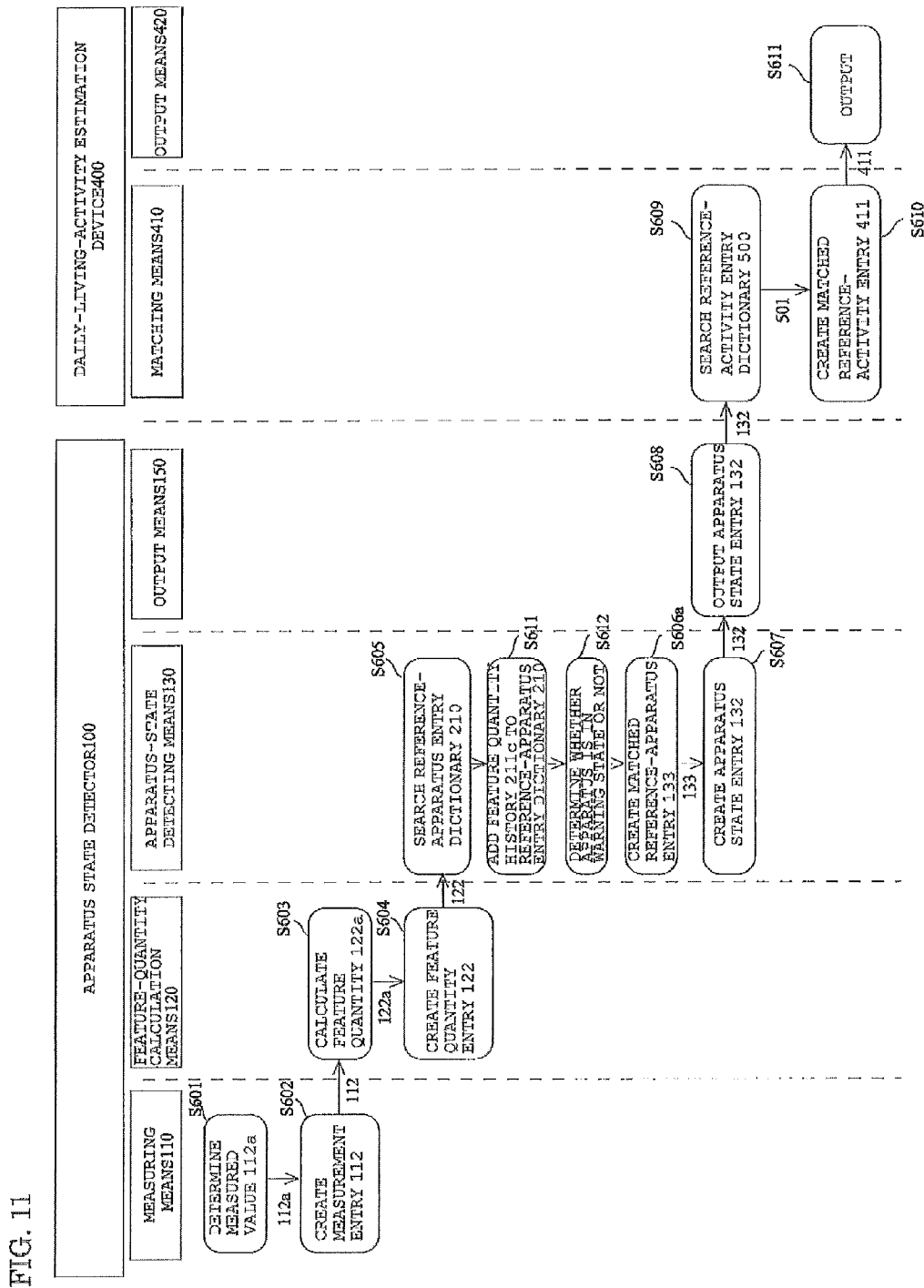
FIG. 11 illustrates an operation flow of an apparatus state detector 100 according to Embodiment 5 of the present invention.

FIG. 11 illustrates an operation flow of the apparatus state detector 100 according to Embodiment 5. FIG. 11 has the same steps as those in FIG. 5 except for steps S611, S612 and S606a, and the same steps will not be further described. Detailed operations will be described below in accordance with each step.

(S611)

The apparatus-state detecting means 130 that retrieved a reference apparatus entry 211 by using a feature quantity 122a as a search key in step S605 stores the feature quantity 122a as historical data of the apparatus feature-quantity historical data 211c in the retrieved reference apparatus entry 211. As described in Embodiment 1, in step S605, the apparatus-state detecting means 130 retrieves reference apparatus entries 211 whose apparatus feature quantity 211a not only perfectly matches the feature quantity 122a used as a search key but also matches the feature quantity 122a with a high degree of feature-quantity matching. Under the conditions, even if a reference apparatus entry 211 is retrieved as results of searches, the feature quantities 122a used as a search key may be different from each other. Consequently, various feature quantities 122a are stored as the apparatus feature quantity historical data 211c.

(S612)

The apparatus-state detecting means 130 calculates the average of the accumulated apparatus feature quantity historical data 211c and further determines whether the average value exceeds a predetermined threshold. The state in which the average exceeds the threshold is determined as a warning state. Apparatuses change themselves gradually on monthly or yearly basis and deteriorate. The changes affect the measured value 112a and then affect the feature quantity 122a. In step S612, a determination as to whether the feature quantity 122a is changing or in other words, the apparatus is in a warning state or not, are made by calculating the average value of the apparatus feature quantity historical data 211c and evaluating whether the average value exceeds a threshold.

The determination as to whether the apparatus is in a warning state or not can be made by calculating a variance, instead of an average, of the apparatus feature quantity historical data 211c and evaluating whether the variance value exceeds a threshold. Alternatively, both average and variance values can be used to determine whether the apparatus is in the warning state.

The predetermined threshold may be a common value set for all apparatuses or a distinct value set for each apparatus.

(S606a)

If it is determined that the apparatus is in a warning state in step S612, details about the warning are added to the warning state 131d in the matched reference-apparatus entry 131. Alternatively, the additional data can be just information that the apparatus is in a warning state rather than such warning details.

As described above, Embodiment 5 capable of determining whether the apparatus is in a warning state or not from the historical data of the feature quantities 122a can detect not only the state representing whether the apparatus is in operation, but also the deterioration state associated with secular changes and other states such as an apparatus's operational problems. Even if a feature quantity 122a that is not stored in the reference-apparatus entry dictionary 210 is obtained, it is possible to detect the warning state in Embodiment 5.

Furthermore, the determination of a warning state in step S612 can be made as follows.

The warning state can be determined by obtaining the difference or ratio between a present feature quantity 122a used as a search key and apparatus feature quantity historical data 211c and evaluating whether the difference or ratio value exceeds a predetermined threshold. This reveals the degree of divergence between the present feature quantity 122a and past feature quantity 122a. If the value exceeds the threshold, the apparatus is determined to be in a warning state. The predetermined threshold may be a common value set for all apparatuses or a distinct value set for each apparatus.

Alternatively, the determination of a warning state in step S612 can be made as follows.

The warning state can be determined by calculating the average value of the apparatus feature quantity historical data 211c, then calculating the difference or ratio between the average value and present feature quantity 122a and evaluating whether the value exceeds a predetermined threshold. This reveals the degree of divergence between the present feature quantity 122a and the average of the past feature quantities 122a. If the value exceeds the threshold, the apparatus is determined to be in a warning state. The predetermined threshold may be a common value set for all apparatuses or a distinct value set for each apparatus.

Alternatively, the determination of a warning state in step S612 can be made as follows.

The warning state can be determined by obtaining the average value of a predetermined number of older apparatus feature quantity historical data 211c and the average value of a predetermined number of newer apparatus feature quantity historical data 211c, comparing and calculating the difference or ratio of the average values and evaluating whether the difference or ratio exceeds a predetermined threshold. This approach can appropriately translate the changes of the feature quantities 122a which are continuous variables. If the value exceeds the threshold, the apparatus is determined to be in a warning state. The predetermined threshold may be a common value set for all apparatuses or a distinct value set for each apparatus.

Calculation of the average or variance does not require the historical data of all feature quantities 122a to be stored as apparatus feature quantity historical data 211c.

For example, a new average value can be calculated using the following equation.

$$\text{average} = (\text{added value} + (\text{past average value} * \text{the number of historical data in the past})) / (\text{the number of historical data in the past} + 1)$$

As long as the average value and the number of historical data are stored upon the calculation of the average value, the next average value can be calculated therewith, and therefore, there is no necessity to store all apparatus feature quantity historical data 211c.

An example of an equation to obtain a variance is provided below.

$$\text{variance} = \Sigma(\text{average value} - \text{apparatus feature-quantity historical data } 211c)^2 = \Sigma \text{average value}^2 - 2 * \text{average value} * \Sigma \text{apparatus feature-quantity historical data} + \Sigma \text{apparatus feature-quantity historical data}^2$$

As long as the average value, the number of historical data and square sum of the apparatus feature-quantity historical data are stored upon the acquisition of a variance, the next variance can be calculated therewith, and therefore, there is no necessity to store all apparatus feature quantity historical data 211c.

Although the feature quantities 122a are kept as the apparatus feature-quantity historical data 211c in Embodiment 5, this is just an example and the apparatus feature-quantity historical data 211c can be the distance between a feature quantity 122a and an apparatus feature quantity 211a instead of the feature quantity 122a. The distance can produce the same effect as described above.

Furthermore, although the matched reference-apparatus entry 131 is designed to include the warning state 131d in Embodiment 5, the matched reference-apparatus entry 131 can function without the warning state 131d. In this case, the warning state can be added to the apparatus state 131b. If the warning state is added such as "TV ON/warning state", the operation state and warning state of the apparatus can be stored together.

Furthermore, the method for detecting a warning state shown in Embodiment 5 can be used with Embodiments 1 to 4.

Embodiment 6

Embodiment 6 describes another example for detecting a warning state. Embodiment 6 is different from Embodiment 5 in operations of the apparatus-state detecting means 130, but has the same structure which will not be reiterated.

Figure 12:
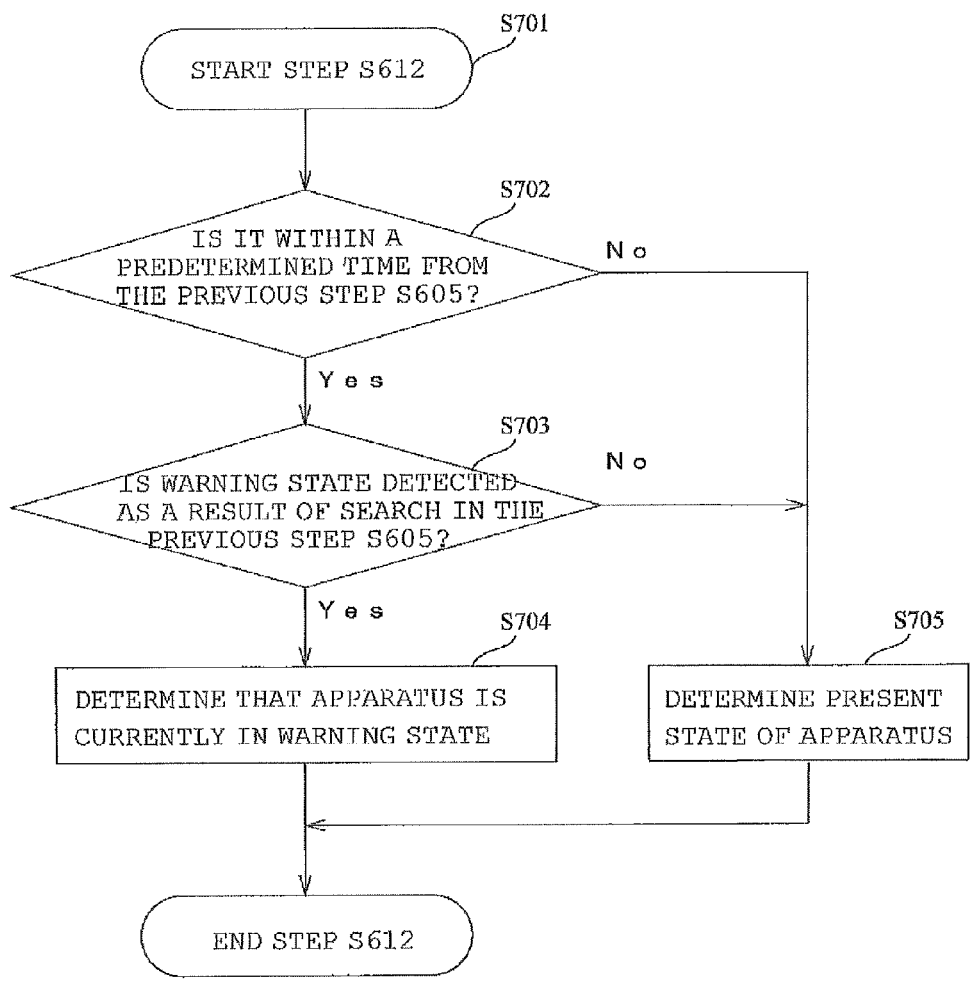
FIG. 12 illustrates an operation flow of an apparatus-state detecting means 130 according to Embodiment 6 of the present invention.

FIG. 12 illustrates an operation flow illustrating operations of the apparatus-state detecting means 130 according to Embodiment 6 to describe step S612 in FIG. 11 in detail. The descriptions will be made about each step below.

(S701)

The apparatus-state detecting means 130 starts the process of step S612 in FIG. 11.

(S702)

The apparatus-state detecting means 130 determines whether this process of step S605 has started within a predetermined time since the last time the process of step S605 was executed. If this process has started within the predetermined time, the process goes to step S703, and if not, the process goes to step S705.

(S703)

The apparatus-state detecting means 130 determines whether a warning state was detected as a result of searching the reference-apparatus entry dictionary 210 in the previous step S605. If "warning state" was detected, the process goes to step S704. If not, the process goes to step S705.

(S704)

The present apparatus state is determined to be a warning state. For example, even if the warning state is not detected as a result of searching the reference-apparatus entry dictionary 210 this time in step S605, the apparatus is determined to be in a warning state in step S704.

(S705)

In accordance with the aforementioned method in Embodiment 5, whether the apparatus is in a warning state or not is determined.

As described above, in Embodiment 6, if a warning state was detected for an apparatus as a result of searching the reference-apparatus entry dictionary 210 based on the feature quantity 122a, the apparatus subsequently detected within a predetermined time is also determined to be in the warning state.

As described in Embodiments 1 to 6, the apparatus state detector 100 according to the present invention can determine whether an apparatus is in a warning state by checking a feature quantity 122a calculated based on current values against a reference-apparatus entry dictionary 210.

By the way, as described above, the "warning state" suggests that there is a high possibility that the apparatus may suffer from age deterioration or other problems which cause malfunctions. Generally, it is unlikely that such malfunctions or the like are easily repaired. However, most changes due to age deterioration proceed at a very slow rate, which may causes measurement errors or the like. Therefore, even if a warning state was once detected, the next search may possibly show that the apparatus is no longer in the warning state.

The apparatus state detector 100 of Embodiment 6 can deal with such a case by determining that the apparatus, which was detected within a predetermined time after the apparatus was detected to be in a warning state, is in a warning state, thereby more reliably detecting the warning state.

Alternatively, rather than instantaneously determining the warning state in step S704, the apparatus state detector 100 can determine that the apparatus is in a pre-warning state and conclude that the apparatus is in a warning state when the number of the pre-warning state determinations reaches a predetermined number.

This approach prevents the warning states from being over-issued, while determining the warning state with high accuracy.

The method for detecting a warning state in Embodiment 6 can be used together with the aforementioned Embodiments 1 to 4.

Embodiment 7

Embodiment 7 describes operations of the matching means 410 searching the reference-activity entry dictionary 500. This description details the aforementioned step S609 in FIG. 5. Embodiment 7 employs the system configuration in FIG. 1 and the structure of the apparatus state detector 100 and daily-living-activity estimation device 400 in FIG. 2, which are the same as those in Embodiment 1, and their descriptions will be omitted.

When searching the reference-activity entry dictionary 500, the matching means 410 presents the matching degree between the apparatus state entry 132 and reference activity entry 501 using a reference activity matching degree as an index.

For example, if an apparatus state 132b used as a search key matches a reference apparatus state 501b while the apparatus state time 132a considerably differs from the reference activity time 501a, the matching means 410 considers the degree to which the entries match, or the reference activity matching degree is low.

To calculate the matching degree, the difference between the apparatus state time 132a and reference activity time 501a is used. For instance, let the matching degree be denoted as Y, the apparatus state time 132a as X1 and the reference activity time 501a as X2, the matching degree is determined by Equation 2 below. The matching degree Y takes a value from 0 to 1.

$$Y = \frac{1}{\{(X1 - X2) + 1\}}$$ [Equation 2]

In the above-described Embodiment 1, if there are a plurality of reference activity entries 501 whose reference apparatus states 501b match an apparatus state 132b, the latest reference activity entry 501 is used. Equation 2 can assess the result more quantitatively.

More specifically, if there are a plurality of reference activity entries 501 whose reference apparatus states 501b match an apparatus state 132b, their matching degrees Y are calculated using Equation 2 and a reference activity entry 501 having the highest matching degree Y is selected as a search result.

Figure 13:
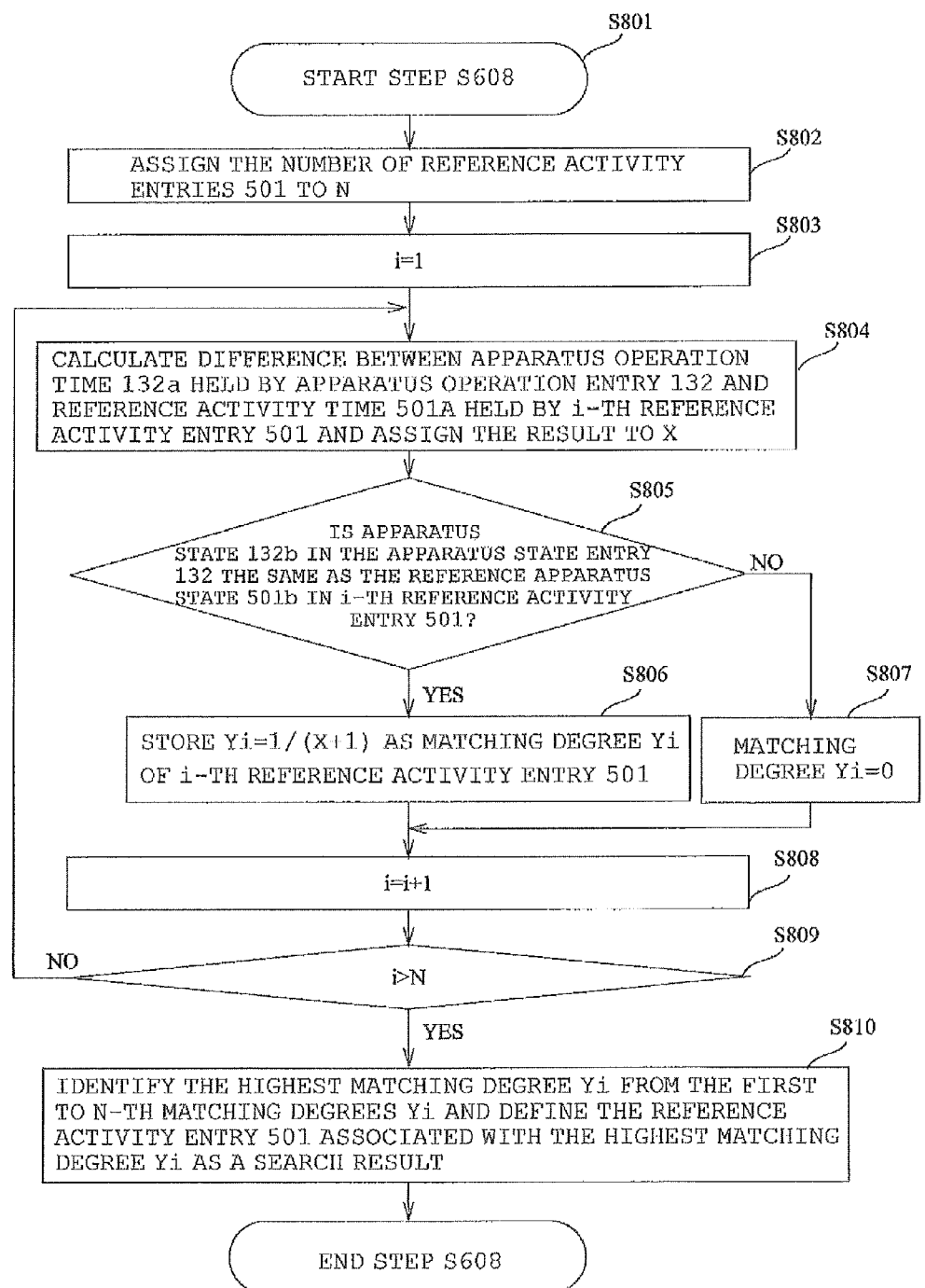
FIG. 13 illustrates an operation flow of a matching means 410 according to Embodiment 7 of the present invention.

FIG. 13 illustrates an operation flow specifically showing operations on the matching means 410 searching the reference-activity entry dictionary 500. FIG. 13 illustrates step S609 in FIG. 5 in more detail. The following are descriptions for each step.

(S801)

The matching means 410 starts the process of step S609. The matching means 410 has obtained an apparatus state entry 132 beforehand.

(S802)

The matching means 410 assigns the number of reference activity entries 501 stored in the reference-activity entry dictionary 500 to variable N.

(S803)

The matching means 410 assigns 1 to variable i which represents the repeat count.

(S804)

The matching means 410 calculates the difference between the apparatus state time 132a held by the apparatus state entry 132 and the reference activity time 501a held by the i-th reference activity entry 501 and assigns the resultant value to variable X.

(S805)

If the apparatus state 132b held by the apparatus state entry 132 matches the reference apparatus state 501b held by the i-th reference activity entry 501, the matching means 410 goes to step S806. If not, the matching means 410 goes to step S807.

(S806)

The matching means 410 stores the matching degree $Y_i$ between the apparatus state entry 132 and the i-th reference activity entry 501 in the form of $Y_i=1/(X+1)$.

(S807)

The matching means 410 stores the matching degree $Y_i$ of the i-th apparatus state entry as 0.

(S808)

The matching means 410 adds 1 to variable i.

(S809)

If variable i is greater than N, in other words, if the comparison process has been finished for all the reference activity entries 501, the matching means 410 goes to step S810. If not, the matching means 410 returns to step S804 and continuously performs the processes.

(S810)

The matching means 410 identifies the highest matching degree $Y_i$ from the first to N-th matching degrees $Y_i$, and defines the reference activity entry 501 associated with the highest matching degree $Y_i$ as a search result.

Through the aforementioned processes, the matching means 410 can find the reference activity entry 501 matching the apparatus state entry 132 at the highest matching degree. It can be said that the reference activity entry 501 with the highest matching degree has a high possibility to match the daily living activity of a person and therefore contributes to accurate activity estimation.

According to the above-described Embodiment 7, estimation of a person's daily living activities is made based on the state of the apparatus and the time, thereby improving estimation accuracy.

The method for estimating daily living activities shown in Embodiment 7 can be used together with the aforementioned Embodiments 1 to 6.

Embodiment 8

Embodiment 8 describes other operations of the matching means 410 searching the reference-activity entry dictionary 500. Embodiment 7 indicates an example in which daily living activities are estimated based on the present apparatus state entry 132; however, Embodiment 8 indicates an example in which daily living activities are estimated based on historical data of apparatus state entries 132 obtained within a predetermined period of time with respect to a point. This description details step S609 in FIG. 5. Embodiment 8 employs the system configuration in FIG. 1 and the structure of the apparatus state detector 100 and daily-living-activity estimation device 400 in FIG. 2, which are the same as those in the aforementioned Embodiment 1, and their descriptions will be omitted.

When searching the reference-activity entry dictionary 500, the matching means 410 performs a calculation using not only an apparatus state entry 132 at the present time but also historical data of the apparatus state entries 132 obtained within a predetermined period from the present time. In Embodiment 8, the predetermined period is set to 20 minutes, for example.

Figure 14:
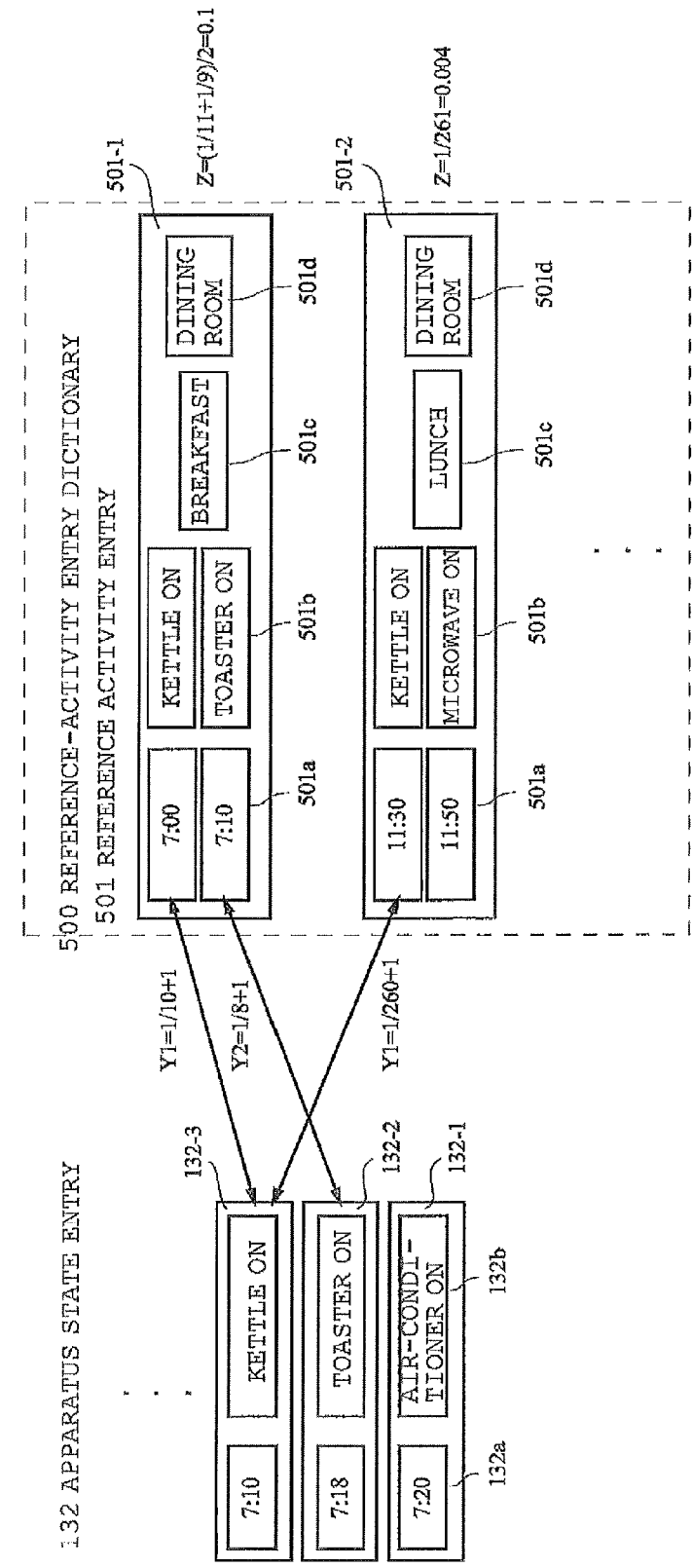
FIG. 14 illustrates processes performed by the matching means 410 according to Embodiment 8 of the present invention.

FIG. 14 illustrates the process operations by which the matching means 419 performs. In FIG. 14, the historical data of the apparatus state entries 132 are stored as apparatus state entries 132-1, 132-2 and 132-3.

A reference activity entry 501 holds a plurality of combinations of a reference activity time 501a and a reference apparatus state 501b with respect to a single reference daily-living activity 501c. For example, the reference activity entry 501-1 holds "breakfast" as the reference daily-living activity 501c and "kettle ON" and "toaster ON" as the reference apparatus state 501b.

In order to estimate a daily living activity at 7:20, the matching means 410 retrieves reference activity entries 501 matching the apparatus state entries 132-1, 132-2, 132-3, which have been previously stored for a predetermined period of time, that is 20 minutes prior to the present time.

More specifically, the matching means 410 retrieves reference activity entries 501 holding at least one reference apparatus state 501b matching the apparatus state entry 132-1, 132-2 or 132-3. In the example shown in FIG. 14, two reference activity entries 501-1 and 501-2 are retrieved. The reference activity entry 501-1 holds "kettle ON" and "toaster ON" in common with the apparatus state entries, while the reference activity entry 501-2 holds "kettle ON" in common. When a plurality of search results are obtained like this example, the matching means 410 calculates a matching degree Z by using Equation 3 below.

$$Z = \frac{1}{N}\sum_{i}^{N} Y_i \quad \text{[Equation 3]}$$

In Equation 3, the matching degree Z is an average of the matching degrees $Y_i$ of respective apparatus state entries 132. In the example shown in FIG. 14, the matching degree Z with the reference activity entry 501-1 is 0.1, while the matching degree Z with the reference activity entry 501-2 is 0.004. The matching means 410 compares both matching degrees and determines that the reference activity entry 501-1 whose matching degree Z is higher than the other is a search result. The matching degree Z is calculated on a per minute basis in Embodiment 8, but other increments of time are possible.

According to above-described Embodiment 8, an estimation of daily living activities is made based on a series of apparatus states within a predetermined period, thereby estimating with high accuracy the daily living activities needing the use of a plurality of apparatuses. For example, when a person performs a daily living activity with a plurality of apparatuses operated and even if the apparatuses are brought into operation in a slightly different order, the daily living activity can be appropriately estimated.

The calculation method shown in Embodiment 8 can be adapted to (Example 1) to (Example 3) shown below.

Example 1

The matching degree between the apparatus state entry 132 and reference activity entry 501 can be calculated using not only absolute time but also relative time. For example, among the historical apparatus state entries 132 obtained within a predetermined period of time, for what is regarded as a base apparatus state entry 132 (hereinafter, referred to as "base entry"), the matching degree is calculated using an absolute time, while for the other apparatus state entries 132, the matching degree is calculated with a relative time from the base entry, and then the average of all the matching degrees is defined as a whole matching degree. Any one of the apparatus state entries 132, such as the one detected at the earliest time in the historical apparatus state entries 132, can be selected as a base entry.

Even if a daily living activity was performed at an unusual time, the matching degree obtained using relative time makes it possible to estimate daily living activities with high accuracy. For example, even if a person woke up 30 minutes late and the subsequent daily living activities are pushed back by 30 minutes, appropriate estimation can be made with a matching degree obtained with the relative time.

Example 2

The matching degree between the apparatus state entry 132 and reference activity entry 501 can be calculated using the number of matched apparatus states without using time. More specifically, among the historical apparatus state entries 132 obtained within a predetermined period of time, the number of apparatus state entries 132 whose apparatus states match a reference apparatus state 501b in a reference activity entry 501 is divided by the number of historical apparatus state entries 132, and the resultant value is defined as a matching degree.

Obtaining the matching degree using the number of matched apparatus states enables estimation of daily living activities regardless of time. For example, estimation of daily living activities of a person with irregular daily habits can be made with high accuracy.

Example 3

The matching degree between the apparatus state entry 132 and reference activity entry 501 can be calculated using the number of consecutively-matched apparatus states. More specifically, among the historical apparatus state entries 132 obtained within a predetermined period of time, the number of apparatus state entries 132 whose apparatus states consecutively match a reference apparatus state 501b in a reference activity entry 501 is divided by the number of historical apparatus state entries 132, and the resultant value is defined as a matching degree, Obtaining the matching degree using the number of consecutively-matched apparatus states enables estimation of daily living activities of a person of irregular habits based on the series of apparatus states, thereby contributing to a highly-accurate estimation.

The method for estimating daily living activity shown in Embodiment 8 can be used together with Embodiments 1 to 6.

Although the apparatus state detector 100 and daily-living-activity estimation device 400 cooperate with each other so that the apparatus states detected by the apparatus state detector 100 are output via the daily-living-activity estimation device 400 to the output device 302 in Embodiments 1 to 8, the method for outputting the apparatus state is not limited thereto. For example, it is also possible to eliminate the daily-living-activity estimation device 400 and to directly output the apparatus states from the apparatus state detector 100 to the output device.

In addition, the independently provided apparatus state detector 100 and daily-living-activity estimation device 400 can be combined into one so as to have the functions of both devices. Furthermore, either one of, or both, the output device 302 and measuring device 300 can be built in a combined device.

Although the measuring means 110 measures current values in the above descriptions, the measuring means 110 can measure the flow rate of water used by apparatuses. The flow rate of water is also different in pattern from apparatus to apparatus as in the case of current, and therefore, the state of an apparatus using water can be detected by similar devices. For example, an automatic washing machine with an automatic water feeder operates in a regular pattern with almost every use, which facilitates detection of the apparatus state, thereby improving accuracy for estimating the location and activity of a person. In addition, the flow rate of water can be used in concert with current.

Alternatively, the measuring means 110 can be adapted to measure the flow rate of gas used by apparatuses. The flow rate of gas is also different in pattern from apparatus to apparatus as in the case of current, and therefore, gas apparatuses in use can be detected by similar devices. For example, a gas heater or the like operating under its own control operates in a regular pattern almost every use, which facilitates detection of the apparatus state, thereby improving accuracy for estimating the location and activity of a person. In addition, the flow rate of gas can be used in concert with current and the flow rate of water.

Alternatively, the measuring means 110 can be adapted to measure the illuminance in an environment such as a room. Illuminance, which is an amount of light, is also different in pattern from lighting apparatus to lighting apparatus and time to time, and therefore, lighting apparatuses in use can be detected by similar devices. For example, a fluorescent lamp produces the same amount of illuminance with almost every use, which facilitates detection of the apparatus state, thereby improving accuracy for estimation of the location and activity of a person. In addition, the illuminance can be used in concert with current, the flow rates of water and gas.

Alternatively, the measuring means 110 can be adapted to measure temperature in an environment such as a room. Temperature, which is an amount of heat, is different in pattern from apparatus to apparatus as in the case of current, and therefore, apparatuses in use can be detected by similar devices. For example, an air-conditioner is set to maintain a place at a temperature with almost every use, which facilitates detection of the apparatus state, thereby improving accuracy for estimating the location and activity of a person. In addition, the temperature can be used in concert with current, the flow rates of water and gas and illuminance.

Alternatively, the measuring means 110 can be adapted to measure the amount of transfer data over a network. The amount of transfer data is different in pattern from application to application as in the case of current, and therefore, the application in use can be detected by similar devices. For example, an IP phone is set to transfer the same amount of data with almost every use, which facilitates detection of the apparatus state, thereby improving accuracy for estimating the location and activity of a person. In addition, the amount of transfer data can be used in concert with current, the flow rates of water and gas, illuminance and temperature.

Embodiment 9

Figure 15:
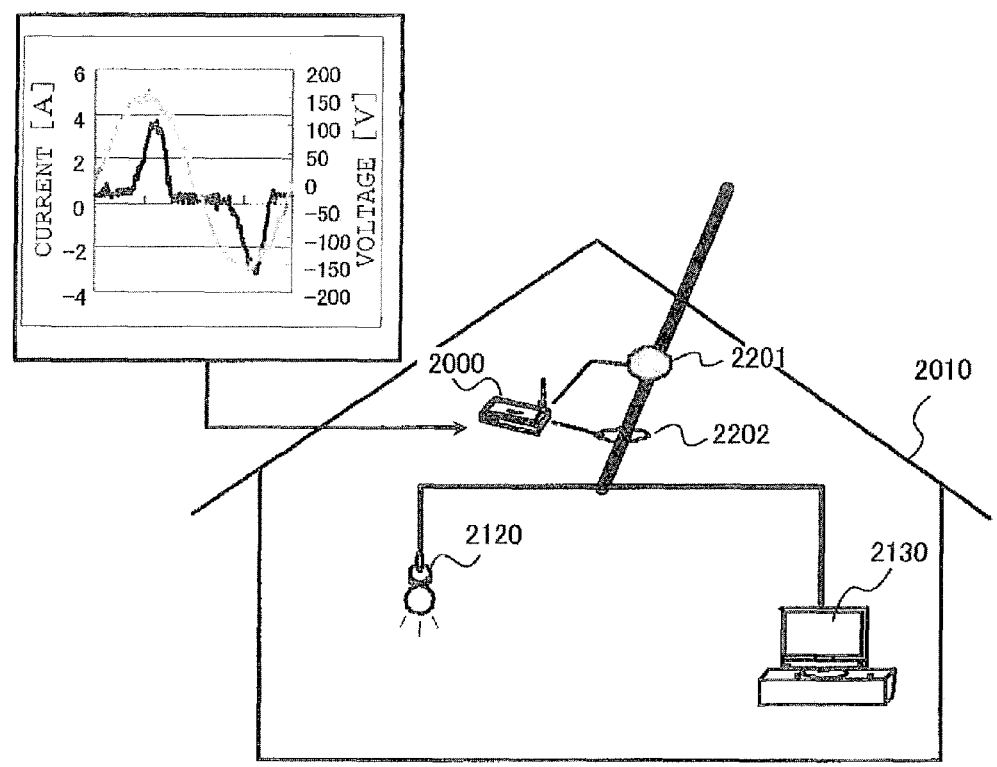
FIG. 15 depicts a structure of a residence 2010 in which an apparatus state detector 2000 according to Embodiment 9 is installed.

FIG. 15 depicts the structure of a residence 2010 in which an apparatus state detector 2000 according to Embodiment 9 of the present invention is installed. In Embodiment 9, a general residential home is shown as an example and the following description will be given.

The residence 2010 is provided with a lighting 2120 and a television 2130 which receive electric power through a feeder line 2140. The feeder line 2140 is connected with the apparatus state detector 2000.

The apparatus state detector 2000 is provided with a current sensor 2202 that measures instantaneous values of current flowing through the feeder line 2140.

The apparatus state detector 2000 is also provided with a voltage sensor 2201 that measures instantaneous values of voltage of the feeder line 2140.

The apparatus state detector 2000 detects the state of apparatuses based on the measured results (current values and voltage values) 150 measured by the current sensor 2202 and voltage sensor 2201.

While the lighting 2120 in FIG. 15 is on, a current unique to the lighting 2120 is flowing in the feeder line 2140. When the television 2130 is turned on, a current unique to the television 2130 starts flowing in the feeder line 2140. It is usually hard to identify the apparatus in use because these currents are mixed in the feeder line 2140; however, the apparatus state detector 2000 in Embodiment 9 can extract features unique to each apparatus from the mixed current and detect the states (ON/OFF state and apparatus mode) of the apparatuses by the structure which will be described later. The current sensor 2202 is attached to a power supply port for supplying electric power; however, it can be attached to an upstream area of an extension cord such as a trailing socket and power strip. In addition, the current sensor 2202 can be attached to a wall outlet, a power meter installed outside the residence or a pole-mounted transformer.

Prior to the detailed descriptions about the apparatus state detector 2000, the principle of detection for the state of an apparatus will be briefly described. The brief description will be made with the television 2130 turned on.

Figure 19:
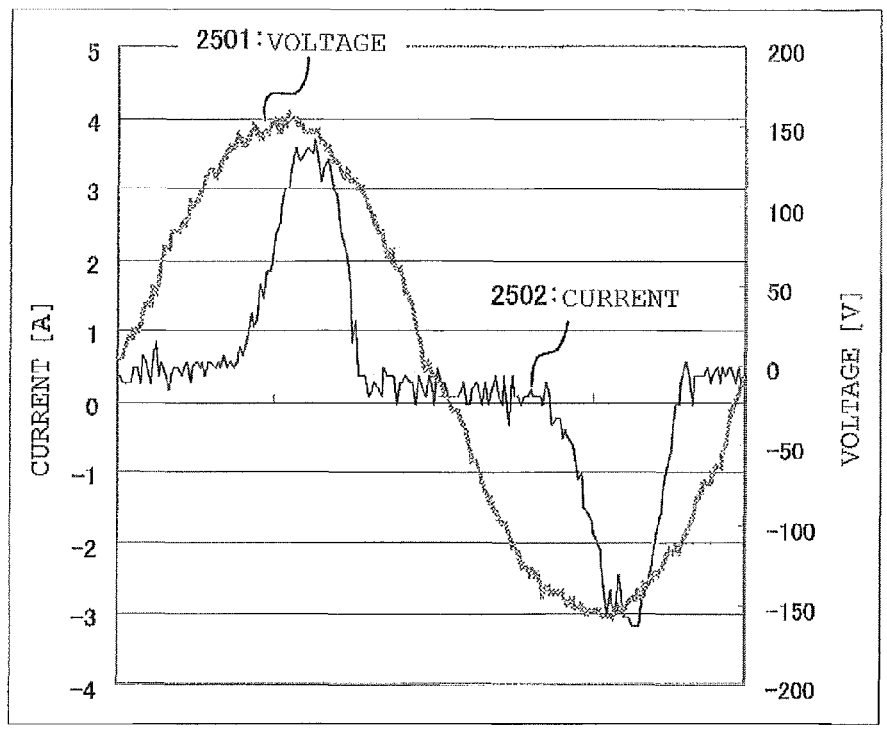

The television 2130 has a unique current 2502 as will be shown in FIG. 19. During the ON state of the television 2130, the specific waveform repeatedly appears for each period of voltage 2501 (utility frequency of 50 Hz or 60 Hz). The unique waveform of the current 2502 unique to the television is derived from the intrinsic property of the power supply circuit of the television. When a simple resistor is put under load, application of a voltage 2501 causes the current to have a similar waveform as the voltage 2501, but this is not applied to the television. The reason why the current 2502 of the television 2130 is not similar to the voltage 2501 is that the television 2130 uses a capacitor input type rectifier circuit, as a power supply circuit, that converts AC to DC. There are various designs of the rectifier circuit and various loads depending on an apparatus, and therefore, each apparatus generates different harmonics. Because of this, a characteristic current waveform like the current 2502 is obtained. Detection of such different harmonics enables determination of what kinds of apparatuses are in operation and what kind of state the apparatuses are in.

Figure 16:
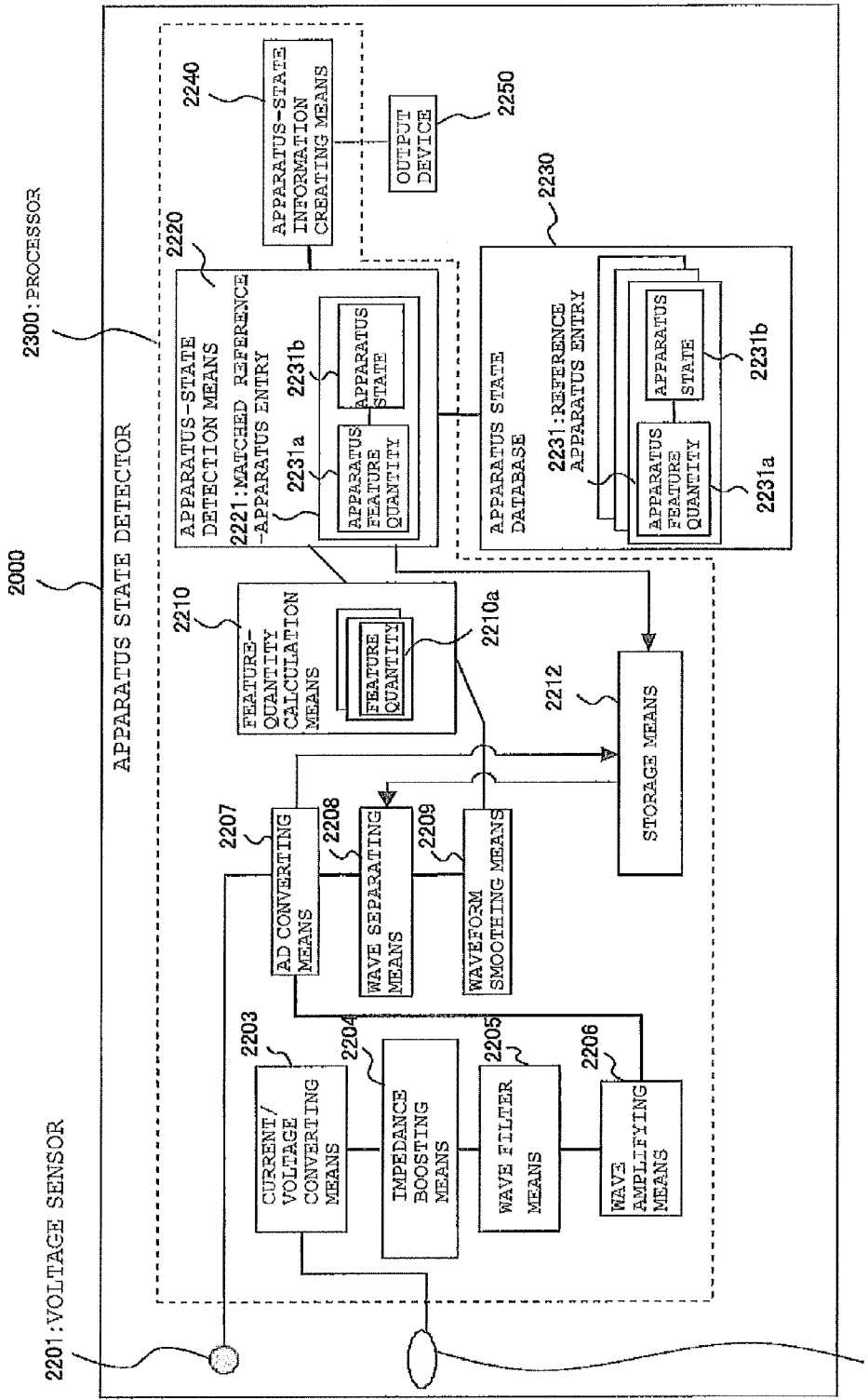
FIG. 16 is a functional block diagram of the apparatus state detector 2000 according to Embodiment 9.

FIG. 16 is a functional block diagram of the apparatus state detector 2000 according to Embodiment 9.

The apparatus state detector 2000 includes a current sensor 2202, a voltage sensor 2201, a processor 2300 that processes measured results of the current sensor 2202 and voltage sensor 2201 to detect the state of apparatuses, an apparatus state database 2230 and an output device 2250 that outputs the processing results.

The processor 2300 includes current/voltage converting means 2203, impedance boosting means 2204, wave filter means 2205, wave amplifying means 2206, AD converting means 2207, wave separating means 2208, waveform smoothing means 2209, feature-quantity calculation means 2210, apparatus-state detection means 2220 and apparatus-state information creating means 2240.

The current sensor 2202 measures instantaneous values of current flowing in the feeder line 2140 and, more specifically, is composed of a current transformer that sets the current transformation ratio between a secondary winding made from N turns wound around a ring core and a feedthrough wire (feeder line 2140) to an N to 1 ratio. The current sensor 2202 reduces the current flowing in the feedthrough wire to one-Nth and allows it to flow to a secondary circuit.

The voltage sensor 2201 measures instantaneous values of voltage flowing through the feeder line 2140 and, more specifically, is a voltage transformer that sets the transformation ratio between a secondary winding made from M turns wound around a core and a feedthrough wire (feeder line 2140) to an M to 1 ratio. The voltage sensor 2201 reduces the voltage between primary wires to one-Mth and outputs it to a secondary circuit.

The current/voltage converting means 2203 converts the waveform of the current, which is detected by the current sensor 2202 and flows through the feeder line 2140, from current values to voltage values. More specifically, for example, the current/voltage converting means 2203 is made with a great precision electric resistor interposed in parallel with the current sensor 2202.

The current/voltage converting means 2203 and current sensor 2202 can be combined into one. For example, a shunt resistor is used to directly convert current into voltage.

The impedance boosting means 2204 increases an output impedance of the current/voltage converting means 2203 from a few times to a few million times. Since the output impedance of the current/voltage converting means 2203 is affected by fluctuations of impedance of the feeder line 2140 which lies through the current sensor 2202, variations of loads on the feeder line 2140 change the output impedance of the current/voltage converting means 2203. The way to maintain fairly consistent output impedance values is to raise the output impedance high enough to ignore the variations. For example, the impedance boosting means 2204 increases the output impedance of several tens of ohms of the current/voltage converting means 2203 to several megohms. The impedance boosting means 2204 is, for example, an operational amplifier or a buffer follower circuit with a transistor.

The wave filter means 2205 extracts only a specific frequency component from the current waveform amplified by the impedance boosting means 2204. The specific frequency ranges from a few times to a few hundred times of a utility frequency of 50 Hz or 60 Hz. The wave filter means 2205 extracts harmonics from the fundamental frequency (utility frequency) and outputs the wave amplifying means 2206 that follows; the reason for this will be described later. The extraction method includes, for example, attenuating utility frequency components by narrowing the passband of the wave filter means 2205 to from 100 Hz to 200 KHz so as to enhance harmonic components.

Alternatively, narrowing the passband of the wave filter means 2205 to from 500 Hz to 200 KHz can significantly attenuate the utility frequency components, which facilitates the extraction of the harmonic components. The wave filter means 2205 may be, for example, an analog band-pass filter attenuating both low and high frequencies, an analog high-pass filter suppressing low frequencies or the like.

The wave amplifying means 2206 amplifies voltage values of the current waveform. The amplification degree is set so that the amplitude between the maximum and minimum voltage values of the current waveform matches or is slightly less than the input range of the AD converting means 2207. For example, when the input range of the AD converting means 2207 is 10 V and the amplitude of voltage values of the current waveform is 100 mV, the amplification degree is approximately from 90 times to 100 times. Setting the amplification degree in this manner, the AD converting means 2207 following the wave amplifying means will make fewer errors caused by digitizing the voltage values.

The AD converting means 2207 is an AD converter that converts the amplified voltage values of the current waveform and the voltage values measured by the voltage sensor 2201 from analog values to digital values and puts the digital values into storage means 2212. The analog-digital conversion involves time-division and quantization. The time division is the process of converting an analog value into a digital value for each predetermined time period. With this process, the analog values, which are continuous with time, are changed to the digital values, which are discrete with time. Quantization is the process of converting an analog value into a digital value based on a predetermined voltage resolution. With this process, the analog values, which are continuous in terms of voltage, are changed to the digital values, which are discrete in terms of voltage. In the case of an AD converter having a resolution of 10 bits and an input range of from 0 V to 5 V, the digital values are converted into discrete values of approximately 4.88 my per step. Note that the impedance boosting means 2204, wave filter means 2205, wave amplifying means 2206 and AD converting means 2207 can be assembled on one semiconductor.

The wave separating means 2208 separates the current digital values stored in the storage means 2212 by a voltage period to adjust the number of sample values (sample current values) within a period of voltage to a predetermined number. The voltage period in this description is equivalent to a period of a wave of 50 Hz or 60 Hz, which is a utility frequency. The period of the voltage values (voltage period) is obtained from the measurement results, which are measured by the voltage sensor 2201 and input by the AD converting means 2207. The voltage period of the utility frequency is approximately 16 ms or 20 ms. Since the voltage period does not always correspond to just a multiple of the time division period used by the AD converting means 2207, the number of sample values within a voltage period is not always constant and fluctuates by plus or minus one.

If the number of the sample values does not reach a predetermined number, the wave separating means 2208 adds "0" to the last of the waveform so as to obtain the predetermined number of sample values. For example, when the number of sample values taken from the current values within a voltage period is preset to 200, but there are only 199 samples of current values at a point, "0" is added to the next to the last current value to sum up the number of sample values to 200.

On the other hand, if the number of sample values is beyond a predetermined number, the wave separating means 2208 discards the excess sample values to reduce them to the predetermined number. For example, when the number of sample values taken from the current values within a voltage period is preset to 200, but there are 201 samples of current values at a point, the last current value is discarded to reduce the number of sample values to 200.

The waveform smoothing means 2209 reads a plurality of current sub-waveforms obtained by separating a waveform using the wave separating means 2208 and convolutes them to smooth the waveform. Convolution is to match the sub-waveforms in accordance with time and take an average of them. Given that the values of samples within a voltage period with respect to time A are 1, 2, 3, 4 in time order, while the values of samples within a voltage period with respect to time B are 5, 6, 7, 8 in time order, for example, the current values at time A and the current values at time B are convoluted by calculations of (1+5)÷2, (2+6)÷2, (3+7)÷2 and (4+8)÷2, and the convoluted current values result in 3, 4, 5, 6 in time order.

The feature-quantity calculation means 2210 calculates feature quantities 2210a by using a predetermined arithmetic expression from the smoothed waveform obtained by the waveform smoothing means 2209. The feature quantity 2210a is a vector. As the predetermined arithmetic expression in Embodiment 9, wavelet transform and binarization are used. The smoothed current waveform is subjected to the wavelet transform to obtain a wavelet coefficient. The obtained wavelet coefficient is binarized with a predetermined threshold. Note that, when a plurality of apparatuses are connected to the feeder line 2140, the results of the feature quantity calculation by the feature-quantity calculation means 2210 includes feature quantities 2210a of the respective apparatuses.

The apparatus state database 2230 stores at least one reference apparatus entry 2231. The reference apparatus entry 2231 holds a set of apparatus feature quantity 2231a and apparatus state 2231b of an apparatus. The apparatus feature quantity 2231a represents a feature quantity detected as current variations when the apparatus is in a state indicated by the apparatus state 2231b. The apparatus state 2231b may be an ON/OFF state of the apparatus, an apparatus's mode, an age deterioration condition of the apparatus and so on. In the case of an air-conditioner, the apparatus's mode may be "cool", "heat", "fan" and so on. The deterioration condition of the apparatus may be, for example, "power-supply damage", "wiring failure" and so on.

Since each apparatus state 2231b has a distinctive feature which presents itself in the form of current flowing in the feeder line 2140, the apparatus feature quantity 2231a and apparatus state 2231b are grouped and stored in an apparatus state database 2230. For example, a wiring failure causes an apparatus to produce a distinct feature quantity which is different from the regular situation. The apparatus state 2231b and apparatus state 2231b indicating the wiring failure are paired up and stored as a reference apparatus entry 2231.

The apparatus-state detection means 2220 compares the feature quantity obtained as a result of calculation by the feature-quantity calculation means 2210 with all reference apparatus entries 2231 in the apparatus state database 2230 to identify a reference apparatus entry 2231 having the apparatus feature quantity 2231a that matches (agrees with or is similar to (an agreement degree of a predetermined value or more)) the feature quantity 2210a calculated by the feature-quantity calculation means 2210. In short, it is determined whether a feature quantity 2210a matching the apparatus feature quantity 2231a in each reference apparatus entry 2231 is included in the feature quantity calculation results. If it is determined the feature quantity 2210a is included, it can be determined that the apparatus that is in the apparatus state in the reference apparatus entry 2231 is connected to the feeder line 2140, and then the reference apparatus entry 2231 is stored in the storage means 2212 as a matched reference-apparatus entry 2221.

The apparatus-state information creating means 2240 creates apparatus state information based on the retrieved matched reference-apparatus entry 2221 and outputs it to the output device 2250.

The output device 2250 displays the apparatus state information from the apparatus-state information creating means 2240 and includes means for displaying the information on a screen, such as a liquid crystal display and a TV output.

Figure 17:
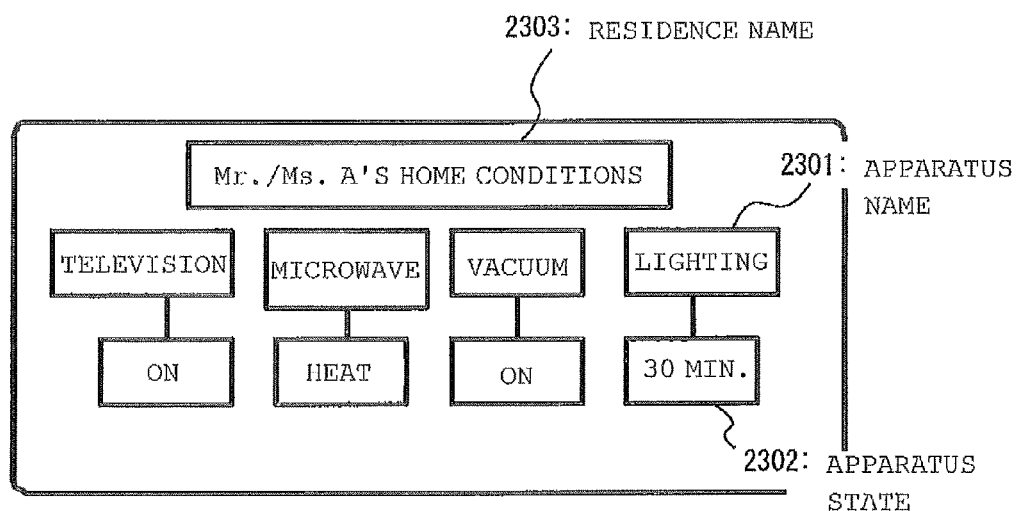
FIG. 17 illustrates exemplary resultant contents displayed on an output device 2250 in FIG. 16.

The FIG. 17 illustrates an example of a screen image of the results displayed on the output device 2250.

The output device 2250 displays a residence name 2303, apparatus names 2301 and apparatus states 2302 so that the user can clearly understand the relationship between the apparatus names 2301 and apparatus states 2302, such as an "ON" state and "OFF" state, modes and duration of the ON state. This image is just an example, and the components including the apparatus name 2301, apparatus states 2302, and residence name 2303 do not need to be arranged like those in FIG. 17. In addition, the output screen in FIG. 17 may display only a part of each component.

The AD converting means 2207, wave separating means 2208, waveform smoothing means 2209, feature-quantity calculation means 2210, apparatus-state detection means 2220 and apparatus-state information creating means 2240 can be implemented by hardware such as a circuit device having their functions or by software run on an arithmetic unit such as a microcomputer and CPU. A storage device or storage devices, such as a memory, are provided on an as needed basis or can be shared among the means.

The apparatus state database 2230 can be established by storing reference apparatus entries 2231 in a storage device such as a memory and HOD (Hard Disk Drive) in advance. The apparatus state database 2230 can be provided external to each means. Alternatively, the apparatus state database 2230 can be a data server at a remote location.

The storage means 2212 may be a rewritable storage device such as a memory, HDD (Hard Disk Drive) and flash memory.

The feature quantity 2210a, matched reference-apparatus entry 2221 and reference apparatus entry 2231 may be data stored in the storage means 2212.

Figure 18:
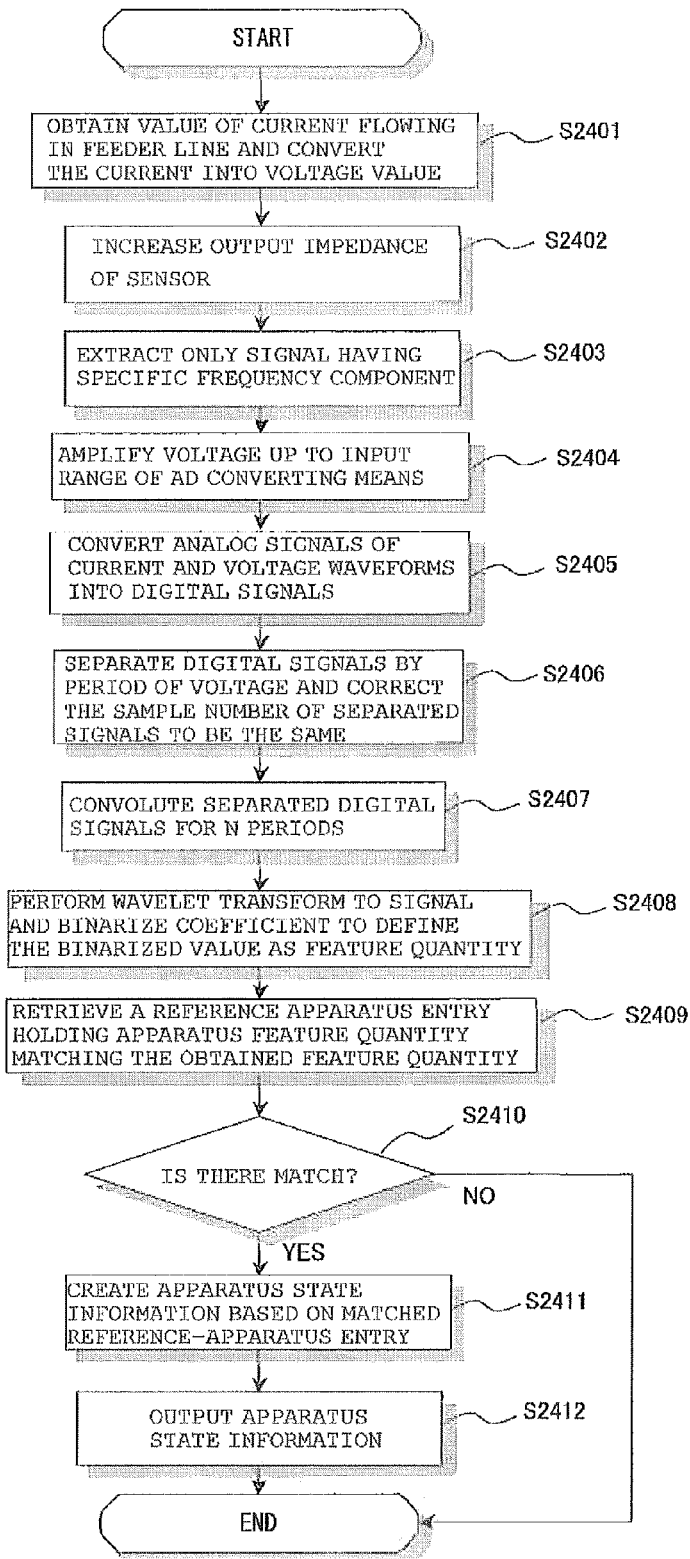
FIG. 18 illustrates an operation flow of the apparatus state detector 2000, according to Embodiment 9, detecting an apparatus.

FIG. 18 is a flow when the apparatus state detector 2000 detects a state of an apparatus. The following are descriptions of each step. In the descriptions is provided an example of a television 2130 with its power source turned ON.

FIG. 19 depicts current 2502 that flows through a feeder line 2140 when the television 2130 is turned on and voltage 2501 in the feeder line 2140 at that time. In FIG. 19, the horizontal axis indicates time, the vertical axis on the right indicates voltage [V], and the vertical axis on the left indicates current [A].

The television 2130 has a current 2502 unique to the television as shown in FIG. 19. Such a distinct waveform repeats itself for each period of the voltage 2501 as described above.

(S2401)

The current/voltage converting means 2203 converts the values of current, which is detected by the current sensor 2202 and is flowing through the feeder line 2140, into voltage values. The current values detected by the current sensor 2202 include a TV-specific current 2520 generated by turning on the television 2130.

(S2402)

The impedance boosting means 2204 increases impedance on the current sensor 2202 side.

(S2403)

The wave filter means 2205 extracts only specific frequency components from the current waveform amplified by the impedance boosting means 2204.

Figure 20:
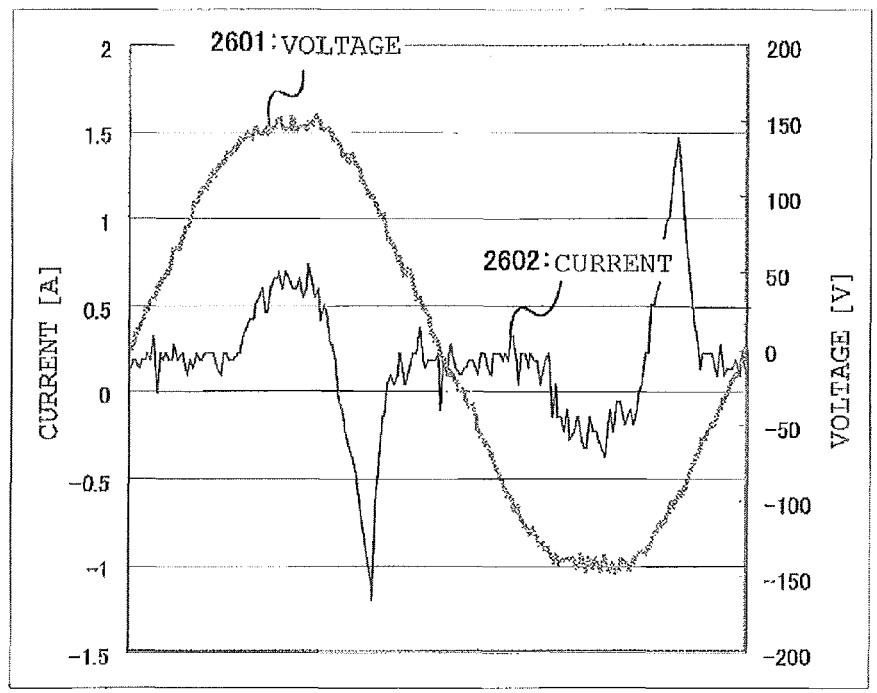
FIG. 20 depicts an example in which the current values in FIG. 19 are filtered by a wave filter means.

FIG. 20 depicts a current 2602, of the television 2130, having the specific frequencies extracted by the wave filter means 2205 and the voltage 2601 in the feeder line 2140 at that time. In FIG. 20, the horizontal axis indicates time, the vertical axis on the right indicates voltage [V], and the vertical axis on the left indicates current [A]. In this description, an example is shown in which the current passes through a primary high-pass linear filter with a cut-off frequency of 500 Hz.

Only the current in a high frequency band is extracted from the current 2502, shown in FIG. 19, before having passed through the wave filter means 2205. Since low-frequency components with relatively large power are removed, only harmonic components are outstanding as shown in the waveform of the current 2602, in FIG. 20, which has passed the wave filter means 2205. In any kind of apparatuses, the current components having the same frequency, i.e., 50 Hz and 60 Hz, as that of voltage, have the highest power. For this reason, if the current is converted from AC to DC by the AD converting means 2207 in the following process with these components left in the waveform, the resolution of the harmonic components is reduced. Therefore, removal of the low-band frequency components and extraction of harmonic components by the wave filter means 2205 improve the resolution in the AD conversion.

(S2404)

The wave amplifying means 2206 amplifies the voltage values of the current waveform including only specific frequency components, which passed through the wave filter means 2205, up to the input range of the AD converting means 2207.

(S2405)

The AD converting means 2207 converts the voltage values, which were transformed by the voltage sensor 2201, in the feeder line 2140 and the amplified voltage values of the current waveform from an analog value to a digital value, and stores the converted values in the storage means 2212.

(S2406)

The wave separating means 2208 separates the current waveform digitized for each period of the voltage and adjusts the number of sample values of the separated signal so as to always maintain it to the predetermined number. This adjustment process has been already described above.

(S2407)

The waveform smoothing means 2209 convolutes the separated current waveforms for L periods, each waveform including the same number of samples. This convolution process has been also described above in detail.

Figure 21:
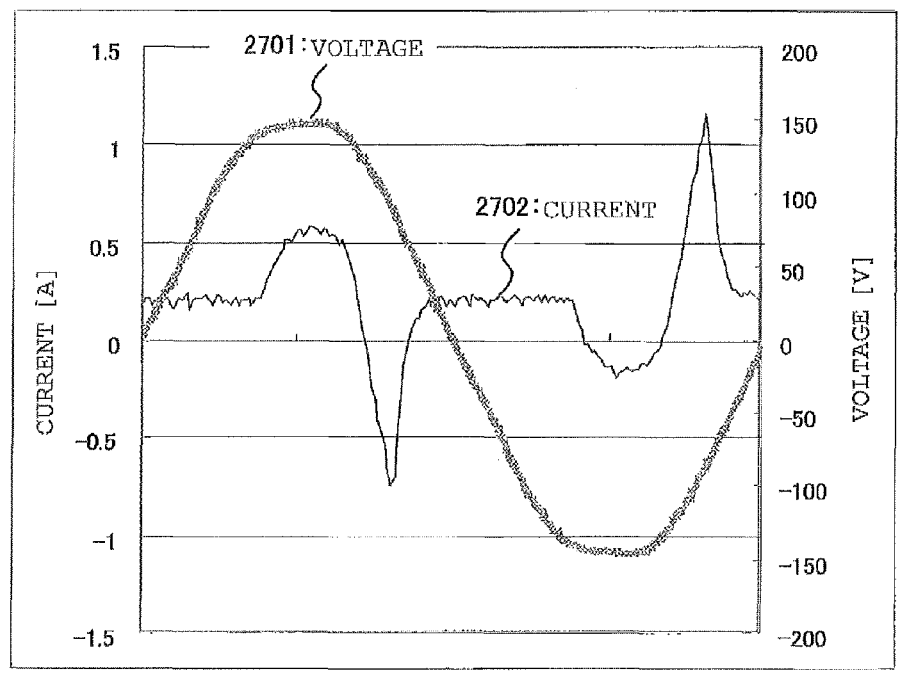
FIG. 21 depicts an example in which the filtered current values are smoothed by a waveform smoothing means.

FIG. 21 depicts the current 2702, of the television 2130, whose waveform is smoothed by the waveform smoothing means 2209 and voltage 2701 in the feeder line at that time. In FIG. 21, the horizontal axis indicates time, the vertical axis on the right indicates voltage [V], and the vertical axis on the left indicates current [A].

The waveform convolution effect provided by the waveform smoothing means 2209 cancels the wave components without reproducibility for each voltage period. As shown in the current 2702 of FIG. 21, environmental noise is removed from the current 2602 before having passed through the waveform smoothing means 2209 in FIG. 20.

Since harmonic components in current are very small, they are apt to be buried in environmental noise and, therefore, are difficult to be accurately measured. In order to separate the harmonic components, which repeatedly appear for each the same period as the voltage period, from the environmental noise applied on a temporally random basis, convolution of the waveform for each voltage period is effective in reducing the power of the environmental noise without fail. The waveform smoothing means 2209 performs the convolution process from a few times to a few hundred times to remove environmental noise.

(S2408)

The feature-quantity calculation means 2210 performs Wavelet transform to the convoluted current waveform to obtain a coefficient and binarizes the coefficient using a plurality of predetermined thresholds to define the binary value as a feature quantity 2210a.

Figure 22:
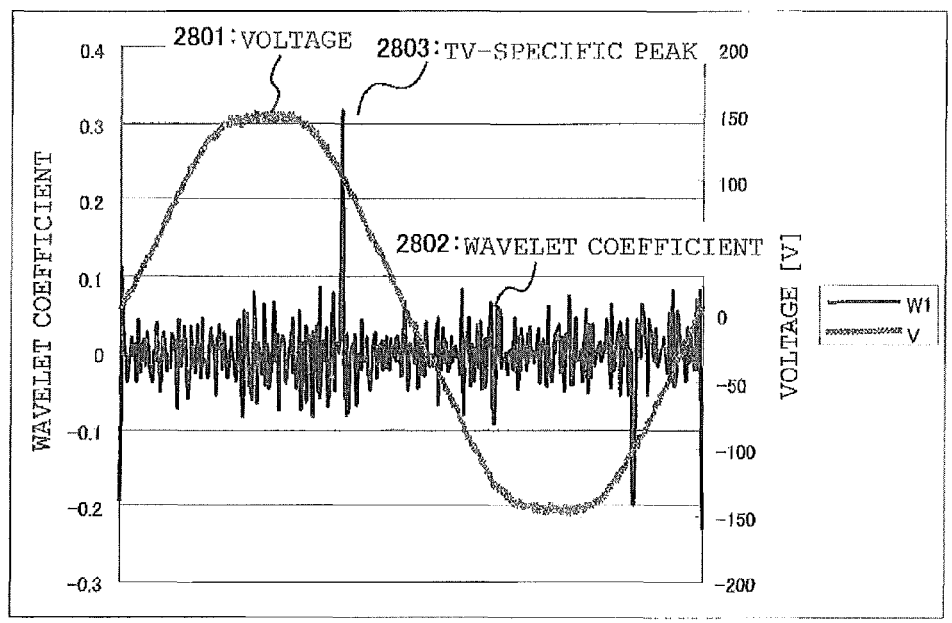
FIG. 22 depicts an example in which the current values, which were smoothed in FIG. 21, are subjected to wavelet transform.

FIG. 22 depicts the wavelet coefficients 2802 obtained by performing the Wavelet transform to the current waveform of the television 2130 by the feature-quantity calculation means 2210 and the voltage 2801 in the feeder line 2140 at that time. FIG. 22 shows only single-level wavelet coefficients as an example. The wavelet coefficients have a TV-specific peak 2803 at a TV-specific position. Since the position of the specific peak differs according to apparatuses, it is possible to detect what kind of apparatus is in operation by observing the position of the peak.

When a plurality of apparatuses are concurrently operating, peaks unique to each apparatus are observed. The feature-quantity calculation means 2210 can make the peak width very small by performing the wavelet transform, which reduces the possibility that peaks of apparatuses appear at the same position and therefore reduces errors in detecting apparatuses. The transformation method used to calculate feature quantities is not limited to the wavelet transform; however, the wavelet transform is effective means to detect peak generation time in a voltage period to obtain the feature quantity as in the case of Embodiment 9 because the wavelet transform has a feature of leaving time-domain information. In addition, the wavelet transform has an advantage over the other transformation (e.g., Fourier transform), in that there is a reduction of computational complexity, and therefore can be performed on a small microcomputer.

Figure 23:
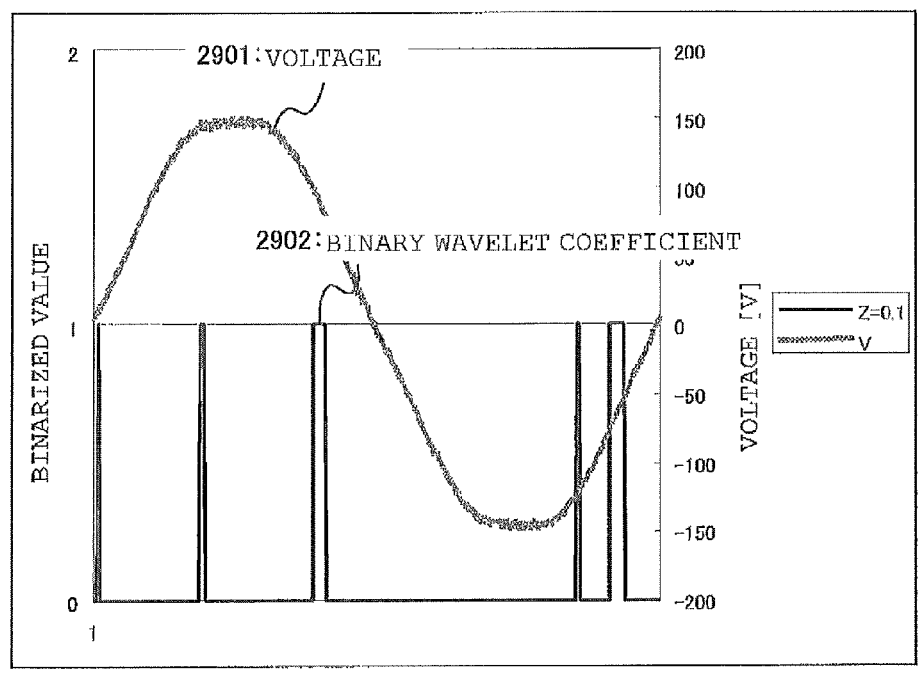
FIG. 23 depicts feature quantities calculated from the results of wavelet transform in FIG. 22.

FIG. 23 depicts the wavelet coefficients 2902 of the television 2130 binarized by the feature-quantity calculation means 2210 and the voltage 2901 in the feeder line at that time. The horizontal axis indicates time, the vertical axis on the right indicates voltage [V], and the vertical axis on the left indicates binary values of the wavelet coefficients 2902. The wavelet coefficients binarized with a threshold of 0.1 are shown as an example. With respect to the time axis, the positions where a TV-specific peak is seen have a value of "1", while the positions without the TV-specific peak have a value of "0". Since the wavelet coefficient values fluctuate, the fluctuating wavelet coefficients may cause detection errors and therefore are not appropriate for use for matching determination with the reference apparatus entry 2231. However, the binarized wavelet coefficients 2902 in FIG. 23 are less affected by error fluctuations and can be used to perform stable matching.

The feature quantity 2210a represented with the binarized wavelet coefficients includes the number of peaks and the interval of time between the peaks. Binarization of the feature quantity can significantly reduce the data volume of the apparatus feature quantity 2231a registered in the apparatus state database 2230. In other words, compared with a case where the measure values are registered as feature quantity 2210a, the data volume can be decreased by a large degree. FIG. 23 indicates only the feature quantity obtained by calculation based on the current waveform of the television 2130; however, when another apparatus among various kinds of apparatuses connected to the feeder line 2140 is concurrently working with the television, peaks of both apparatuses are to be presented. However, a feature quantity 2210a (peak number and time interval between peaks) is unique to an apparatus and does not coincide with the feature quantities of the other kinds of apparatuses or the feature quantities of the other states, and therefore, the feature quantity 2210a can be distinguished. In the case where various apparatuses are connected to the feeder line 2140 as described above, the feature-quantity calculation means 2210 obtains calculation results including a plurality of different feature quantities 2210a.

(S2409), (S2410)

The apparatus-state detection means 2220 checks the feature quantity calculation results obtained by the feature-quantity calculation means 2210 against the reference apparatus entries 2231 in the apparatus state database 2230 to retrieve the state of each apparatus connected to the feeder line 2140.

Figure 24:
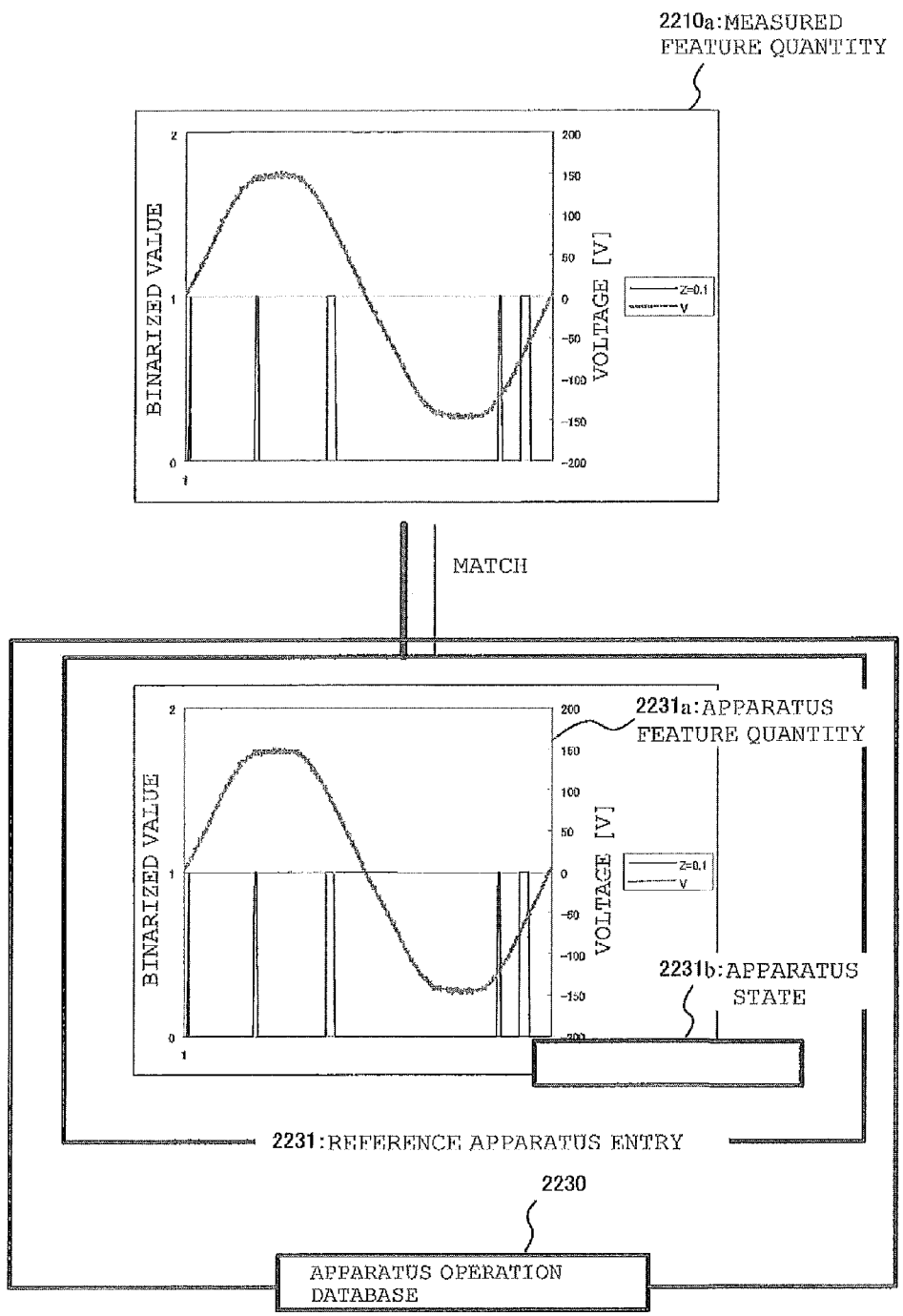
FIG. 24 illustrates operations for retrieving an apparatus entry that matches a measured feature quantity from the apparatus state database.

More specifically, the apparatus-state detection means 2220 sequentially searches the apparatus state database 2230 for a reference apparatus entry 2231 holding the apparatus feature quantity 2231a that matches or is similar to an apparatus feature quantity in the feature quantity calculation results. If a matched apparatus feature quantity is included in the database, the apparatus-state detection means 2220 extracts the reference apparatus entry 2231 holding the apparatus feature quantity as a matched reference entry, and goes to step (S2411). FIG. 24 is a schematic diagram of the search operation. FIG. 24 shows an example in which the television 2130 is turned on.

A representative example of the calculation method to determine whether a measured feature quantity 2210a matches an apparatus feature quantity 2231a will be described. The apparatus feature quantity 2231a is a time series vector with binary elements "0" and "1". The apparatus-state detection means 2220 checks whether the measured feature quantity has "1" at a position where the apparatus feature quantity 2231a has "1" and then calculates the percentage (score) of positions where the measured feature quantity has "1". If the score is 50% or more, for example, it is determined that the measured feature quantity 2210a matches an apparatus feature quantity 2231a. In the case where a plurality of apparatuses are connected to the feeder line 2140, the feature-quantity calculation results include a plurality of different feature quantities 2210a, and therefore, there are a plurality of reference apparatus entries 2231 to be matched therewith. Thus, all of the matched reference apparatus entries 2231 are stored as matched reference apparatus entries 2221 in the storage means 2212.

If there is no match found as a result of the search, the process is terminated. The expression "if there is no match found" means that, in the feature-quantity calculation results obtained by the feature-quantity calculation means 2210, there is no feature quantity 2210a matching or similar to an apparatus feature quantity 2231a in a reference apparatus entry 2231 registered in the apparatus state database 2230. This case occurs when a new apparatus which has not been registered in the reference apparatus entry 2231, is turned on. Since the reference apparatus entry 2231 associated with the feature quantity 2210a of the new non-registered apparatus does not exist when the apparatus is turned on, estimation errors, for example, misidentification of apparatuses in an ON-state can be prevented, thereby enabling highly accurate detection of the operation state of apparatuses.

(S2411)

The apparatus-state information creating means 2240 creates apparatus state information based on the matched reference-apparatus entry 2221 which is a search result.

(S2412)

The output device 2250 outputs the apparatus state information to, for example, a display screen as shown in FIG. 17.

According to Embodiment 9, a feature quantity 2210a of an apparatus connected to a feeder line 2140 is calculated from current flowing through the feeder line 2140, and the feature quantity 2210a is compared with reference apparatus entries 2231 previously stored in an apparatus state database 2230 to identify the state of the apparatus. With this structure, the only thing to do is to register apparatus feature quantities 2231a associated with respective apparatus states 2231b in the apparatus state database 2230, which eliminates the necessity to take combinations of all apparatuses at home into account as needed in conventional art and therefore reduces time and effort to learn combinations of the operation states of all apparatuses. In comparison with conventional detection apparatuses that require registered data of all apparatuses' combinations, the detector in Embodiment 9 needs the significantly smaller amount of registered data (i.e., the number of reference apparatus entries), and therefore requires only a small amount of calculation complexity to search the apparatus state database 2230 for the feature quantity 2210a. Thus, microcomputers do not need to have a great capability, and an even a small microcomputer can be used.

In addition, since the apparatus state database 2230 is clearly separated from feature quantity calculation, registration of new apparatuses by updating the apparatus state database 2230 and deletion of wrong reference apparatus entries 2231 can be readily made. The apparatus state database 2230 can be updated by downloading data from a server connected to the Internet, thereby keeping the apparatus entries up to date.

Even if a new unknown apparatus starts working, misidentifying other apparatuses as the new one can be prevented because the feature quantity of the new apparatus has not been yet registered in the apparatus state database 2230.

Although the output device 2250 is display means in Embodiment 9, the output device is not limited thereto and can be data output means. More specifically, the output device 2250 can be, for example, means that is connected to an SMTP server through the Internet to output apparatus state information, which is search results obtained by the apparatus-state detection means 2220, to a designated mail address. In this case, the apparatus state information is transmitted at a constant time interval. In addition, the data output means includes a radio communication device, an infrared-ray communication device, Ethernet (trademark) and a wire communication device such as RS-232C. The apparatus state information to be transmitted may include information of all new apparatus states that has been obtained after the most recent transmitted mail to the present or information of only the latest apparatus state. Moreover, the information can be transmitted to a central server that centrally controls the entire town via a home gateway using a small wireless communication device. The output screen shown in FIG. 17 may be a screen on a central control terminal in the central server.

Embodiment 10

Embodiment 10 of the present invention relates to a preferred technique for a plurality of feeder lines in a building. With the widespread use of the all-electric systems, installation of single-phase three wires of 220 V is currently on its way to becoming mainstream for ordinary residence. In such a circumstance, there are many cases where a residence owns more than one feeder line. In addition, factories generally own a plurality of feeder lines. Embodiment 10 has been made to comprehensively detect the states of apparatuses connected to two feeder lines.

Figure 25:
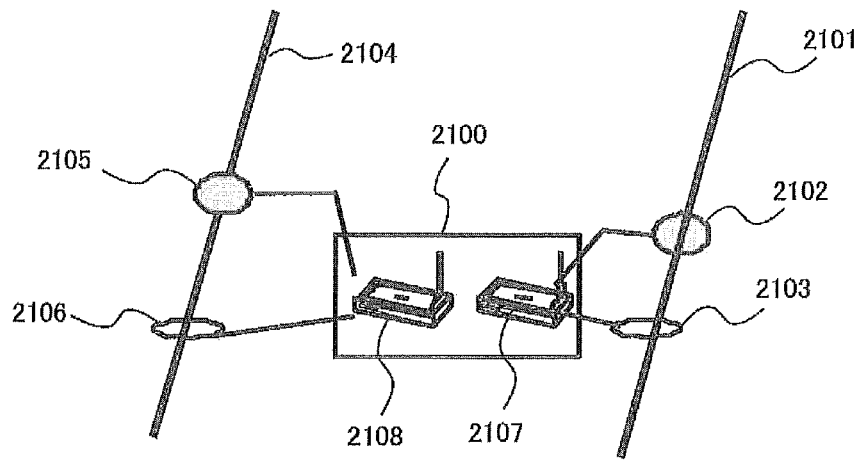
FIG. 25 is a schematic diagram showing a simply-illustrated structure of an apparatus state detection server 2100 of Embodiment 10.

FIG. 25 is a schematic diagram showing a simply-depicted structure of an apparatus state detection server 2100 according to Embodiment 10.

The apparatus state detection server 2100 includes an apparatus state detector 2107, which is connected to a voltage sensor 2103 and voltage sensor 2102 both connected to the feeder line 2101 and an apparatus state detector 2108, which is connected to a voltage sensor 2105 and a current sensor 2106. The apparatus state detectors 2107, 2108 are almost identical in structure to the detector shown in Embodiment 9. The apparatus state detector 2107 detects the state of apparatuses connected to the feeder line 2101, while the apparatus state detector 2108 detects the state of apparatuses connected to the feeder line 2104. Although two apparatus state detectors are shown as an example, the apparatus state detection server 2100, of course, can include more than two apparatus state detectors.

Figure 26:
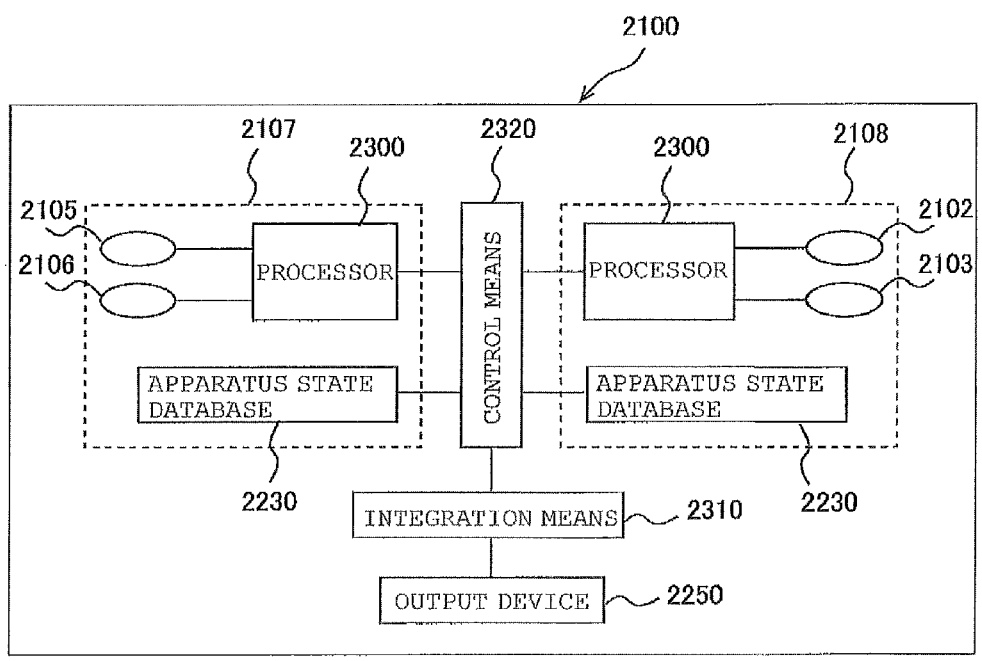
FIG. 26 is a functional block diagram showing a structure of the apparatus state detection server 2100 in FIG. 25.

FIG. 26 is a functional block diagram showing the structure of the apparatus state detection server 2100. In FIG. 26 like components are denoted by like numerals as of FIG. 16 and will not be further explained.

The apparatus state detection server 2100 includes an apparatus state detector 2107, an apparatus state detector 2108, an integration means 2310 that integrates the apparatus states obtained by the respective apparatus state detectors 2107, 2108, an output device 2250 that outputs the result of integration, and a control means 2320 that controls the entire apparatus state detection server 2100. The output devices 2250 can be provided to each of the apparatus state detectors 2107 and 2108 in the apparatus state detection server 2100 as described in Embodiment 9; however, since the apparatus state detection server 2100 can function well, even with a single output device 2250, the apparatus state detection server 2100 in Embodiment 10 has apparatus state detectors 2107, 2108 with the output devices 2250 removed therefrom.

The integration means 2310 assigns an ID to apparatus information. An ID indicating the apparatus state detector 2107 is assigned to apparatus information retrieved by the apparatus state detector 2107, while an ID indicating the apparatus state detector 2108 is assigned to apparatus information retrieved by the apparatus state detector 2108. These IDs are grouped into one and stored as a set of apparatus state information.

The apparatus state detection server 2100 simultaneously detects the state of the apparatuses connected to the feeder lines 2101 and 1104 through the apparatus state detectors 2107, 2108 connected to the feeder lines 2101 and 1104, respectively, integrates the respective apparatus information sets through the integration means 2310 and outputs them at the same time through the single output device 2250. Consequently, even if a television and microwave are connected to the feeder line 2101 and a vacuum and lighting are connected to the feeder line 2104, for example, the states of the apparatuses can be displayed all together on a display screen as shown in FIG. 17.

Since 220V apparatuses, for example, an induction cooker is connected across the feeder lines 2101 and 2104, both the apparatus state detectors 2107 and 2108 detect the states of the apparatus resulting in possible redundancy. The apparatus state detection server 2100 uses the redundant information about the apparatus state to improve reliability of the apparatus state information. Specifically, for example, information that an induction cooker is designed to be detected from both the feeder line 2101 side and feeder line 2104 side is further added to a reference apparatus entry 2231 in advance, and if the induction cooker is detected by one of the apparatus state detectors 2107 and 2108, but not by the other, it is determined that the detection is wrong.

Embodiment 11

Embodiment 11 of the present invention relates to a preferred technique of remotely monitoring the states of all apparatuses installed in a plurality of buildings or rooms.

Figure 27:
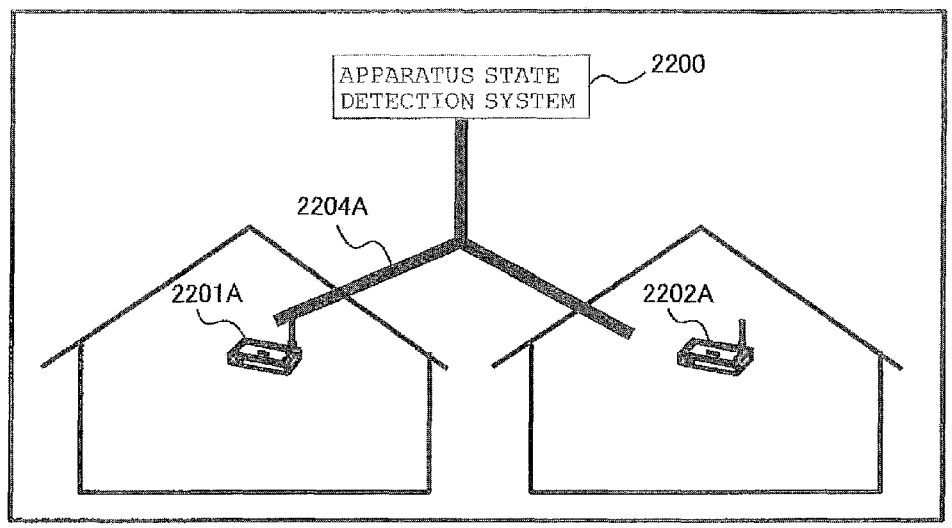
FIG. 27 illustrates an application of an apparatus state detection system 2200 of Embodiment 11.

FIG. 27 illustrates an application of the apparatus state detection system 2200 of Embodiment 11.

The apparatus state detection system 2200 is connected through a network 2204A to the apparatus state detectors 2201A, 2202A which have the same structure as that in Embodiment 9. The network 2204A may be a private line, telephone line, the Internet or the like. The apparatus state detectors 2201A, 2202A are separately installed in different buildings, different rooms or on different floors, and the apparatus state detection system 2200 is installed at a remote location from the installation sites of the apparatus state detectors 2201A, 2202A, for example. The apparatus state detection system 2200 receives the apparatus state information obtained by the apparatus state detectors 2201A, 2202A through the network 2204A to monitor the states of the apparatus in the buildings or rooms where the installation sites of the apparatus state detectors 2201A, 2202A are, and possibly renders new services, such as advice for energy conservation, based on the monitoring results.

The apparatus state detectors 2201A, 2202A and apparatus state detection system 2200 are designed so as to transmit/receive email through the network 2204A. The apparatus state detectors 2201A, 2202A transmit email to the apparatus state detection system 2200 to report the detection results of the apparatus state in real time. In addition, the apparatus state detectors 2201A, 2202A transmit the apparatus state information assigned with an ID for identifying the transmitter and time at which the apparatus state was detected.

Figure 28:
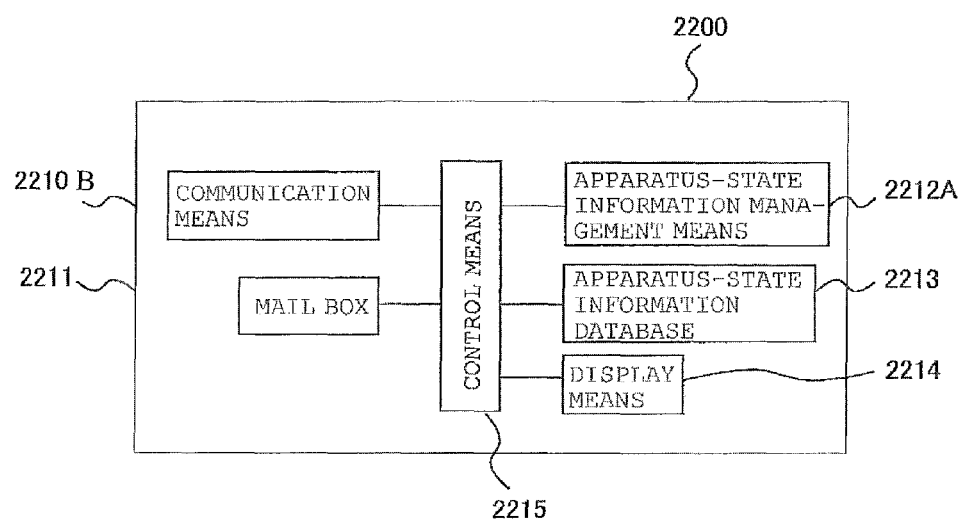
FIG. 28 is a functional block diagram showing a structure of the apparatus state detection system 2200 in FIG. 27.

FIG. 28 is a functional block diagram showing a structure of the apparatus state detection system 2200.

The apparatus state detection system 2200 includes communication means 2210B that establishes communication with the apparatus state detectors 2201A, 2202A through the network 2204A, a mail box 2211 that accumulates mail transmitted from the apparatus state detectors 2201A, 2202A, apparatus-state information management means 2212A that manages the states of apparatuses at the installation site of the apparatus state detectors 2201A, 2202A as apparatus state information based on the accumulated mail in the mail box 2211, an apparatus-state information database 2213 populated with apparatus state information, display means 2214 that displays the management results and control means 2215 that controls the entire apparatus state detection system 2200. The information managed by the apparatus-state information database 2213 is not only displayed as management results on the display means 2214, but also used as information for providing various services. The apparatus state detection system 2200 include a not-shown microcomputer (hereinafter, referred to as "MICOM"). The control means 2215 and apparatus-state information management means 2212A are implemented bases on predetermined arithmetic programs stored in a CPU and internal memory in the MICOM.

The apparatus state detection system 2200 receives mail transmitted from the apparatus state detectors 2201A, 2202A at a constant interval via the communication means 2210B and accumulates it in the mail box 2211. The method for reporting the apparatus state detection result from the apparatus state detectors 2201A, 2202A is not limited to mail, and if possible, the apparatus state detection system 2200 can directly communicate with the apparatus state detector 2201A.

Exchange of information between apparatus state detection system 2200 and apparatus state detectors 2201A, 2202A via mail can avoid the problem of increased communication load caused by an increase in traffic over the network 2204A when a huge number of apparatus state detectors are connected to the network 2204A. In other words, the apparatus state detection system 2200 can reduce communication loads more than another system that establishes a session to start communication between the apparatus state detectors 2201A, 2202A and the apparatus state detection system 2200.

Since a firewall is generally implemented in the network in an ordinary home, the use of a dedicated port for communication requires setting changes, which brings complexity. However, the mail communication that uses a very general protocol and port can eliminate such complexity.

The above-described apparatus state detection system 2200 with the apparatus state detectors 2201A, 2202A each installed at different residences can comprehensively manage the states of the apparatuses in the residences based on the apparatus-state information database 2213. This collective management enables provision of new services such as advice for energy conservation. The apparatus state detection system 2200 can detect, for example, an air-conditioner that has been left turned on or whose preset temperature is lower than necessary with respect to outside air temperature, and therefore, can give appropriate energy-conservation advice suitable to the situations.

Although the apparatus state detectors are connected to the network 2204A, the detectors can be replaced with the apparatus state detection server 2100 described in Embodiment 10. The apparatus state detection server 2100 can also obtain the same effect as described above.

Embodiment 12

Figure 29:
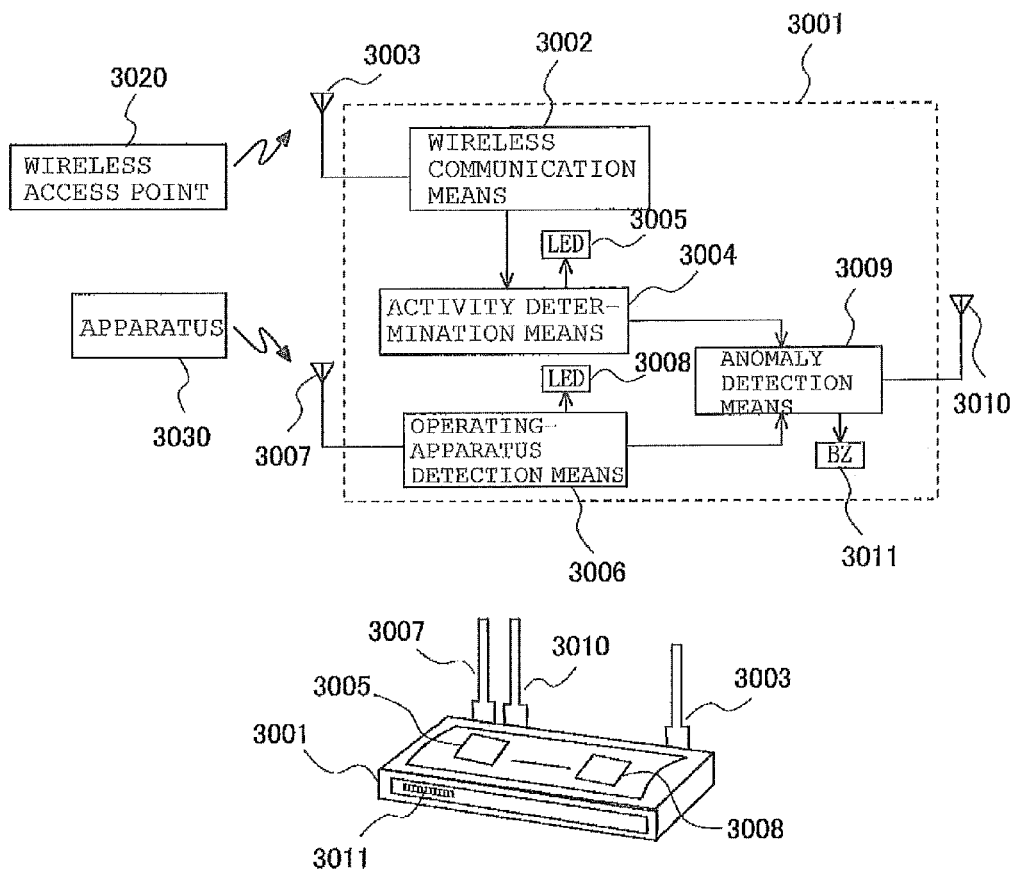
FIG. 29 includes a block diagram and an external perspective view showing a living persons' anomaly detector according to Embodiment 12 of the present invention.

FIG. 29 includes a block diagram and an external perspective view showing a living persons' anomaly detector according to Embodiment 12 of the present invention.

The living persons' anomaly detector 3001 of Embodiment 12 includes wireless communication means 3002 that receives radio waves from a wireless access point 3020 via an antenna 3003, activity determination means 3004, an LED indicator 3005 that lights up/lights out based on signals from the activity determination means 3004, operating-apparatus detection means 3006 that receives radio waves from various apparatuses 3030 via an antenna 3007, an LED indicator 3008 that lights up/lights out based on signals from the operating-apparatus detection means 3006, anomaly detection means 3009 that transmits control signals for controlling the apparatuses 3030 via an antenna 3010 and a warning buzzer 3011 that sounds based on the signals from the anomaly detection means 3009.

The wireless access point 3020 exists outside the living persons' anomaly detector 3001 and is a wireless communication device capable of transmitting radio waves of a specific frequency with a constant radio wave intensity, such as a wireless LAN router, cordless telephone, a laptop personal computer with a wireless LAN function and a communication device for controlling facilities. The wireless access point 3020 transmits radio waves for a certain period of time and on an intermittent basis.

The aforementioned wireless communication means 3002 includes a communication device that, when the communication means receives a radio wave (the same frequency) from the wireless access point 3020, measures the intensity of the radio wave, a CPU, a program that is executed by the CPU to serve as the wireless communication means 3002 when the communication device starts measuring, a ROM in which the program is stored, a RAM that temporarily stores data obtained by the execution by the CPU and some other components. Upon receipt of a radio wave from the wireless access point 3020 via the antenna 3003, this wireless communication means 3002 measures the intensity of the received radio wave for a certain period of time and stores the intensity data in the RAM. Then, the wireless communication means 3002 reads the radio wave intensities obtained for a predetermined period of time and calculates a variation value from the difference between the maximum value and the minimum value of the radio wave intensities. The variation value data is stored in the RAM with the receipt time. The certain period of time and predetermined period of time are stored in the ROM.

The activity determination means 3004 includes, for example, a CPU, a program that is executed by the CPU to serve as the activity determination means 3004 when the wireless communication means 3002 starts its operation, a ROM in which the program is stored, a RAM that temporarily stores data obtained by the execution by the CPU and some other components. This activity determination means 3004 reads the variation value of the radio wave intensities calculated by the wireless communication means 3002 and compares it with a preset threshold. If the variation value of the radio wave intensities is equal to or more than the threshold, it is determined that a person is performing activities, and if the variation value is lower than the threshold, it is determined that the person is not performing activities. Either one of the determination results is stored as activity information in the RAM. In addition, the LED indicator 3005 lights up with the determination that the person is performing activities, while the LED indicator 3005 lights out with the determination that the person is not performing activities. The aforementioned threshold is stored in the ROM.

The operating-apparatus detection means 3006 includes, for example, a communication device that receives the radio wave from an apparatus 3030 which is a target apparatus to be detected, a CPU, a program that is executed by the CPU to serve as the operating-apparatus detection means 3006 when the communication device receives a radio wave from the target apparatus 3030, a ROM in which the program is stored, a RAM that temporarily stores data obtained by the execution by the CPU and some other components. When the operating-apparatus detection means 3006 receives a radio wave from the target apparatus 3030 installed around the means 3006 via the antenna 3007, the operating-apparatus detection means 3006 acquires information about the operating state of the apparatus 3030 from the received radio wave and stores it as apparatus information in the RAM. In addition, the LED indicator 3008 lights up or lights out based on the apparatus information. For example, when the target apparatus 3030 is in operation, the LED indicator 3008 lights up, while the apparatus 3030 is not operating, the LED indicator 3008 lights out.

The aforementioned apparatus 3030 is, for example, a lighting device, a ventilation system, a sound system, an AV system, an induction cooker, an air-conditioner, a television, a dryer, toilet seats with water spray and so on. Each apparatus 3030 has a communication function to wirelessly report the ON/OFF state and operation state to the operating-apparatus detection means 3006. For example, if an air-conditioner is changed from "OFF" to "heating" by its remote controller, the operation state such as "air-conditioner, heating" is transmitted to the operating-apparatus detection means 3006.

The anomaly detection means 3009 includes, for example, a CPU, a program that is executed by the CPU to serve as the anomaly detection means 3009 when the activity determination means 3004 starts operating, a ROM in which the program is stored, a RAM that temporarily stores data obtained by the execution by the CPU, a communication device that wirelessly transmits control signals created by the CPU to the apparatus 3030. Having determined that a person is in the residence based on the activity information stored in the RAM of the activity determination means 3004, the anomaly detection means 3009 determines that there are no anomalies. Having confirmed that the person is not in the residence, the anomaly detection means 3009 determines whether the target apparatus 3030 is in operation or not based on the apparatus information stored in the RAM in the operating-apparatus detection means 3006. For example, when a lighting device stays on, an air-conditioner is working, and an induction cooker is in operation even though there is no person in a residence, the anomaly detection means 3009 activates the warning buzzer 3011, while transmitting control signals to the apparatuses 3030 so as to shut off the lighting device in the ON state, lower the power output of the air-conditioner and turn off the induction cooker.

Next, operations of the aforementioned living persons' anomaly detector will be described with reference to FIGS. 30 to 36.

Figure 30:
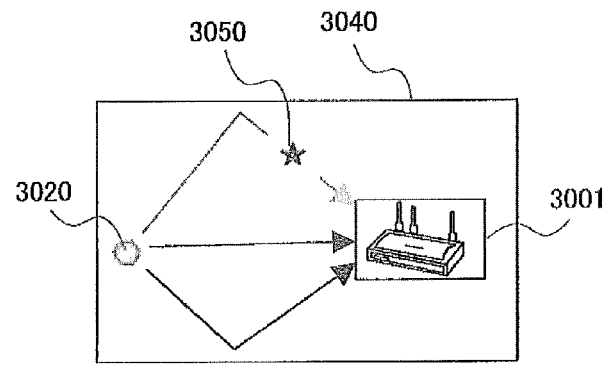
FIG. 30 is a schematic diagram showing paths of radio waves transmitted from a wireless access point to the living persons' anomaly detector.

First of all, a description will be made about the intensity of radio waves transmitted from the wireless access point 3020 to the living persons' anomaly detector 3001. FIG. 30 is a schematic diagram showing paths through which the radio waves pass from the wireless access point to the living persons' anomaly detector.

In the radio waves radiated by the wireless access point 3020, as shown in FIG. 30, some of them travel straight and some of them impinge on the floor, ceiling and walls of a room 3040 and are reflected, and all of them travel through various paths to reach the living persons' anomaly detector 3001. The radio waves that traveled along the different paths and have reached the living persons' anomaly detector 3001 are phase shifted because the lengths of the paths are different. The radio waves being out of phase with each other are received by the wireless communication means 3002. The different phase radio waves cancel each other and intensify each other.

In the case where an obstacle 3050 is in the room 3040, a radio wave impinges the obstacle 3050 and becomes weak; however, the intensity of the radio wave received by the wireless communication means 3002 is not always weakened, but largely fluctuates depending on the position of the obstacle 3050. Moving obstacle 3050 causes the intensity of the radio wave received by the wireless communication means 3002 to wildly fluctuate. For example, if the obstacle 3050 is a person living in the residence, the intensity of the received radio wave adequately fluctuates within a measurable range in response to even slight swings and vibrations accompanied with biological activities. Because of this, even a sleeping person can produce sufficient fluctuations in the intensity of the radio wave received by the wireless communication means 3002 and the intensity is measurable.

Figure 31:
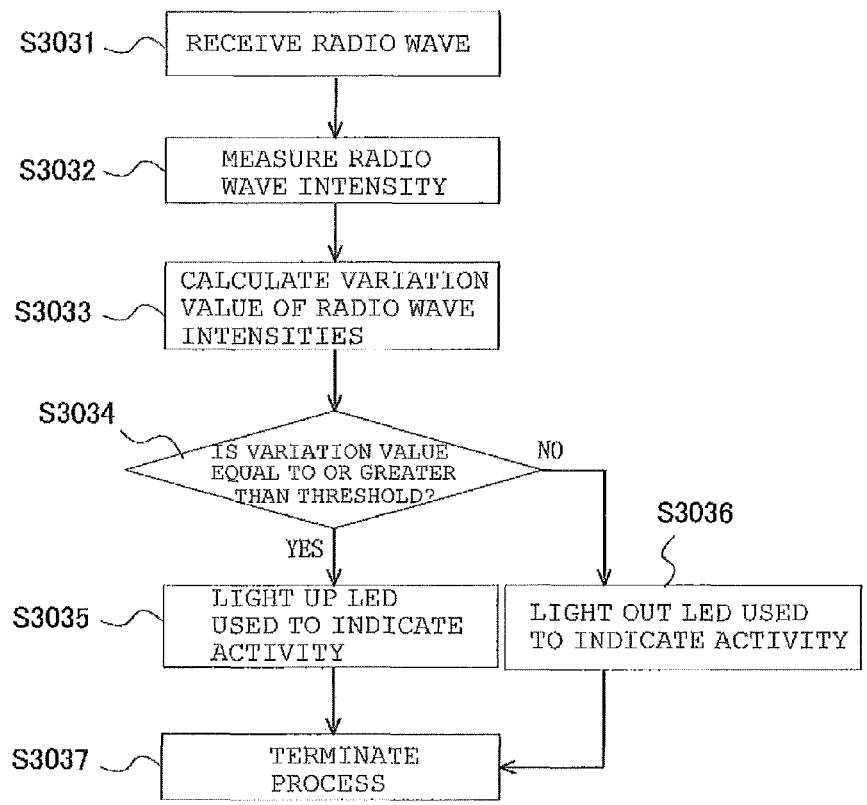
FIG. 31 is a flow chart showing operations of wireless communication means and activity determination means of the living persons' anomaly detector according to Embodiment 12.
Figure 32:
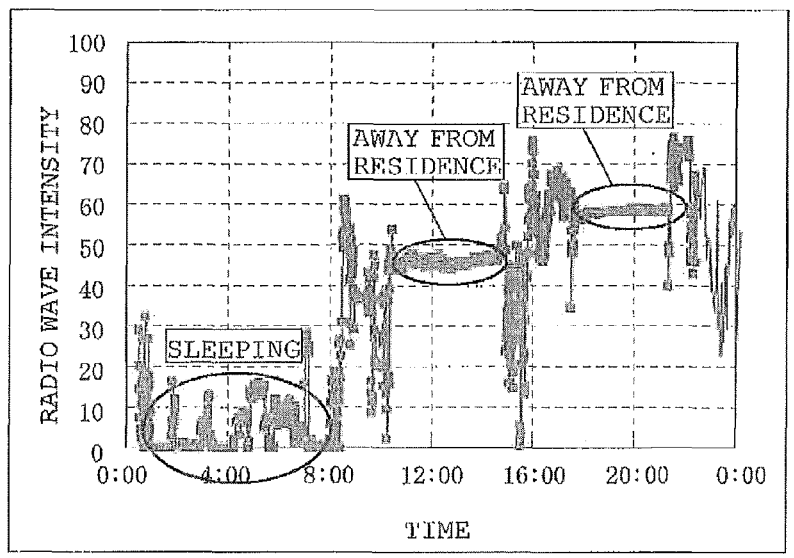
FIG. 32 illustrates the intensity of a received radio wave measured by the wireless communication means.

Next, operations of the wireless communication means and activity determination means will be described with reference to FIGS. 31 and 32. FIG. 31 is a flow chart showing the operations of the wireless communication means and activity determination means of the living persons' anomaly detector according to Embodiment 12, while FIG. 32 illustrates the intensity of the received radio wave measured by the wireless communication means. Note that the radio wave intensity in FIG. 32 becomes low toward 0 and becomes high toward 100, and the radio wave intensity in FIG. 32 is an exemplary plot obtained by a twenty-four hour measurement from 12:00 a.m. to 12:00 a.m. the following day.

The wireless communication means 3002 receives radio waves from the wireless access point 3020 via an antenna 3003 (S3031), measures the intensity of the received radio waves for a certain period of time (S3032), and stores the measured intensity data in the RAM. The radio wave intensity measured by the wireless communication means 3002 hardly changes during the time period that the person is out of the residence, but changes every moment during the time period that the person is in the residence as shown in FIG. 32. When the person is sleeping, the intensity of the received radio waves intermittently changes from moment to moment with the person's movements such as a rolling over.

When the wireless communication means 3002 finishes measuring the intensity of a received radio wave, it retrieves the radio wave intensities obtained for the certain period of time from the RAM to calculate a variation value of the radio wave intensity from the difference between the maximum value and minimum value of the radio wave intensities (S3033), and stores the variation value in the RAM with the receipt time of the radio wave. These operations are repeated every time a radio wave is transmitted from the wireless access point 3020.

After the variation value of the radio wave intensity has been calculated, the activity determination means 3004 reads out the variation value of the radio wave intensity stored in the RAM of the wireless communication means 3002 to compare it with a preset threshold (S3034). If the variation value is equal to or more than the threshold, the activity determination means 3004 determines that the person is performing activities and stores the determination result in the RAM as activity information. Then, the activity determination means 3004 lights up the LED indicator 3005 to explicitly inform the user of the determination that activities were found (S3035) and terminates the series of the aforementioned processes (S3037).

If the average value of the radio wave intensity is lower than the threshold, the activity determination means 3004 determines that the person is not performing activities and stores the determination result in the RAM as activity information. Then the activity determination means 3004 lights out the LED indicator 3005 to explicitly inform the user of the determination that no activities were found (S3036) and terminates the series of the aforementioned processes (S3037).

As described above, the presence of the person's activities is determined when the variation value of the received radio wave intensity is equal to or exceeds the predetermined threshold. This enables determination of the person's activities without being affected by changes in the position of objects such as the opening and closing of a door.

Next, operations of the operating-apparatus detection means will be described with reference to FIG. 33.

Figure 33:
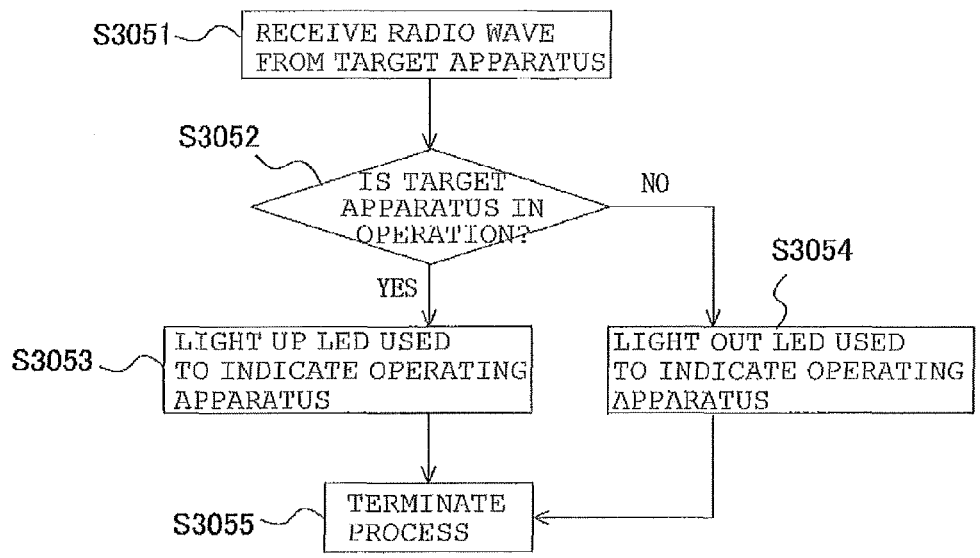
FIG. 33 is a flow chart showing operations of the operating-apparatus detection means of the living persons' anomaly detector according to Embodiment 12.

FIG. 33 is a flow chart showing the operations of the operating-apparatus detection means of the living persons' anomaly detector according to Embodiment 12.

Upon receiving a radio wave from an apparatus 3030 targeted for detection via an antenna 3007 (S3051), the operating-apparatus detection means 3006 extracts a state report indicating the operation state of the apparatus 3030 from the received radio wave and stores the state report in the RAM. Then, the operating-apparatus detection means 3006 determines whether the apparatus 3030 is in operation by referring the state report stored in the RAM (S3052). If it is determined that the apparatus 3030 is in operation from the state report, the operating-apparatus detection means 3006 stores the determination result in the RAM as apparatus information. Then, the operating-apparatus detection means 3006 lights up the LED indicator 3008 to explicitly inform the user that the apparatus 3030 is in operation (S3053) and terminates the series of the aforementioned processes (S3055).

If the operating-apparatus detection means 3006 determines that the apparatus 3030 is not operating from the state report, it stores the determination result in the RAM as apparatus information. Then, operating-apparatus detection means 3006 lights out the LED indicator 3008 to explicitly inform the user that the apparatus 3030 is not in operation (S3054) and terminates the series of the aforementioned processes (S3055).

As described above, the state of the apparatus 3030 at a physically remote location can be detected by receiving the state report from the target apparatus 3030.

Figure 34:
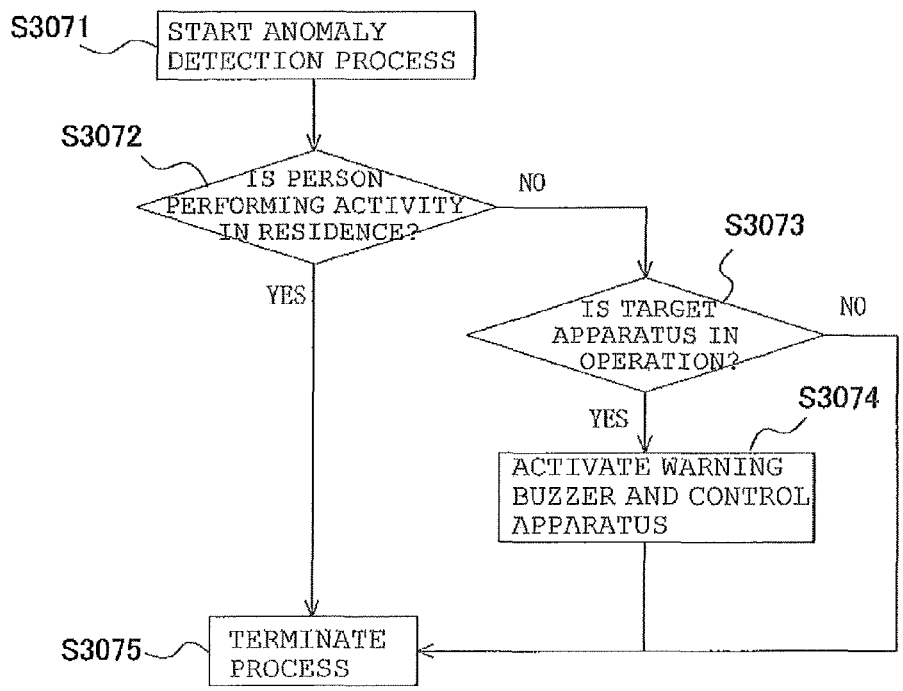
FIG. 34 is a flow chart showing operations of anomaly detection means of the living persons' anomaly detector according to Embodiment 12.

FIG. 34 is a flow chart showing operations of anomaly detection means of the living persons' anomaly detector according to Embodiment 12.

The anomaly detection means 3009 reads out the activity information of the person from the RAM of the activity determination means 3004 and starts a process for detecting anomalies (S3071). At first, the anomaly detection means 3009 determines whether the person is performing activities in the residence from the activity information (S3072). If the anomaly detection means 3009 determines that the person is performing activities from the activity information, it terminates the anomaly detecting process (S3075).

If the anomaly detection means 3009 determines that the person is not performing activities from the activity information, it reads out the apparatus information from the RAM of the operating-apparatus detection means 3006 to determine whether the target apparatus 3030 (e.g., television, air-conditioner, etc.) is in operation (S3073). If the anomaly detection means 3009 determines that the target apparatus 3030 is not in operation, it terminates the anomaly detecting process (S3075). On the other hand, if the anomaly detection means 3009 determines that the apparatus 3030 is in operation from the apparatus information while the person is not performing activities, it activates a warning buzzer, while transmitting a control signal to stop the operation or to lower power output to the target apparatus 3030 (S3074), and terminates the anomaly detecting processes (S3075).

The aforementioned series of processes is performed every time the activity determination means 3004 stores activity information in its RAM or the operating-apparatus detection means 3006 stores apparatus information in its RAM.

Figure 35:
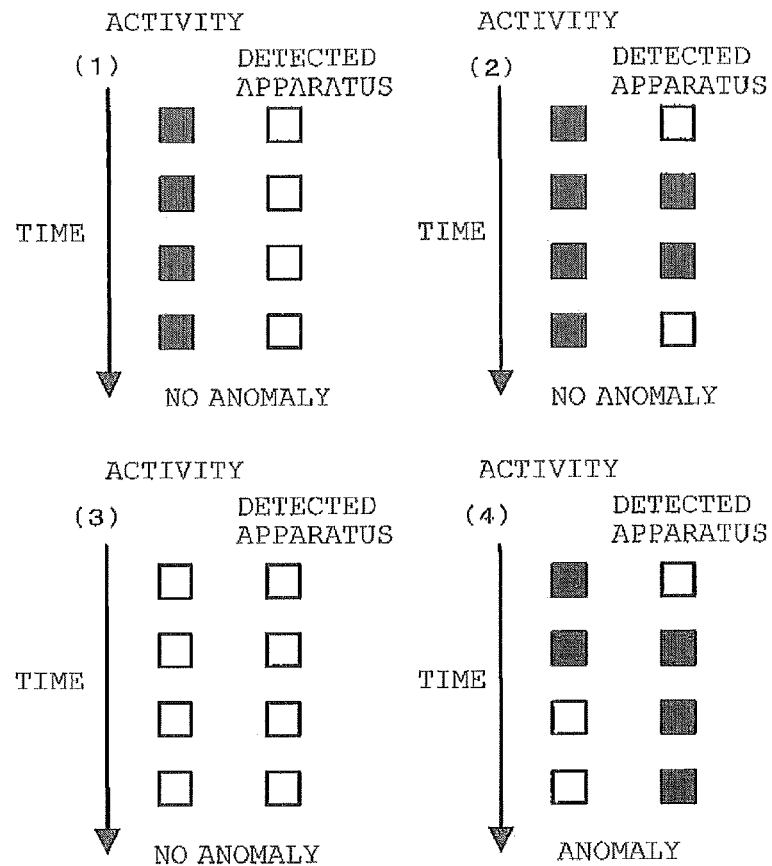
FIG. 35 illustrates an example of anomaly detection performed by the anomaly detection means.

With reference to FIG. 35, an example of detection of anomalies will be specifically described.

FIG. 35 illustrates the example demonstrating how the anomaly detection means detects the presence or absence of anomalies. Black squares in FIGS. 35(1) to 35(4) indicate the states where a person is performing activities and an apparatus is in operation, while white squares indicate the states where the person is not performing activities and the apparatus is not in operation.

For example, FIG. 35(1) shows the states where the person is sleeping and the target apparatus 3030 is not in operation, and FIG. 35(2) shows the states where the target apparatus 3030 is used during lunch time. In this case, the anomaly detection means 3009 detects the activities of the person and determines that there are no anomalies regardless of whether the target apparatus 3030 is in operation or not.

FIG. 35(3) shows, for example, the states where the person is out of the residence and the target apparatus 3030 is not in operation. In this case, the anomaly detection means 3009 detects the absence of activities of the person and the target apparatus 3030 is not in operation and determines that there are no anomalies.

FIG. 35(4) shows the states where the activities of the person are suspended after the target apparatus 3030 was used. This case may suggest, for example, that the person using the apparatus 3030 felt ill and bent over, fell to the floor and could not move, or has gone out with the apparatus left on. In this case, the anomaly detection means 3009 detects the disappearance of the activities of the person in the middle of the activities and the operating target apparatus 3030 and determines that there is an anomaly.

Next, an example of installation of the living persons' anomaly detector 3001 will be described with reference to FIG. 36.

Figure 36:
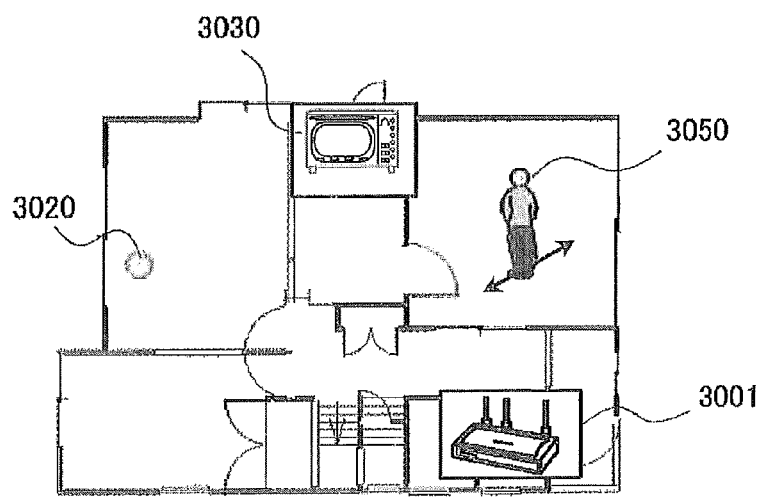
FIG. 36 illustrates an exemplary installation site of the living persons' anomaly detector according to Embodiment 12.

FIG. 36 illustrates an exemplary installation of the living persons' anomaly detector according to Embodiment 12.

In a residence, there are a living persons' anomaly detector 3001, an apparatus 3030 targeted for detection and a person 3050 living therein. The residence is enclosed with walls so that radio signals transmitted from the apparatus 3030 and living persons' anomaly detector 3001 do not leak outside the residence. A wireless access point 3020 is installed in the residence. While the person 3050 is walking around inside the residence, a radio wave transmitted from the wireless access point 3020 at a constant output power reaches the living persons' anomaly detector 3001, whereas radio waves received by the wireless communication means 3002 intermittently change in intensity from moment to moment. With the radio wave, the activity determination means 3004 can readily estimate that the person 3050 is present in the residence. When the person 3050 operates the target apparatus 3030, the apparatus 3030 transmits a state report in accordance with the operation to the living persons' anomaly detector 3001. Then, the operating-apparatus detection means 3006 that has received the state report can find that the apparatus 3030 was operated. The living persons' anomaly detector 3001 keeps monitoring to check if there is an anomaly in the residence in which the living persons' anomaly detector 3001 is installed.

As described above, according to Embodiment 12, when detecting that the target apparatus 3030 is in operation while the person is not performing activities, the living persons' anomaly detector 3001 is designed to determine the presence of anomalies and activate the warning buzzer 3011, thereby informing the people around of the anomalies. In addition, the living persons' anomaly detector 3001 is designed to turn off the target apparatus 3030 or to lower the output power when it determines the presence of anomalies, thereby reducing energy waste and offering energy-conservation applications. Furthermore, determining the state where the person is not performing activities and the apparatus 3030 is in operation is an anomalous state simplifies algorithms, and therefore, the living persons' anomaly detector 3001 can be implemented in a MICOM with a small capacity ROM and RAM.

Embodiment 13

In Embodiment 12, the operating-apparatus detection means 3006 determines the operation state of the apparatus 3030 based on the state report from the apparatus 3030;

however, the operating-apparatus detection means 3006 in Embodiment 13 determines the operation state of the apparatus 3030 based on current flowing in the target apparatus 3030.

Figure 37:
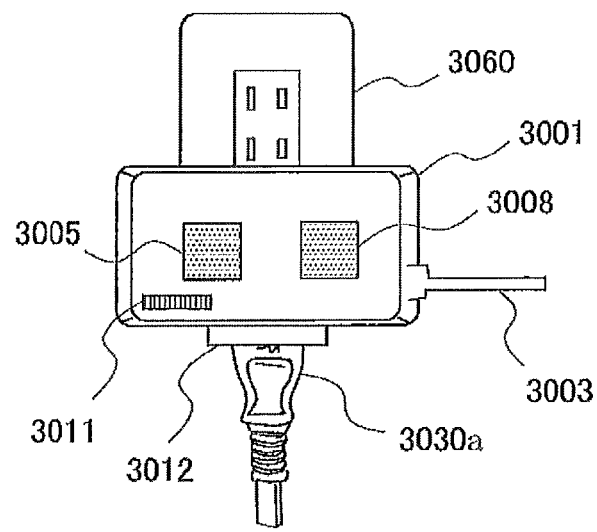
FIG. 37 is a front view depicting the appearance of a living persons' anomaly detector according to Embodiment 13 of the present invention.

FIG. 37 is a front view depicting the appearance of the living persons' anomaly detector according to Embodiment 13 of the present invention. The structure of the living persons' anomaly detector 3001 is the same as that in Embodiment 12, except for the operating-apparatus detection means 3006 and anomaly detection means 3009.

The living persons' anomaly detector 3001 according to Embodiment 13 includes a connecting plug detachably connected to an outlet 3060 placed in the residence, an outlet 3012 in which a power plug 3030a of the apparatus 3030 to be connected with the connecting plug is inserted, a shunt resistor and a contact of a relay interposed between the connecting plug and outlet 3012, and an A/D converter that converts a voltage drop value caused by the shunt resistor into a digital value and outputs it to the operating-apparatus detection means 3006.

The operating-apparatus detection means 3006 in the living persons' anomaly detector 3001 detects a current value from the output of the A/D converter and compares the current value with a preset threshold. If the current values is less than the threshold, the operating-apparatus detection means 3006 determines that the apparatus 3030 is not in operation, and if the current values are equal to or greater than the threshold, the operating-apparatus detection means 3006 determines that the apparatus 3030 is in operation, and either one of the determination results is stored as apparatus information in the RAM. The aforementioned threshold is stored in a ROM in the operating-apparatus detection means 3006.

When the anomaly detection means 3009 determines the presence of anomalies from the activity information stored in the RAM of the activity determination means 3004 and the apparatus information stored in the RAM of the operating-apparatus detection means 3006, the anomaly detection means 3009 activates the relay to open the contact to interrupt the power supply to the apparatus 3030.

Next, a description will be made about operations of the operating-apparatus detection means 3006 and anomaly detection means 3009.

Figure 38:
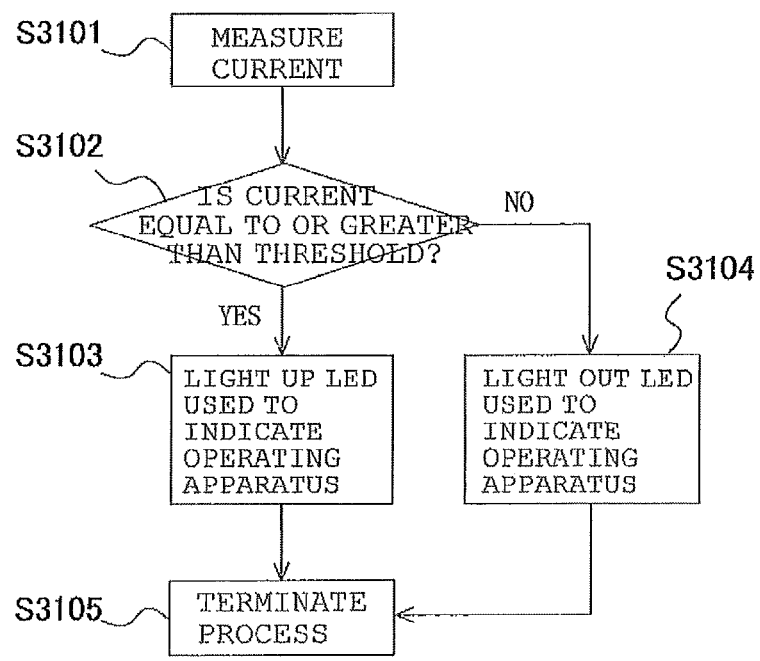
FIG. 38 is a flow chart showing operations of operating-apparatus detection means of the living persons' anomaly detector according to Embodiment 13.

FIG. 38 is a flow chart showing the operations of the operating-apparatus detection means of the living persons' anomaly detector according to Embodiment 13. Note that the connecting plug of the living persons' anomaly detector 3001 is connected to the outlet 3060.

The operating-apparatus detection means 3006 measures current values of a target apparatus 3030, in which its power plug 3030a is connected to the outlet 3012 of the living persons' anomaly detector 3001, at a predetermined interval using the shunt resistor and A/D converter (S3101), and determines whether the current value is equal to or greater than a threshold (S3102). If the current value of the target apparatus 3030 is equal to or greater than the threshold, the operating-apparatus detection means 3006 determines that the apparatus 3030 is in operation and stores the determination result as apparatus information in the RAM. Then, the operating-apparatus detection means 3006 lights up the LED indicator 3008 (S3103) to inform the user of the detection result that the apparatus 3030 is in operation, and terminates the series of the aforementioned processes (S3105). On the contrary, if the current value is less than the threshold, the operating-apparatus detection means 3006 determines that the target apparatus 3030 is not in operation and stores the determination result as apparatus information in the RAM. Then, the operating-apparatus detection means 3006 lights out the LED indicator 3008 (S3104) to inform the user of the detection result that the apparatus 3030 is not in operation, and terminates the series of the aforementioned processes (S3105).

The anomaly detection means 3009 reads out the activity information of the person from the RAM of the activity determination means 3004 to determine whether the person is performing activities. When determining that the person is performing activities from the activity information, the anomaly detection means 3009 terminates the process for detecting anomalies. When determining that the person is not performing activities from the activity information, the anomaly detection means 3009 reads out apparatus information from the RAM of the operating-apparatus detection means 3006 to determine whether the target apparatus 3030 is in operation or not. If the anomaly detection means 3009 determines that the target apparatus 3030 is not in operation, it terminates the process for detecting anomalies. If the anomaly detection means 3009 determines that the target apparatus 3030 is in operation from the apparatus information while the person is not performing activities, it activates a warning buzzer, while activating the relay to bring the contact into an OFF state.

According to the above-described Embodiment 13, the target apparatus 3030 is determined to be in operation when the current value of the apparatus 3030 whose power plug 3030a is connected to the outlet 3012 of the living persons' anomaly detector 3001 is equal to or greater than the threshold, and therefore, it is possible to detect the operation state of the apparatus 3030 without a wireless communication function. Since the power supply to the apparatus 3030 is interrupted when the current value of the target apparatus 3030 is equal to or greater than the threshold, in other words, when the target apparatus 3030 is in operation while the person's activities are not detected, it is possible to reduce electric power waste and offer energy-conservation applications.

Embodiment 14

In Embodiment 13, a voltage drop caused by a shunt resistor is measured to detect the current of the target apparatus 3030; however, the living persons' anomaly detector of Embodiment 14 is designed to detect harmonic currents of the target apparatus 3030 using a clamp-on current transformer.

Figure 39:
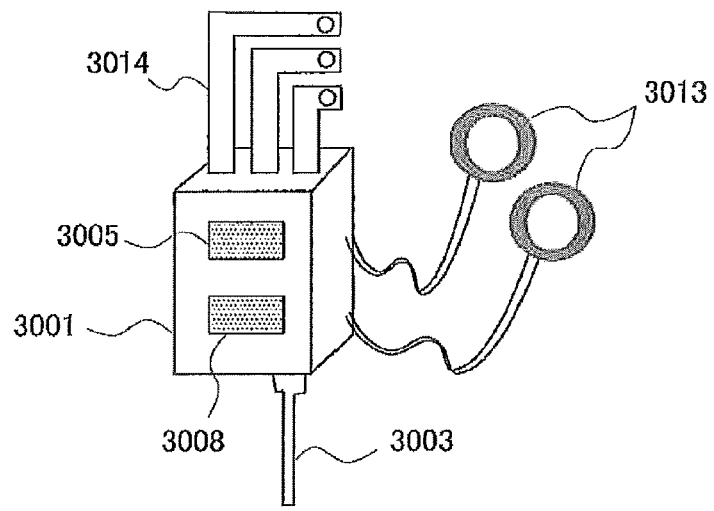
FIG. 39 is a front view depicting the appearance of a living persons' anomaly detector according to Embodiment 14 of the present invention.

FIG. 39 is a front view depicting the appearance of the living persons' anomaly detector according to Embodiment 14 of the present invention. Although three connecting terminals 3014 are depicted in FIG. 39, the description of Embodiment 14 will be made as if there are no connecting terminals 3014. The living persons' anomaly detector 3001 is identical in structure to that of Embodiment 12 except for the operating-apparatus detection means 3006 and anomaly detection means 3009.

The living persons' anomaly detector 3001 according to Embodiment 14 includes clamp-on current transformers 3013 that are attached in the vicinity of a distribution board in a residence and detect current flowing along the secondary side (feeder line of 100 V) of a main breaker of the distribution board. The operating-apparatus detection means 3006 of the living persons' anomaly detector 3001, in advance, measures current that flows in a plurality of apparatuses 3030 targeted for detection, such as a television and air-conditioner, using the current transformer 3013, extracts harmonics in the current and stores the harmonics in the RAM. The purpose of storing the harmonics is to cause the living persons' anomaly detector 3001 to learn about the target apparatuses 3030 before actual operations. After the storage process, the operating-apparatus detection means 3006 compares a harmonic extracted from a measured current with the harmonics stored in the RAM to determine whether the harmonic is from a target apparatus 3030. If the harmonic is determined to be from the target apparatus 3030, the operating-apparatus detection means 3006 determines that the target apparatus is in operation, whereas if almost the same harmonic is not found in the harmonics, the operating-apparatus detection means 3006 determines that the target apparatus 3030 is not in operation, and either one of determination results is stored as apparatus information in the RAM.

When the anomaly detection means 3009 determines the presence of anomalies from activity information stored in the RAM of the activity determination means 3004 and apparatus information stored in the RAM of the operating-apparatus detection means 3006, the anomaly detection means 3009 activates the warning buzzer 3011 to inform the user of the determination result.

Next, the operations of the operating-apparatus detection means 3006 and the anomaly detection means 3009 will be described.

Figure 40:
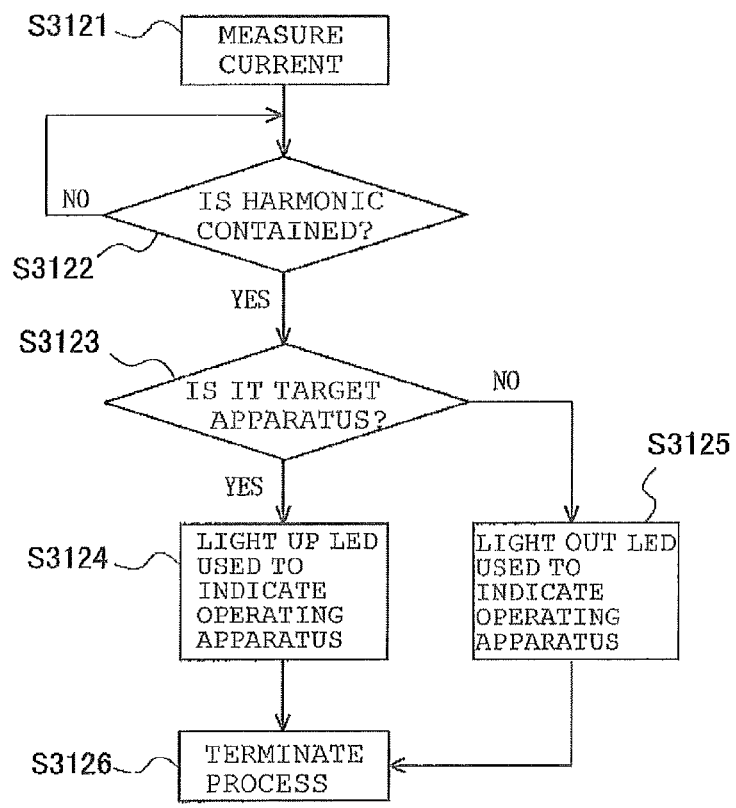
FIG. 40 is a flow chart showing operations of operating-apparatus detection means of the living persons' anomaly detector according to Embodiment 14.

FIG. 40 is a flow chart showing the operations of the operating-apparatus detection means of the living persons' anomaly detector according to Embodiment 14.

The operating-apparatus detection means 3006 measures current via the current transformers 3013 (S3121), and determines whether the measured current contains a harmonic (S3122). If a harmonic is not contained, the operating-apparatus detection means 3006 repeats the operation. If measured current contains a harmonic, the operating-apparatus detection means 3006 compares the harmonic with the harmonics previously extracted and stored in the RAM to determine whether the harmonic is from the target apparatus 3030 (S3123). If almost the same harmonic is detected, the operating-apparatus detection means 3006 determines that the target apparatus 3030 is in operation and stores the determination result as apparatus information in the RAM. Then, the operating-apparatus detection means 3006 lights up the LED indicator 3008 (S3124) to inform the user of the determination result that the target apparatus 3030 is in operation and terminates the series of the aforementioned processes (S3126). On the contrary, if the extracted harmonic is not found in the RAM, the operating-apparatus detection means 3006 determines that the target apparatus 3030 is not in operation and stores the determination result as apparatus information in the RAM. Then, the operating-apparatus detection means 3006 lights out the LED indicator 3008 (S3125) to inform the user of the determination result that the target apparatus 3030 is not in operation and terminates the series of the aforementioned processes (S3126).

The anomaly detection means 3009 reads out activity information of the person from the RAM of the activity determination means 3004 to determine whether the person is performing activities. If the anomaly detection means 3009 determines that the person is performing activities from the activity information, it terminates the process for detecting anomalies. If the anomaly detection means 3009 determines that the person is not performing activities from the activity information, it reads out apparatus information from the RAM of the operating-apparatus detection means 3006 to determine whether the target apparatus 3030 is in operation or not. If the operating-apparatus detection means 3006 determines that the target apparatus 3030 is not in operation, it terminates the process for detecting anomalies. On the contrary, if the operating-apparatus detection means 3006 determines that the target apparatus 3030 is in operation while the person is not performing activities from the apparatus information, it activates a warning buzzer.

According to the above-described Embodiment 14, the target apparatus 3030 is determined to be in operation or not by measuring current that flows along the secondary side of the main breaker of the distribution board through the current transformers 3013 and extracting a harmonic from the measured current, and therefore, it is possible to detect the operation state of apparatuses 3030 without a wireless communication function. In addition, when almost the same harmonic as that of the target apparatus 3030 is detected from the measured current, but any activities of the person are not detected, the user is informed of the detection result, thereby turning off the apparatus 3030 that remains turned on and therefore preventing the target apparatus 3030 from consuming unnecessary electric power.

Although the living persons' anomaly detector 3001 is installed in the vicinity of the distribution board in Embodiment 14, the living persons' anomaly detector 3001 can be located in the vicinity of a power meter or a pole-mounted transformer. In addition, the current of the target apparatus 3030 can be measured using a current transformer 3013 on a power line of the secondary side of the distribution board.

Although the current, which flows along the secondary side of the main breaker of the distribution board, is measured by the current transformer 3013 to extract harmonics therefrom, anything available from the power line, or a combination thereof can be used, instead of the current, such as a consumption power, reactive power, voltage fluctuation, current effective value, voltage effective value, circuit impedance and frequency spectrum.

Although the living persons' anomaly detector 3001 includes the current transformer 3013 in Embodiment 14, the living persons' anomaly detector 3001 may include connecting terminals 3014 (see FIG. 39) connected to a feeder line on the secondary side of the main breaker of the distribution board. In this case, the living persons' anomaly detector 3001 measures voltages of 100 V (voltage to ground) and 200 V to learn, in advance, about voltage waveform distortion generated when a television and air-conditioner (200 V) and other apparatuses targeted for detection are in operation, and determines that the target television and air-conditioner are in operation when distortion is detected in the voltage waveform.

With such a structure, it is possible to detect the operation state of the apparatus 3030 without a wireless communication function. In addition, when almost the same voltage waveform (distortion) as that of the target apparatus 3030 is detected from the measured voltage during the absence of the person's activity, the living persons' anomaly detector 3001 informs the user of the detection result, thereby turning off the apparatus 3030 remaining turned on and therefore preventing the target apparatus 3030 from consuming unnecessary electric power.

Embodiment 15

In Embodiment 15, EMC noise (electromagnetic noise) generated by the apparatus 3030 is detected to determine the operation state of the apparatus 3030.

FIG. 41 is a perspective view depicting the appearance of the living persons' anomaly detector according to Embodiment 15 of the present invention. The living persons' anomaly detector 3001 is identical in structure to that of Embodiment 12 except for the operating-apparatus detection means 3006.

The living persons' anomaly detector 3001 according to Embodiment 15 includes an antenna 3015 that measures EMC noise emitted from the apparatus 3030. The operating-apparatus detection means 3006 of the living persons' anomaly detector 3001 receives EMC noise radiated from the target apparatus 3030 and stores it as data in the RAM in advance. The purpose of storing the EMC noise is to cause the living persons' anomaly detector 3001 to learn about the target apparatus 3030 before actual operations. After the storage process, the living persons' anomaly detector 3001 compares the received EMC noise with the EMC noises stored in the RAM to determine whether the noise is from the target apparatus 3030. If it is determined that the noise is from the target apparatus 3030, the living persons' anomaly detector 3001 determines that the apparatus 3030 is in operation, whereas if almost the same noise is not detected, the living persons' anomaly detector 3001 determines that the target apparatus 3030 is not in operation, and either one of the determination results is stored as apparatus information in the RAM.

Next, operations of the operating-apparatus detection means 3006 will be described.

FIG. 42 is a flow chart illustrating the operations of the operating-apparatus detection means of the living persons' anomaly detector according to Embodiment 15.

When receiving EMC noise generated from the apparatus 3030 via the antenna 3015 (S3141), the operating-apparatus detection means 3006 measures the EMC noise (S3142) and determines whether the measured EMC noise is almost equal to any of the EMC noises previously stored in the RAM using a pattern matching algorithm or the like (S3143). If the noises are determined to be almost equal to each other, the operating-apparatus detection means 3006 determines that the target apparatus 3030 is in operation and stores the determination result as apparatus information in the RAM. Then, the operating-apparatus detection means 3006 lights up the LED indicator 3008 (S3144) to inform the user of the determination result that the target apparatus 3030 is in operation and terminates the series of the aforementioned processes (S3146).

If the noises are determined to be different from each other, the operating-apparatus detection means 3006 determines that the target apparatus 3030 is not in operation and stores the determination result as apparatus information in the RAM. Then, the operating-apparatus detection means 3006 lights out the LED indicator 3008 (S3145) to inform the user of the determination result that the target apparatus 3030 is not in operation and terminates the series of the aforementioned processes (S3146).

According to the above-described Embodiment 15, the EMC noise generated from the apparatus 3030 is received and measured and the measured EMC noise is compared with EMC noises of the apparatus 3030 previously learned and stored in the RAM to determine whether the noise is from the target apparatus 3030, and therefore, it is possible to detect the operation state of the apparatus 3030 without a wireless communication function. In addition, when the noise is determined to be from the target apparatus 3030 during the absence of the person's activities, the living persons' anomaly detector 3001 activates the warning buzzer 3011 and informs the user of the determination result, thereby turning off the apparatus 3030 remaining turned on and therefore preventing the target apparatus 3030 from consuming unnecessary electric power and offering energy-conservation applications.

Although the target apparatus 3030 is identified by EMC noise in Embodiment 15, it is possible to detect any apparatuses 3030 that have started operation rather than identifying a specific one. Since the operation of the apparatus 3030 increases the absolute amount of the EMC noise, it may be impossible to identify the kind of apparatus 3030, but it may be easy to estimate that "any of the apparatuses 3030 in the residence are in operation".

Embodiment 16

In Embodiment 16, the wireless access point 3020 transmits packet radio signals with an error detecting code. The wireless communication means 3002 of the living persons' anomaly detector 3001 receives a packet with an error detecting code via an antenna 3003. If an error is detected in the packet, the wireless communication means 3002 discards data about the intensity of a radio wave that was measured while receiving the packet instead of storing the data in the RAM. A packet with an error detecting code is a data packet with a function for detecting that the radio signal was destroyed due to the interference of a noise radio wave that occurs during the transmission of the signal.

Except for the wireless communication means 3002, the living persons' anomaly detector 3001 in Embodiment 16 is identical in structure to that in any of Embodiments 12 to 15.

Next, operations of the wireless communication means 3002 and activity determination means 3004 will be described.

Figure 43:
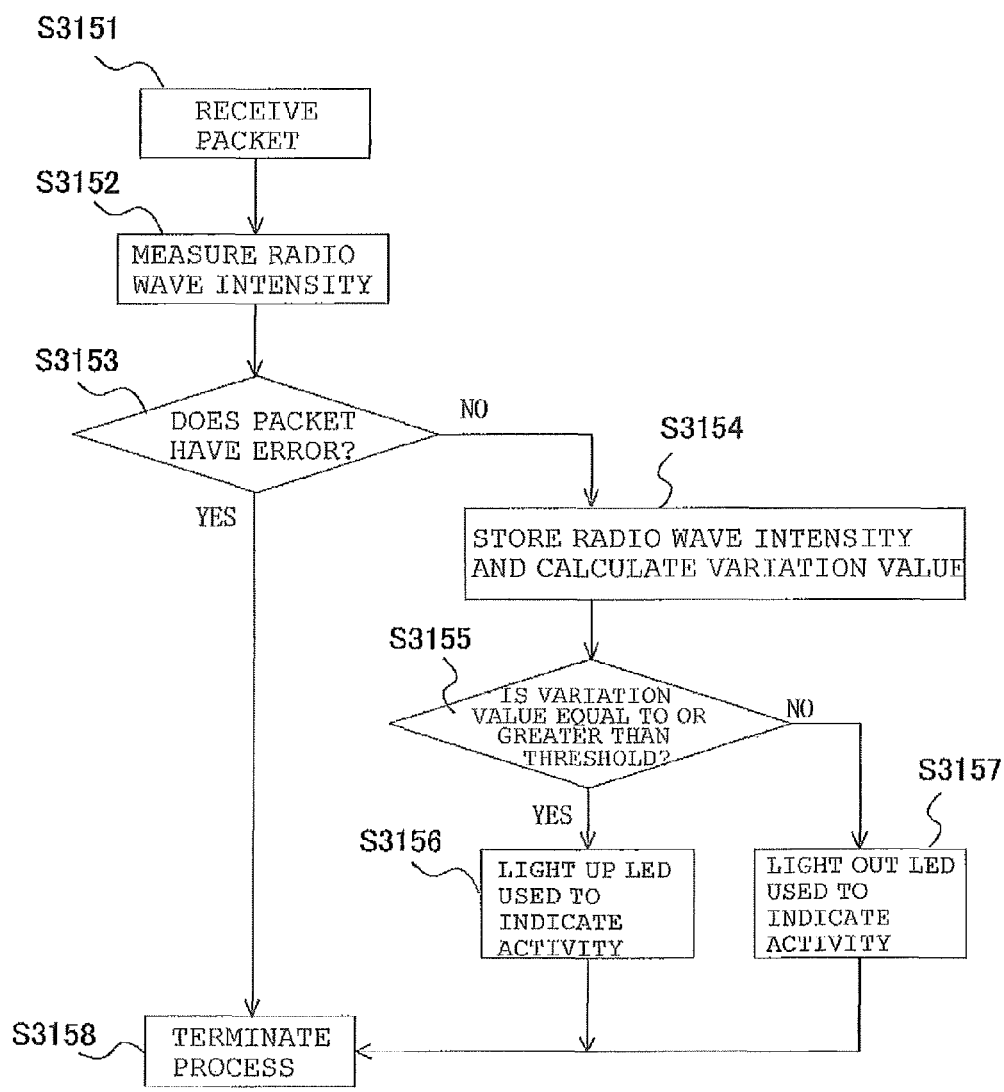
FIG. 43 is a flow chart showing operations of wireless communication means and activity determination means of a living persons' anomaly detector according to Embodiment 16 of the present invention.

FIG. 43 is a flow chart showing the operations of the wireless communication means and activity determination means of the living persons' anomaly detector according to Embodiment 16 of the present invention.

The wireless communication means 3002 receives a packet transmitted from a wireless access point 3020 via an antenna 3003 (S3151) and measures the intensity of the received radio wave for a certain period of time (S3152). Then, the wireless communication means 3002 determines whether the packet has an error by using an error detecting code assigned to the packet (S3153). If the packet has an error, the wireless communication means 3002 discards the measured radio wave intensity and terminates its operation (S3158).

If the packet has no error, the wireless communication means 3002 stores the measured radio wave intensity in its RAM, reads out radio wave intensities obtained for a predetermined period of time, calculates a variation value of the radio wave intensities from the difference between the maximum value and the minimum value of the radio wave intensities (S3154), and stores the variation value in the RAM with its receipt time.

The activity determination means 3004 reads the variation value of the radio wave intensities for each predetermined period of time calculated by the wireless communication means 3002 and compares it with a threshold stored in the RAM in advance (S3155). If the variation value of the radio wave intensities is equal to or greater than the threshold, the activity determination means 3004 determines that the person is performing activities and stores the determination result as activity information in the RAM. Then, the activity determination means 3004 lights up the LED indicator 3005 (S3156) to inform the user of the determination result that an activity was detected, and terminates the series of the aforementioned processes (S3158). On the contrary, if the variation value is lower than the threshold, the activity determination means 3004 determines that the person is not performing activities, and stores the determination result as activity information in the RAM. Then the activity determination means 3004 lights out the LED indicator 3005 (S3157) to inform the user of the determination result that an activity was not detected and terminates the series of the aforementioned processes (S3158).

Addition of noise to a frequency band raises the intensity of measured received radio waves higher than normal values; however, according to Embodiment 16, the error detecting code enables detection of noise addition, thereby discarding abnormal values. Even if the received radio wave is disturbed due to sudden addition of a noise radio wave into the same frequency band, the error detecting function can detect the disturbed radio wave, thereby correctly determining the operation state.

Although what the wireless communication means 3002 transmits is a packet including an error detecting code in Embodiment 16, the packet does not need to explicitly indicate the error detecting code. In a network in which packets are constructed under previously set rules such as packets with equal number of bits of data, it is possible to detect errors based on such rules even if the error detecting code is not explicitly indicated in the packet.

Embodiment 17

The wireless communication means 3002 of the living persons' anomaly detector 3001 according to Embodiment 17 transmits a request packet to require the wireless access point 3020 to transmit a packet to the wireless access point 3020. In response to the request packet, the wireless access point 3020 transmits a request-reply packet (with an error detecting code). This function can be implemented by, for example, utilizing radio beacons. The radio beacons are signals used by network terminals on a wireless network to have their existence appeal to each other. Only when receiving the request-reply packet, the wireless communication means 3002 starts measuring the intensity of radio waves. Except for the structure of the wireless communication means 3002, the living persons' anomaly detector is identical in structure to that in any of Embodiments 12 to 16.

Next, operations of the wireless communication means 3002 and activity determination means 3004 of the living persons' anomaly detector 3001 will be described.

Figure 44:
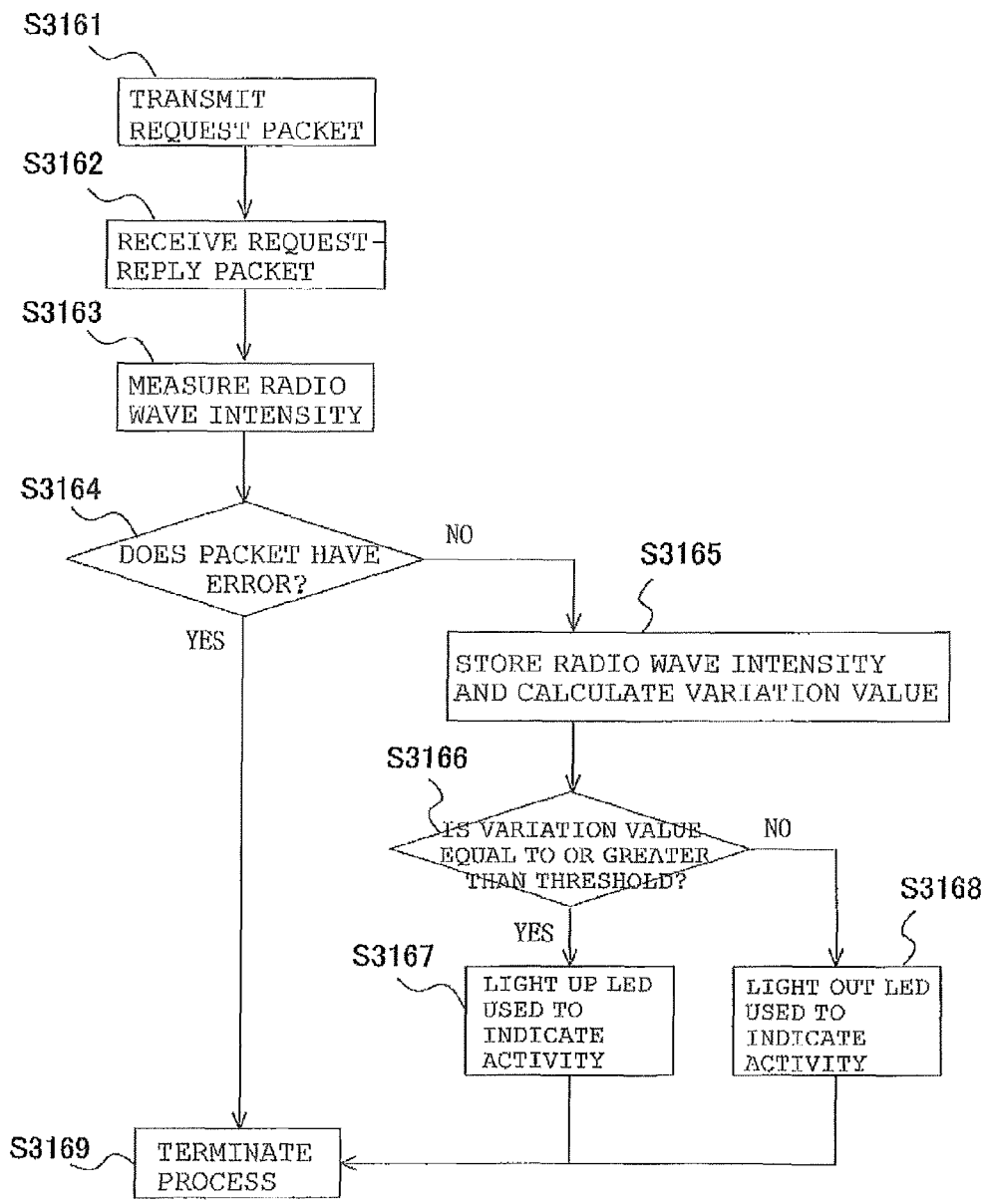
FIG. 44 is a flow chart showing operations of wireless communication means and activity determination means of a living persons' anomaly detector according to Embodiment 17 of the present invention.

FIG. 44 is a flow chart showing the operations of the wireless communication means and activity determination means of the living persons' anomaly detector 3001 according to Embodiment 17 of the present invention.

The wireless communication means 3002 transmits a request packet to the wireless access point 3020 (S3161). In response to the request packet, the wireless access point 3020 transmits a request-reply packet. Upon receipt of the request-reply packet via an antenna 3003 (S3162), the wireless communication means 3002 measures the intensity of received radio wave for a certain period of time (S3163). Then, the wireless communication means 3002 determines whether the packet has an error by using the error detecting code assigned to the packet (S3164). If the packet has an error, the wireless communication means 3002 discards the measured radio wave intensity and terminates its operations (S3169).

If the packet has no error, the wireless communication means 3002 stores the measured radio wave intensity in the RAM, reads out the radio wave intensities obtained for a certain period of time, calculates a variation value of the radio wave intensities from the difference between the maximum value and the minimum value of the radio wave intensities (S3165), and stores the variation value in the RAM with its receipt time.

The activity determination means 3004 reads the variation values of the radio wave intensity, which were calculated by the wireless communication means 3002, for each predetermined period of time and compares the variation values with a threshold stored in the RAM in advance (S3166). If the variation value of the radio wave intensities is equal to or greater than the threshold, the activity determination means 3004 determines that the person is performing activities and stores the determination result as activity information in the RAM. Then, the activity determination means 3004 lights up the LED indicator 3005 (S3167) to inform the user of the determination result that the person is performing activities, and terminates the series of the aforementioned processes (S3169). If the variation value is less than the threshold, the activity determination means 3004 determines that the person is not performing activities and stores the determination result as activity information in the RAM. Then, the activity determination means 3004 lights out the LED indicator 3005 (S3168) to clearly inform the user of the determination result that the person is not performing activities and terminates the series of the aforementioned processes (S3169).

In Embodiment 17, the request packet transmitted by the wireless communication means 3002 enables quick packet reception, thereby shortening the period for determining the presence or absence of activities.

In Embodiment 17, beacons are used for the request packet and request-reply packet; however, a PING (Packet Internet Groper) or other communication reply commands can be also used as long as they use the same network protocol.

In addition, measurement of the radio wave intensity is triggered by receipt of just a request-reply packet; however, measurement can start with receipt of both request-reply packets and regular packets.

Embodiment 18

Figure 45:
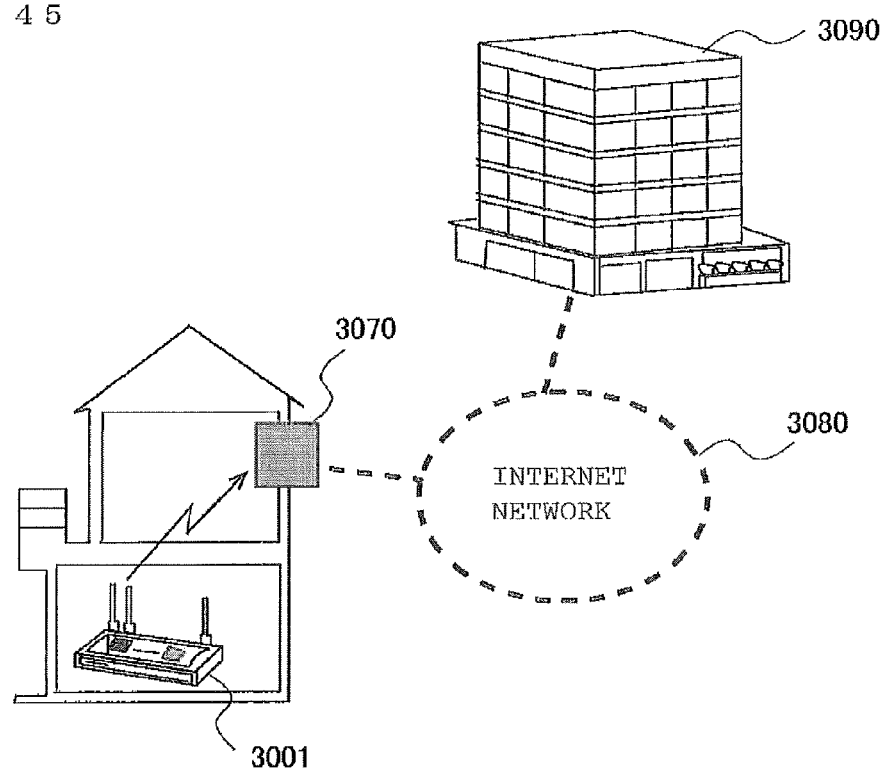
FIG. 45 illustrates a structure of a living persons' anomaly detection system according to Embodiment 18 of the present invention.

FIG. 45 illustrates a structure of a living persons' anomaly detection system according to Embodiment 18 of the present invention. Except for the anomaly detection means 3009, the living persons' anomaly detector 3001 of the system is identical in structure to that in any of Embodiments 12 to 17.

The anomaly detection means 3009 of the living persons' anomaly detector 3001 according to Embodiment 18 includes a connection port for a LAN connected with an Internet network. When detecting an anomaly, the anomaly detection means 3009 transmits mail to an anomaly detection center 3090 at a remote location, the mail indicating that the anomaly has been detected. This function is implemented by email which is generally used over the Internet. The mail is relayed by a router 3070 installed in a residence.

The anomaly detection means 3009 and router 3070 of the living persons' anomaly detector 3001 exchange packets through wireless communication. The wireless communication is carried out, for example, by the same communication device used to exchange data between the living persons' anomaly detector 3001 and target apparatuses 3030. The router 3070 is connected to the anomaly detection center 3090 through the Internet network 3080. The anomaly detection center 3090 is provided with mail boxes each assigned with a mail address unique to a household and scans the mail boxes to monitor states of a plurality of households.

Next, operations of the anomaly detection means 3009 of the living persons' anomaly detector 3001 will be described.

Figure 46:
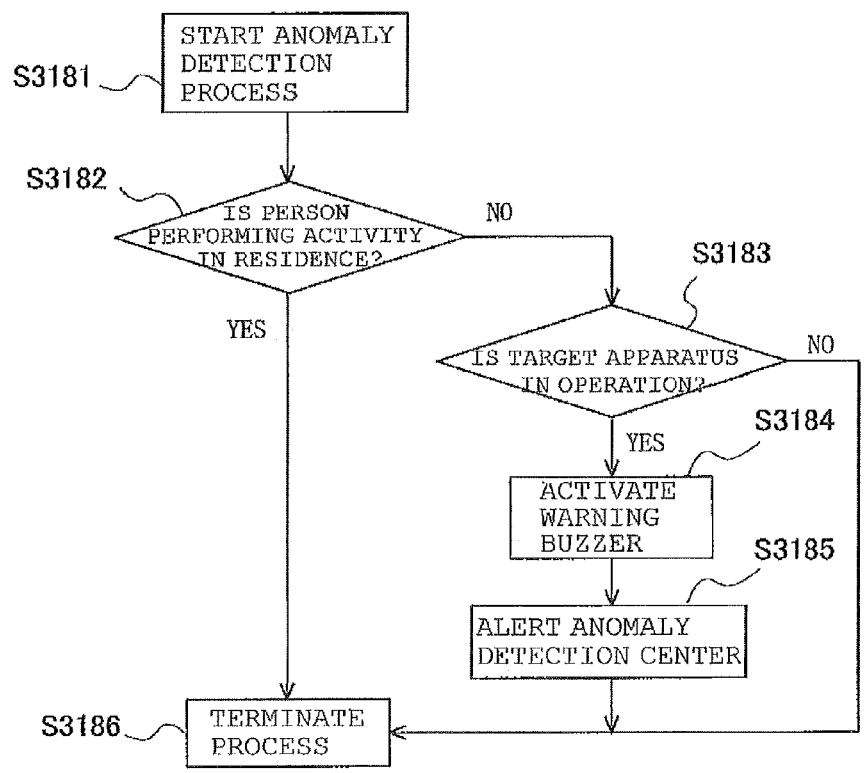
FIG. 46 is a flow chart showing operations of anomaly detection means of the living persons' anomaly detector according to Embodiment 18 of the present invention.

FIG. 46 is a flow chart showing the operations of the anomaly detection means of the living persons' anomaly detector according to Embodiment 18 of the present invention.

The anomaly detection means 3009 reads activity information of a person from the RAM of the activity determination means 3004 and starts processes for detecting anomalies (S3181). At first, the anomaly detection means 3009 determines whether the person is performing activities in his/her residence based on the activity information (S3182). If the activity information suggests an activity of the person, the anomaly detection means 3009 terminates the processes for detecting anomalies (S3186).

If the activity information suggests that the person is not performing activities, the anomaly detection means 3009 reads apparatus information from the RAM of the operating-apparatus detection means 3006 to determine whether a target apparatus 3030 (e.g., television, air-conditioner, etc.) is in operation (S3183). If the anomaly detection means 3009 determines that the target apparatus 3030 is not in operation, it terminates the processes for detecting anomalies (S3186). On the contrary, if the anomaly detection means 3009 determines that the target apparatus 3030 is in operation based on the apparatus information, it activates a warning buzzer (S3184) to alert people around the person that an anomaly was detected. Then, the anomaly detection means 3009 transmits mail with an alert report indicating that an anomaly was detected to the anomaly detection center 3090 via the router 3070 and the Internet network 3080 (S3185), while transmitting a control signal to the target apparatus 3030 to stop its operation or to lower its output power, and terminates the processes for detecting anomalies (S3186).

As described above, the anomaly detection means 3009 determines that a situation where the target apparatus 3030 is in operation, but a person not performing activities is anomalous and transmits mail to report the detected anomaly to the anomaly detection center 3090, thereby informing a third party of the anomaly of even a person who does not have care-givers in the residence. This enables prompt contact to emergency medical facilities. In addition, the anomaly detection center 3090 can confirm the situation by making a call to a cell phone of the person, which ensures more reliable anomaly detection.

The mail boxes each assigned with a mail address unique to a household can be provided outside the anomaly detection center 3090. The structure and transmitting method of the mail is not limited to the above description, and it is also possible to use other communication means having the same functions as electronic mail, such as HTTP, FTP and SSL.

Embodiment 19

When the anomaly detection means 3009 determines that the situation where the target apparatus 3030 is in operation, but a person not performing activities is anomalous, what is transmitted by the anomaly detection means 3009 to the anomaly detection center 3090 is mail with an alert report indicating that an anomaly was detected in Embodiment 18; however, in Embodiment 19, the anomaly detection means 3009 sends mail including the person's activity information and apparatus information together with information of the destination address, sender's address, transmission time and so on to the anomaly detection center 3090.

The anomaly detection center 3090 accumulates the mail, determines whether there is an anomaly at present from the data accumulated from past to present and provides a determination result by mail or the like. The data is accumulated in the form of a relational database or other form and stored in a HDD or other type of storage device placed in the anomaly detection center 3090.

Except for the anomaly detection means 3009, the living persons' anomaly detector 3001 in the system is identical in structure to any one of Embodiments 12 to 18.

Next, operations of the anomaly detection means 3009 of the living persons' anomaly detector 3001 will be described.

Figure 47:
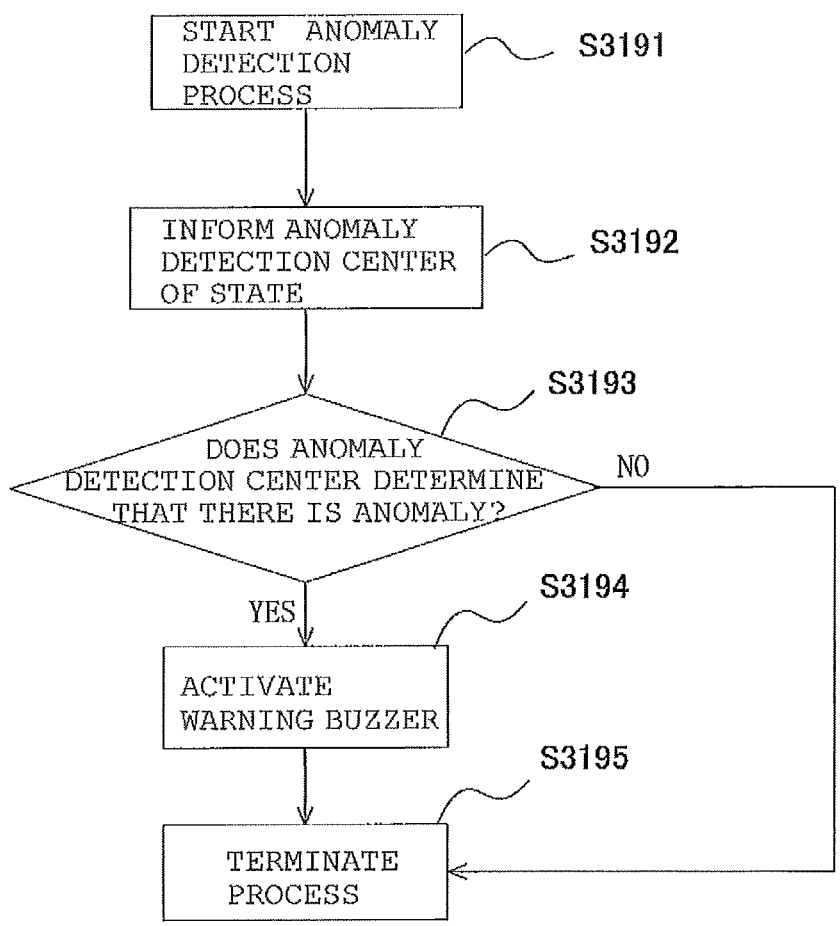
FIG. 47 is a flow chart showing operations of anomaly detection means of a living persons' anomaly detector according to Embodiment 19 of the present invention.

FIG. 47 is a flow chart showing the operations of the anomaly detection means of the living persons' anomaly detector according to Embodiment 19 of the present invention.

The anomaly detection means 3009 reads out apparatus information and a person's activity information from the RAM of the operating-apparatus detection means 3006 and the memory of the activity determination means 3004, respectively, to start processes for detecting anomalies (S3191). At first, the anomaly detection means 3009 transmits information of the read-out apparatus information and activity information and destination address, sender's address, transmission time and so on by mail to the anomaly detection center 3090 (S3192).

The anomaly detection center 3090 transmits a determination result in response to the mail from the anomaly detection means 3009. Upon receipt of the determination result, the anomaly detection means 3009 determines whether the result indicates an anomaly (S3193). If the determination result indicates normality, the anomaly detection means 3009 terminates the anomaly detection process (S3195). If the determination result shows an anomaly, the anomaly detection means 3009 activates a warning buzzer (S3194) to alert people around the person that an anomaly was detected. Simultaneously, the anomaly detection means 3009 transmits a control signal to the target apparatus 3030 to stop its operation or to lower power output and terminates the anomaly detection processes (S3195).

Since a server enabling quick search of a large volume of data of the anomaly detection center 3090 can be used to detect anomalies as described above, the anomaly detection can be made at a rapid speed with higher accuracy. In addition, anomalous events that have occurred in other residences can be shared as examples, thereby quickly discovering similar cases.

Although the anomaly detection means 3009 transmits the activity information and apparatus information to the anomaly detection center 3090 by mail or the like in Embodiment 19, it is possible to transmit only one of either activity information and apparatus information, or both information by separate mail.

Embodiment 20

In Embodiment 20, a database is provided in the anomaly detection means 3009. Except for the anomaly detection means 3009, the living persons' anomaly detector is identical in structure to any one of Embodiments 12 to 19.

The anomaly detection means 3009 reads out and refers activity information in the RAM stored by the activity determination means 3004 and apparatus information in the RAM stored by the operating-apparatus detection means 3006 and searches the database using the information as search keys. The search result is stored in a RAM as a determination result of the presence or absence of an anomaly.

The aforementioned database includes possibly-anomalous states of apparatuses 3030 and activity states of the person in association with each other. The information stored in the database may be something like "the situation where an IH cooker is in operation, but a person is not performing activities is anomalous". More specifically, the database is, for example, a relational database containing three fields, i.e., activity information, apparatus information and a determination result. The data is stored in a ROM, RAM, flash memory, hard disk or the other types of storage device.

As described above, the database that is constructed with past experiences enables efficient use of similar cases in the past in order to detect anomalies, thereby improving anomaly detection accuracy. With this database, it is possible to make detailed specifications for every apparatus 3030, for example, "the television is an exception to anomaly detection because it may be activated by a timer".

Although the database in Embodiment 20 is a relational database, the database may be another type of database constructed according to XML or the like.

In the aforementioned respective embodiments, the wireless communication means 3002, activity determination means 3004, operating-apparatus detection means 3006 and anomaly detection means 3009 have a CPU, respectively; however, they can share a CPU. In addition, they have a ROM and RAM to store programs, respectively, in the above embodiments; however, they can also share a ROM and a RAM. Furthermore, in Embodiments 12, 13 and 16 to 20, the wireless communication means 3002, operating-apparatus detection means 3006 and anomaly detection means 3009 are provided with a communication device (including an antenna), respectively; however, they can share a communication device.

The wireless access point 3101 may be a public facility located outside, such as a transmission station of television broadcasting waves, a transmission station of radio broadcasting waves and a source point of public wireless LAN.

The operating-apparatus detection means 3006 can detect a plurality of apparatuses 3030, and the anomaly detection means 3009 can control a plurality of apparatuses 3030. In this case, the processes performed to detect a single apparatus 3030 are repeatedly performed to the other apparatuses. Before storing the apparatus information in the RAM, something specifying the apparatus 3030, such as an ID, is assigned to the information. In addition, the anomaly detection means 3009 determines that there is an anomaly when at least one of the apparatuses 3030 is in operation, but a person is not performing activities. These algorithms can be replaced with other algorithms.

In Embodiments 12, 16 and 17, the variation value of radio wave intensities is calculated from the difference between the maximum value and the minimum value of radio wave intensities, which were obtained for a predetermined period of time and read out from the RAM; however, the variation value can be an average value of variation amounts of the radio wave intensities. For example, when the radio wave intensities for a predetermined period of time are "50, 55, 45, 20, 30, 70" along the time axis, the differential values of the neighboring sample values are obtained from "55−50=5, 45−55=−10, 20−45=−25, 30−20=10, 70−30=40", and therefore, the absolute values of the differential values are "5, 10, 25, 10, 40". The average value is obtained from the absolute values and results in 18, which can function as a variation value. Note that the maximum value and minimum value of the measurable radio wave intensities are 0 and 100, respectively.

Embodiment 21

Embodiment 21 of the present invention relates to a preferred technique of handling a new apparatus attached to a feeder line used to detect apparatus states. More specifically speaking, in order to detect a new apparatus by using the apparatus state detector 2000 shown in Embodiment 9 of the present invention or the apparatus state detection server 2100 shown in Embodiment 10 of the present invention, the apparatus state databases 2230 provided in the detector 2000 and server 2100 need to contain reference apparatus entry data of the new apparatus or, if not, need to acquire it. Embodiment 21 describes a technique related to updating the apparatus state database 2230.

Figure 48:
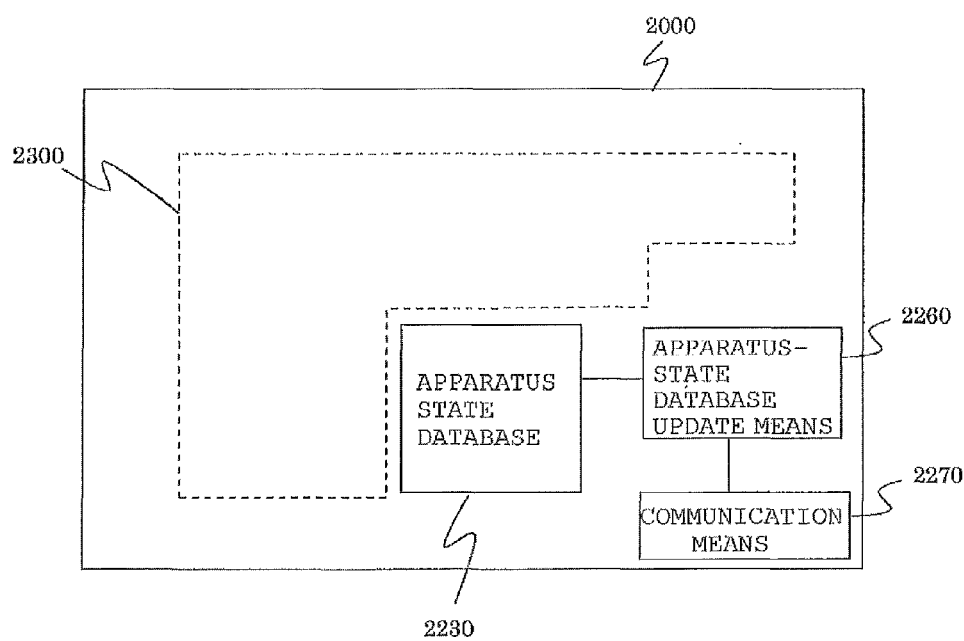
FIG. 48 illustrates a structure of an apparatus state detector according to Embodiment 21 of the present invention.
Figure 49:
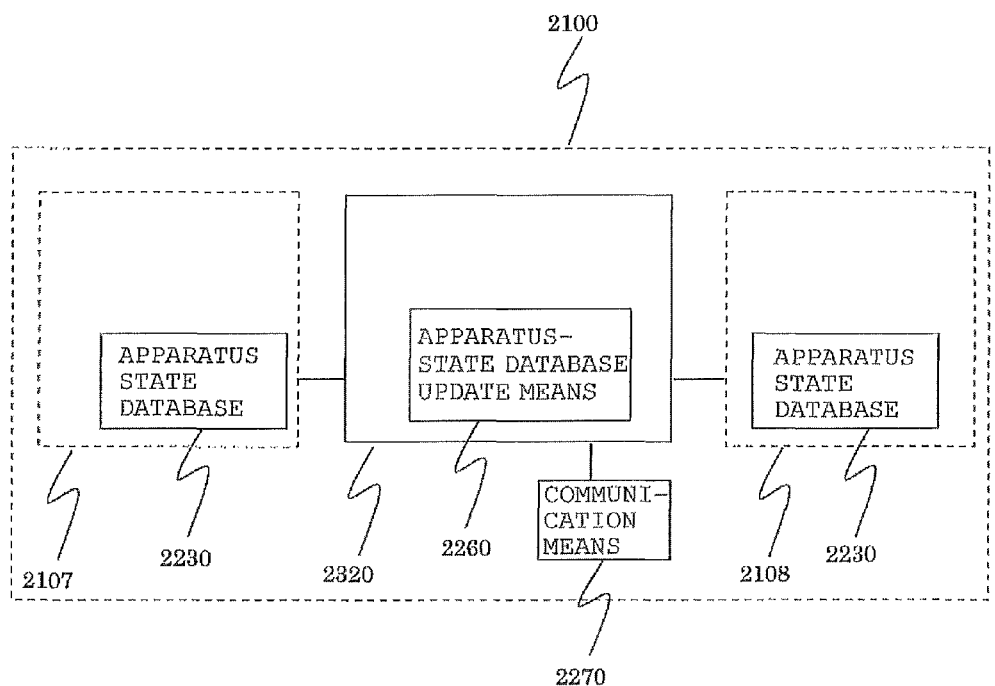
FIG. 49 illustrates a structure of an apparatus state detection server according to Embodiment 21 of the present invention.

Embodiment 21 will be described with reference to FIGS. 27, 48, 49 and 50. FIG. 27 illustrates, as described in Embodiment 11, a system that connects the apparatus state detectors (or apparatus state detection servers) 2201A and 2202A, which are installed in different buildings, to an apparatus state detection system through a network 2204A, allows the apparatus state detection system 2200 to monitor states of apparatuses in each building, and can offer services according to the states of the apparatuses. FIGS. 48 and 49 illustrate a structure of the apparatus state detectors (or apparatus state detection servers) 2201A, 2202A shown in FIG. 27. FIG. 50 illustrates a structure of the apparatus state detection system 2200 shown in FIG. 27.

The apparatus state detector 2000 in FIG. 48 is identical in structure to the apparatus state detector 2000 in FIG. 16, and therefore, like elements of FIG. 16 are denoted with the same reference numbers. In addition, unnecessary elements for understanding Embodiment 21 are omitted. In FIG. 48, the apparatus state database 2230 is connected to an apparatus-state database update means 2260 that is connected to a communication means 2270.

The apparatus state detection server 2100 in FIG. 49 is identical in structure to the apparatus state detection server 2100 in FIG. 26, and therefore, like elements of FIG. 26 are denoted with the same reference numbers. In addition, unnecessary elements for understanding Embodiment 21 are omitted. In FIG. 49, each of the apparatus state detectors 2107, 2108 includes an apparatus state database 2230. The control means 2320 in Embodiment 21 is provided with an apparatus-state database update means 2260 and is connected to the communication means 2270.

FIG. 50 is a block diagram of the apparatus state detection system 2200 in Embodiment 21 and includes like elements of FIG. 28 which are denoted with the same reference numbers. In addition, unnecessary elements to understand Embodiment 21 are omitted. In FIG. 50, an apparatus state database 2216 is connected to a control means 2215 and contains reference apparatus entries of various apparatuses. The information is managed by an apparatus-state database management means 2217.

The following are descriptions about operations. In the case where a new apparatus is introduced and the new apparatus needs to be detected by the apparatus state detector 2101A that does not have the reference apparatus entry of the apparatus, the apparatus state detector 2101A cannot detect the apparatus. The apparatus-state database update means 2260 in FIGS. 48 and 49 adds the reference apparatus entry of the new apparatus to the apparatus state databases 2230 of the apparatus state detectors 2000, 2107, 2108. The database update means 2260 acquires the reference apparatus entry to be added from an external source through the communication means 2270. Thus, the external server that provides the reference apparatus entries necessary to be stored in the apparatus state database 2230 and distributes the entries for the purpose of maintenance of the apparatus state databases in the different buildings is referred to as an apparatus-state database maintenance server.

Embodiment 21 shows an example in which the apparatus-state database maintenance server is provided in the apparatus information detection system 2200. The apparatus-state database management means 2217 in FIG. 50 distributes apparatuses reference apparatus entries necessary for the apparatus state detectors 2000, 2201A, 2202A through the communication means 2210B via a network 2204A. This is based on expectations of a service in which, when a new apparatus is introduced in the market, a reference apparatus entry of the apparatus is dispensed to the apparatus state database 2216 in the apparatus information detection system 2200.

When a new apparatus is installed in each building, the resident of the building provides information, like its model number and manufacturer name, for specifying the apparatus to a service provider operating the apparatus information detection system 2200, while the service provider distributes an apparatus's reference apparatus entry to the apparatus state detector of the resident through the apparatus information detection system 2200. The provision of the apparatus information of the new apparatus can be made with minimum time and effort of the resident depending on operating methods. For example, the apparatus information can be provided by utilizing user registration data at the time of purchase. Although the apparatus-state database maintenance server is placed in the apparatus information detection system 2200 under consideration of the service operation in Embodiment 21, the apparatus-state database maintenance server can be installed at every manufacturer of apparatuses, instead of an apparatus information detection system 2200, so that the respective servers distribute reference apparatus entries.

The technology used in the present invention requires only reference apparatus entries representing features of individual apparatuses, but does not require learning feature combinations with the other apparatuses, and therefore, it is enough for the apparatus-state database maintenance server to store reference apparatus entries of individual apparatuses. Even if a new apparatus is added to one of buildings with various apparatuses already installed, the only thing to do is to distribute a reference apparatus entry representing a feature of the apparatus added to the building.

Although the aforementioned embodiments are intended for a residence, the apparatus information detection device to which the present invention is applied can monitor the state of apparatuses in buildings used as an office and store or structures used for other purposes and provide advice about usage of the apparatus based on the monitoring results, thereby providing a new service for energy conservation and so on. For example, a personal computer is prepared for every worker and various apparatuses are placed including paper shredders (cutters for confidential documents) and cell phones (charger), in addition to printers, facsimiles, copy machines or a multifunction apparatuses thereof. Lighting apparatuses and air-conditioning apparatuses including, heating/cooling apparatuses, humidifiers and ventilators are also installed.

By detecting the states of these apparatuses, for example, by monitoring the operations of the printers and copying machines that are frequently operated, it can be estimated that there are many workers in a room or that the workers are actively working. In addition, by operatively associating with the information it is possible to automatically control the apparatuses, such as suggesting the air-conditioner to adjust the set temperature, so as to satisfy comfort and energy conservation demands.

Some offices renew their apparatuses every few years. Even if the apparatuses are replaced with different ones in a building, reference apparatus entries can be distributed from a remote site via a network or from a site within the building in a concentrated manner as described in the aforementioned embodiments, thereby readily handling renewals.

The invention claimed is:

1. An apparatus state detector that detects states of a single or a plurality of apparatuses comprising:
   measuring means that measures a physical quantity of an environment in which the apparatus is placed;
   feature-quantity calculation means that calculates a feature quantity of the measured value measured by said measuring means;
   storage means that stores, in advance, a plurality of feature quantities of each apparatus and apparatus states associated with the feature quantities, respectively, as dictionary data; and
   apparatus-state detection means that searches for a feature quantity from said plurality of feature quantities in said dictionary data by using a feature quantity calculated by said feature-quantity calculation means as a search key and identifies an apparatus state based on the apparatus state associated with a retrieved feature quantity as a result of the search based on stored histories of the feature quantities for each apparatus,
   wherein said apparatus-state detection means is configured to
      calculate a difference between a first feature quantity, of said stored histories, which is calculated by said feature-quantity calculation means based on said measured value measured by said measuring means at a first time period and a second feature quantity, of said stored histories, which is calculated by said feature-quantity calculation means based on said measured value measured by said measuring means at a second time period,
      identify the calculated difference between the first feature quantity and the second feature quantity as a third feature quantity,
      using the third feature quantity as the search key, retrieve, from the dictionary data stored in the storage means, a stored feature quantity, from the stored plurality of feature quantities, that corresponds to said third feature quantity, and
      identify, a state of the apparatus based on an apparatus state that is stored, in the storage means, in association with the retrieved feature quantity.

2. The apparatus state detector of claim 1, wherein said measuring means measures a value of current supplied to the apparatus, a flow rate of water used by the apparatus, a flow rate of gas used by the apparatus, illuminance of the environment in which the apparatus is installed, a temperature of the environment in which the apparatus is installed, or an amount of data transfer across a communication network of the environment in which the apparatus is installed, as the physical quantity.

3. The apparatus state detector of claim 1, wherein said feature-quantity calculation means takes a weighted average of said measured values with a predetermined window width to determine an average measurement value, and defines said average measurement value as said feature quantity.

4. The apparatus state detector of claim 3, wherein said feature-quantity calculation means obtains a difference value between said average measurement value and said measured value before being averaged, defines the difference value as a differential measurement value, and defines said average measurement value and said differential measurement value as said feature quantity.

5. The apparatus state detector of claim 4, wherein said feature-quantity calculation means takes a weighted average of said average measurement values with a predetermined window width to determine a second average measurement value,
further obtains a difference value between said second average measurement value and said average measurement value before being averaged and defines the difference value as a second differential measurement value, and defines said average measurement value, said differential measurement value, said second average measurement value and said second differential measurement value as said feature quantities.

6. The apparatus state detector of claim 1, wherein
said feature-quantity calculation means performs predetermined calculations to extract periodicity of said measured values, and
defines a position at which the periodicity is extracted in the measured values and the intensity at the position for each extracted period as said feature quantity.

7. The apparatus state detector of claim 6, wherein
said feature-quantity calculation means extracts periodicity of said measured values by using Fourier transform or wavelet transform.

8. The apparatus state detector of claim 1, wherein
said apparatus-state detection means calculates a matching degree of the feature quantity calculated by said feature-quantity calculation means and the feature quantity in said dictionary data to identify a search result based on the matching degree.

9. The apparatus state detector of claim 8, wherein
said feature quantity is a multi-dimensional vector value, and
said apparatus-state detection means obtains a difference between the feature quantity calculated by said feature-quantity calculation means and the feature quantity in said dictionary data for every dimension and calculates said matching degree using the difference.

10. The apparatus state detector of claim 8, wherein
said feature quantity is a multi-dimensional vector value, and
said apparatus-state detection means obtains a difference between the feature quantity calculated by said feature-quantity calculation means and the feature quantity in said dictionary data for every dimension, counts the number of the dimensions whose difference is in a predetermined range, and defines a value obtained by dividing a counted result by the total number of dimensions as said matching degree.

11. The apparatus state detector of claim 8, wherein
said feature quantity is a multi-dimensional vector value, and
said apparatus-state detection means obtains an inner product of vectors of the feature quantity calculated by said feature-quantity calculation means and the feature quantity in said dictionary data, and defines a value obtained by dividing the inner product by a norm of each vector as said matching degree.

12. The apparatus state detector of claim 1, wherein
said apparatus-state detection means links said second feature quantity and an apparatus state associated with said feature quantity identified as a search result and stores them as new dictionary data.

13. The apparatus state detector of claim 1, wherein
said apparatus-state detection means judges that a point at which a long period component of said feature quantity varies a predetermined value or more is a point in time when the apparatus has started an operation.

14. The apparatus state detector of claim 1, wherein
said apparatus-state detection means stores the feature quantity that was used as a search key to search for a feature quantity in said dictionary data as feature quantity historical data in said dictionary data identified as a result of the search.

15. The apparatus state detector of claim 14, wherein
said apparatus-state detection means judges whether the apparatus is in a warning state based on said feature quantity historical data.

16. The apparatus state detector of claim 15, wherein
said apparatus-state detection means calculates either of, or both, an average and a variance of said feature quantity historical data and judges that the apparatus is in a warning state when either of, or both, the average and variance exceed a predetermined threshold uniquely assigned to each apparatus.

17. The apparatus state detector of claim 15, wherein
said apparatus-state detection means calculates and stores either of, or both, an average and a variance of said feature quantity historical data, and
when either of, or both, an average and a variance of said feature quantity historical data are newly calculated, said apparatus-state detection means obtains a difference between a stored value and a newly calculated value and judges that the apparatus is in a warning state when the difference exceeds a predetermined threshold uniquely assigned to each apparatus.

18. The apparatus state detector of claim 15, wherein
when an apparatus state is detected to be a warning state, said apparatus-state detection means judges that apparatus states prior to and subsequent to the apparatus state detected by said apparatus-state detection means within a predetermined period of time are warning states.

19. The apparatus state detector of claim 15, wherein
when an apparatus state is detected to be a warning state, said apparatus-state detection means judges that apparatus states prior to and subsequent to the apparatus state detected by said apparatus-state detection means within a predetermined period of time are pre-warning states, and judges that said apparatus states are warning states when the number of determinations of said pre-warning states reaches a predetermined number.

20. The apparatus state detector of claim 1, wherein the first time period represents a time period prior to operation of the apparatus and the second time period represents a time period subsequent to operation of the apparatus.

* * * * *